United States Patent
Fujino et al.

(10) Patent No.: US 10,157,655 B2
(45) Date of Patent: Dec. 18, 2018

(54) MEMORY DEVICE

(71) Applicant: TOSHIBA MEMORY CORPORATION, Minato-ku, Tokyo (JP)

(72) Inventors: Yorinobu Fujino, Hachioji Tokyo (JP); Kosuke Hatsuda, Tokyo (JP); Yoshiaki Osada, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/703,456

(22) Filed: Sep. 13, 2017

(65) Prior Publication Data

US 2018/0277188 A1    Sep. 27, 2018

(30) Foreign Application Priority Data

Mar. 24, 2017 (JP) .................................. 2017-059583
Aug. 8, 2017 (JP) .................................. 2017-153565

(51) Int. Cl.
*G11C 11/16* (2006.01)

(52) U.S. Cl.
CPC ...... *G11C 11/1673* (2013.01); *G11C 11/1655* (2013.01); *G11C 11/161* (2013.01)

(58) Field of Classification Search
CPC ............ G11C 11/1673; G11C 11/1655; G11C 11/161; G11C 11/16
USPC ............................ 365/148, 158, 163, 189.15
See application file for complete search history.

(56) References Cited

U.S. PATENT DOCUMENTS

| | | | |
|---|---|---|---|
| 6,693,826 B1 | 2/2004 | Black et al. | |
| 6,842,366 B2 * | 1/2005 | Tanizaki | G11C 11/1673 365/149 |
| 7,961,509 B2 * | 6/2011 | Zhu | G11C 11/1659 365/100 |
| 9,627,024 B2 * | 4/2017 | Chen | G11C 11/1673 |
| 2003/0128579 A1 * | 7/2003 | Sakimura | G11C 11/15 365/158 |
| 2006/0092734 A1 | 5/2006 | Tsuchida et al. | |
| 2009/0268538 A1 | 10/2009 | Fukushima | |
| 2013/0128657 A1 * | 5/2013 | Alam | G11C 11/1673 365/158 |
| 2015/0029786 A1 | 1/2015 | Andre et al. | |
| 2015/0294706 A1 * | 10/2015 | Bonaccio | G11C 11/1673 365/158 |
| 2016/0307615 A1 | 10/2016 | Alam et al. | |

FOREIGN PATENT DOCUMENTS

| | | |
|---|---|---|
| JP | 2006127672 A | 5/2006 |
| JP | 2009266325 A | 11/2009 |

* cited by examiner

*Primary Examiner* — Tan T. Nguyen
(74) *Attorney, Agent, or Firm* — Holtz, Holtz & Volek PC

(57) ABSTRACT

According to one embodiment, a memory device includes a memory cell; and a first circuit configured to perform first read for the memory cell and generate a first voltage, write first data to the memory cell that has undergone the first read, perform second read for the memory cell to which the first data written and generate a second voltage, generate a first current based on the first voltage, generate a second current based on the second voltage, and add a third current to one of the first current and the second current, thereby determining data stored in the memory cell at the time of the first read.

17 Claims, 59 Drawing Sheets

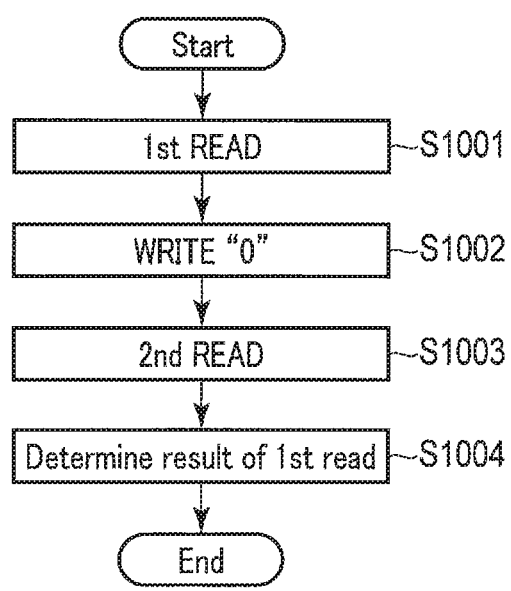
F I G. 7

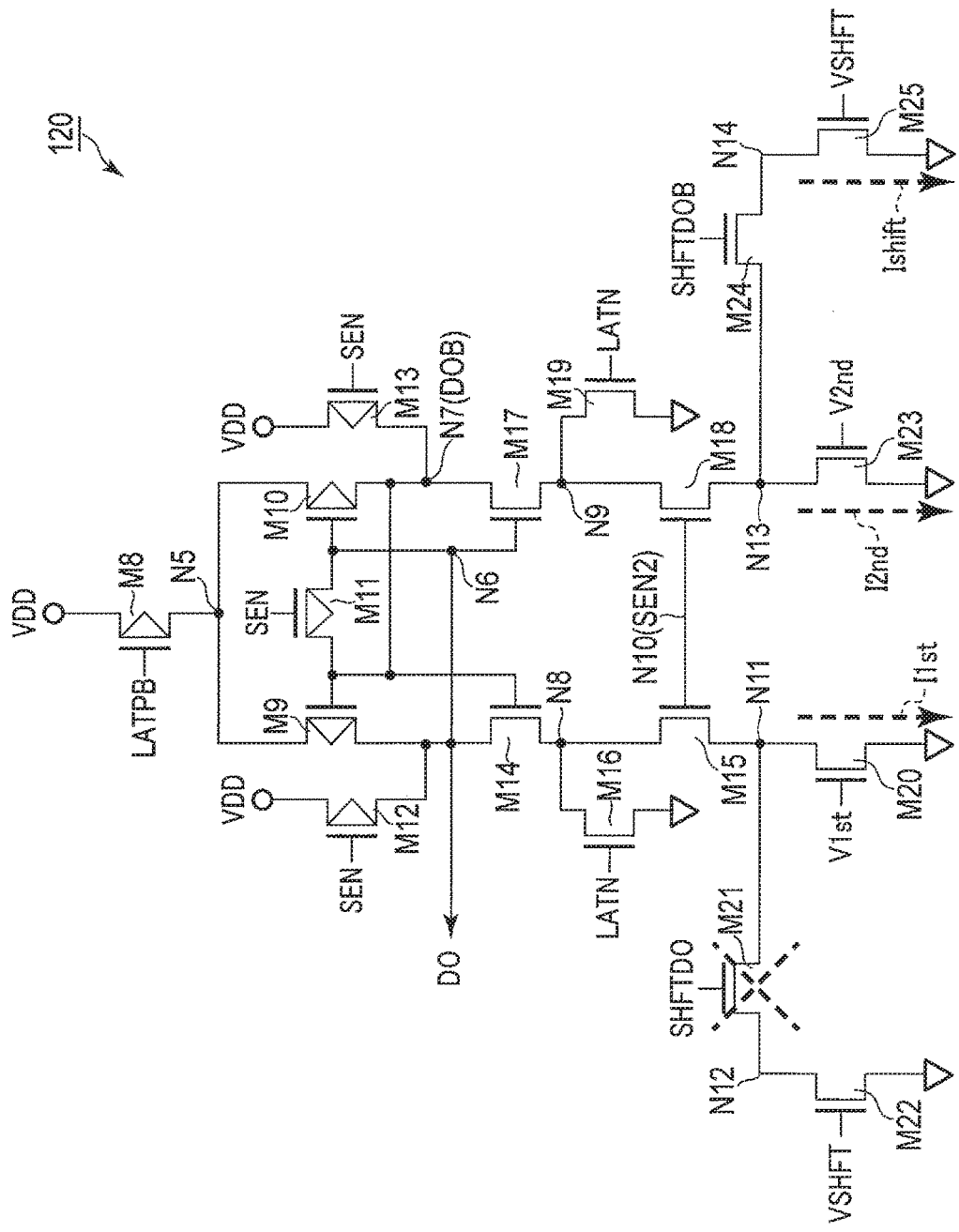
F I G. 11

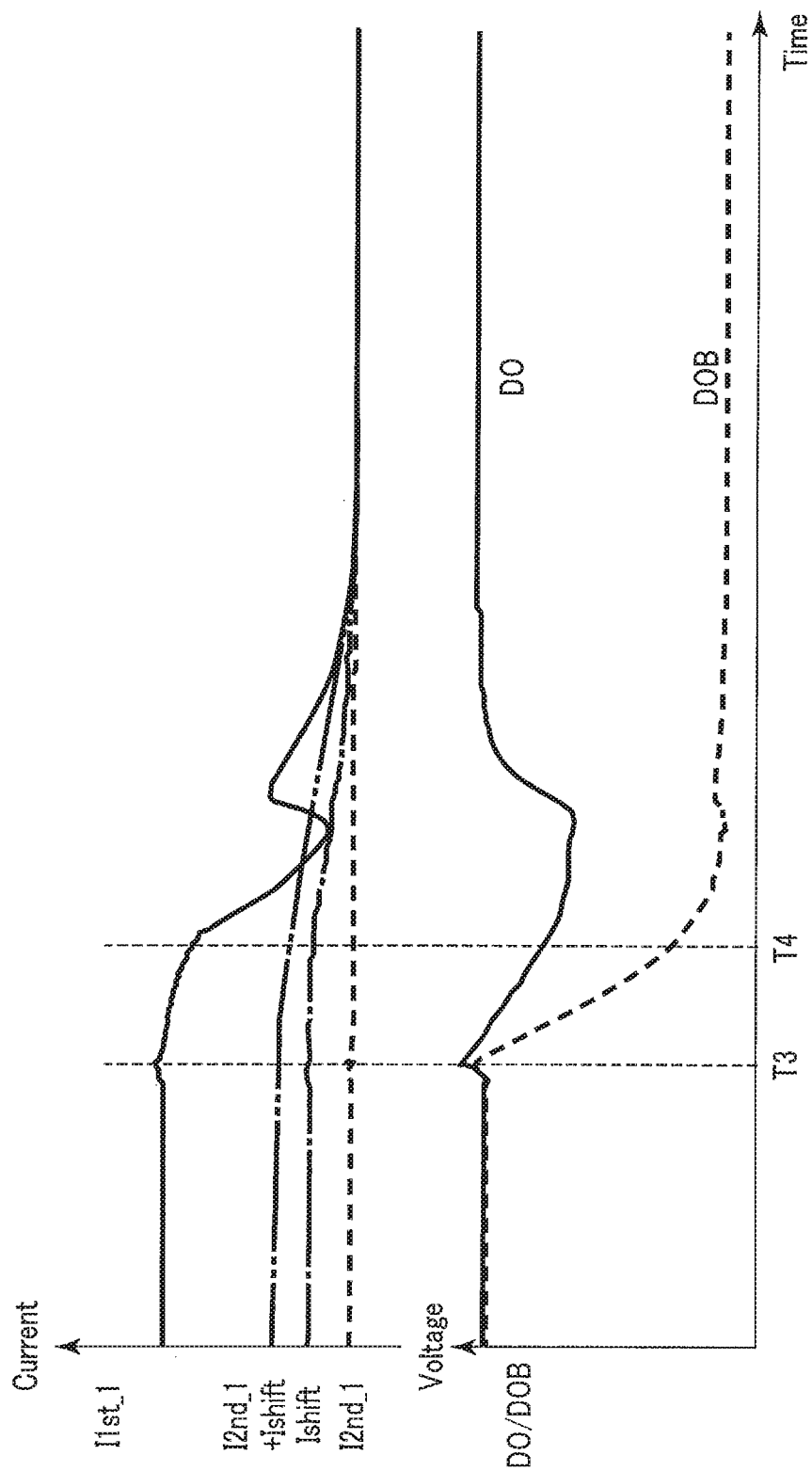
F I G. 14

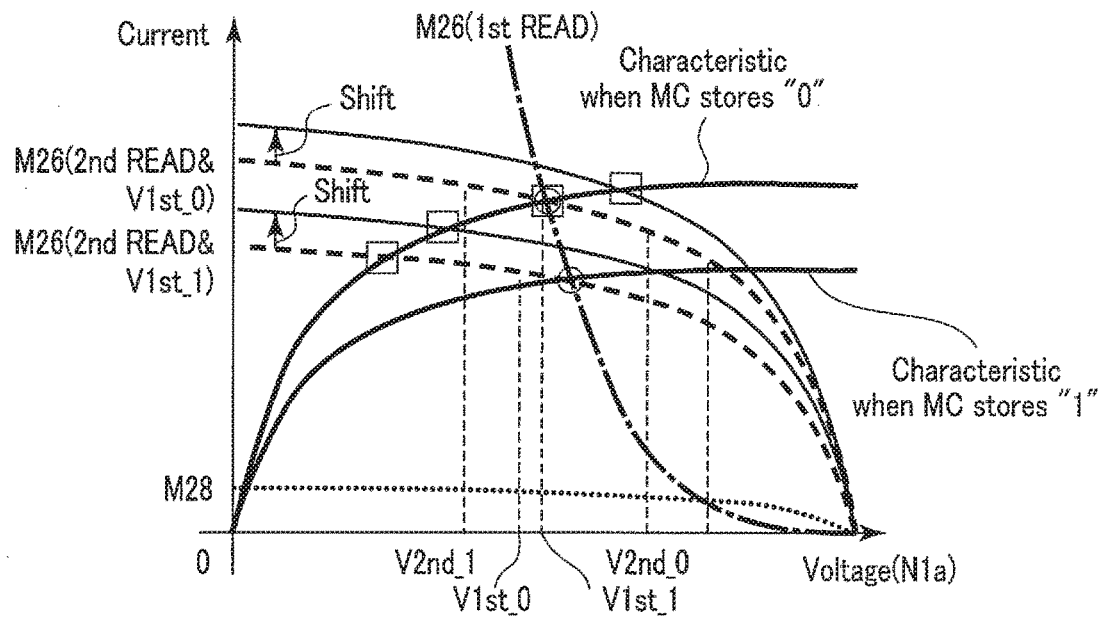
F I G. 20
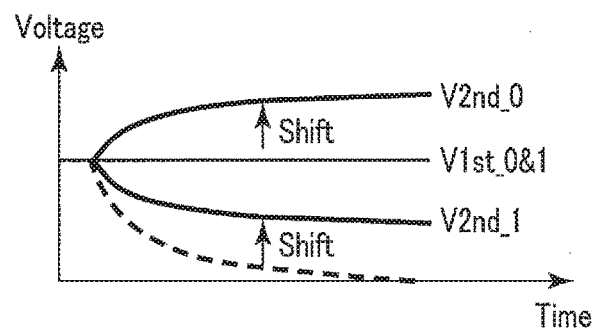
F I G. 21

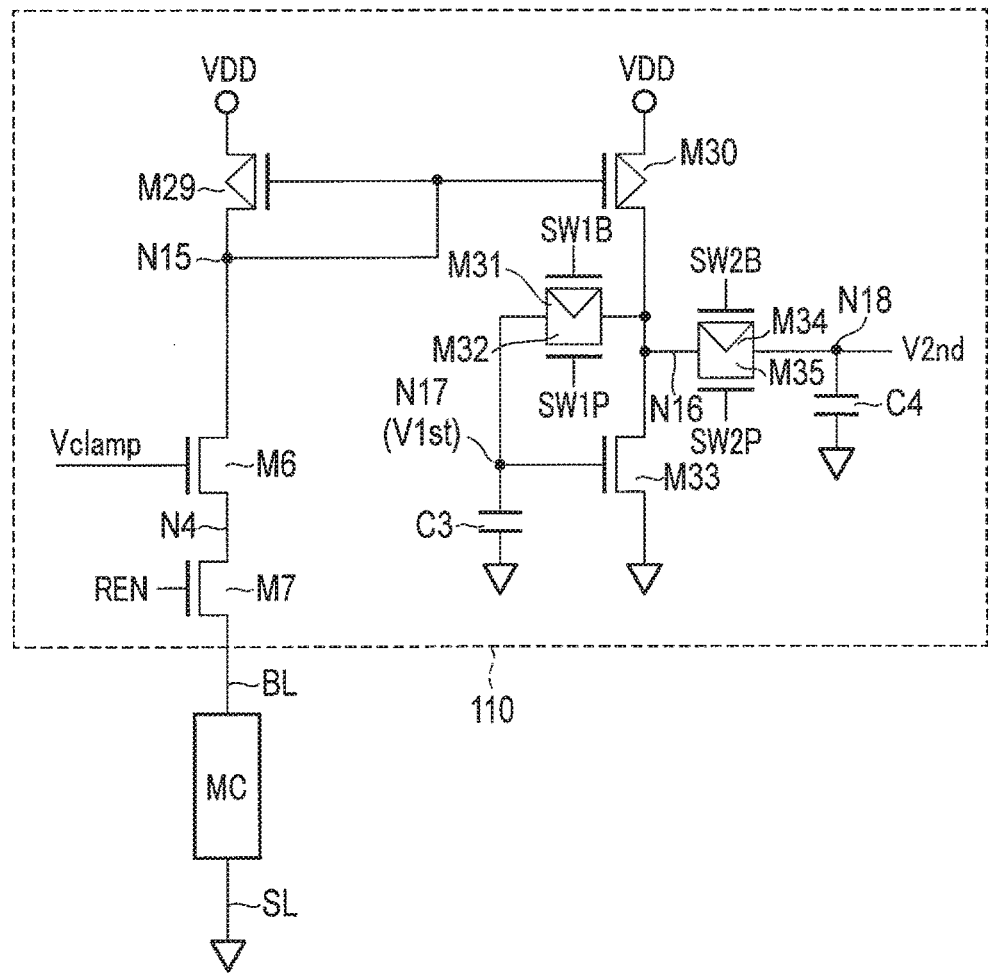
F I G. 22

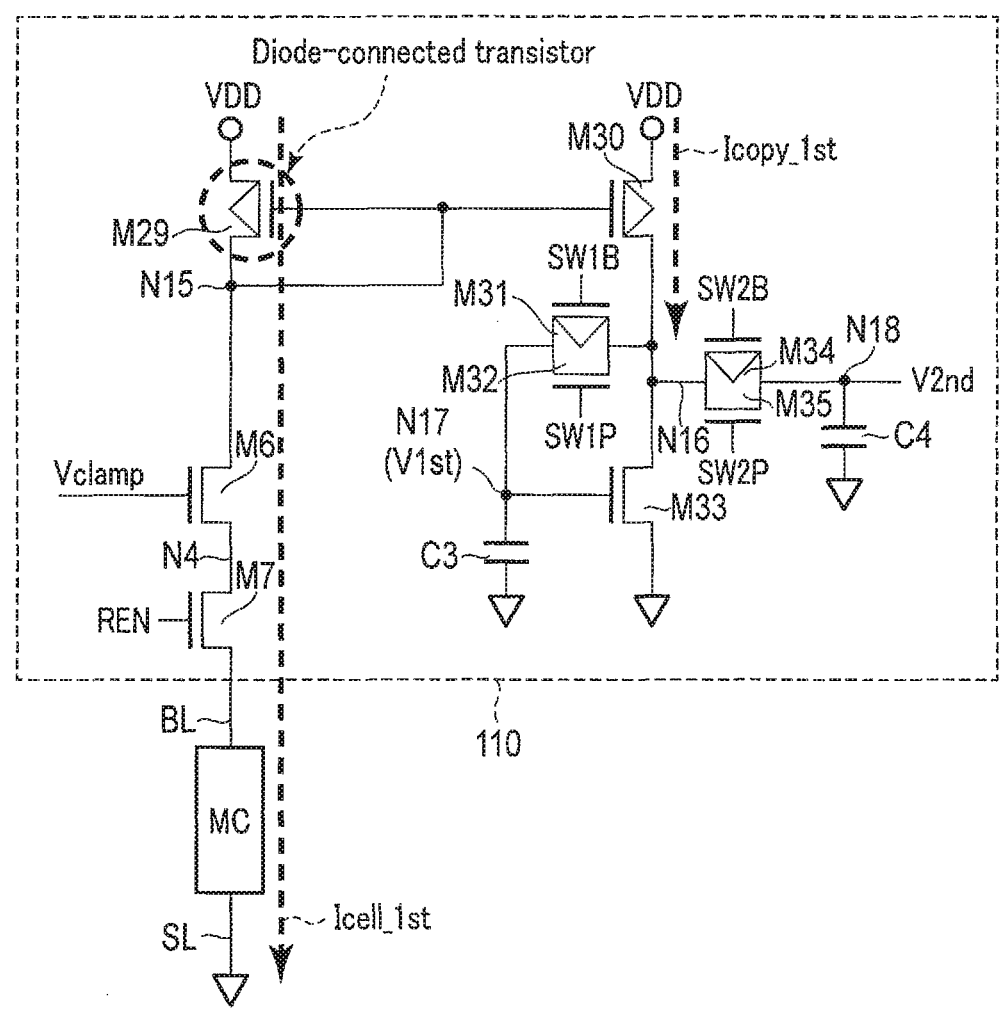
F I G. 23

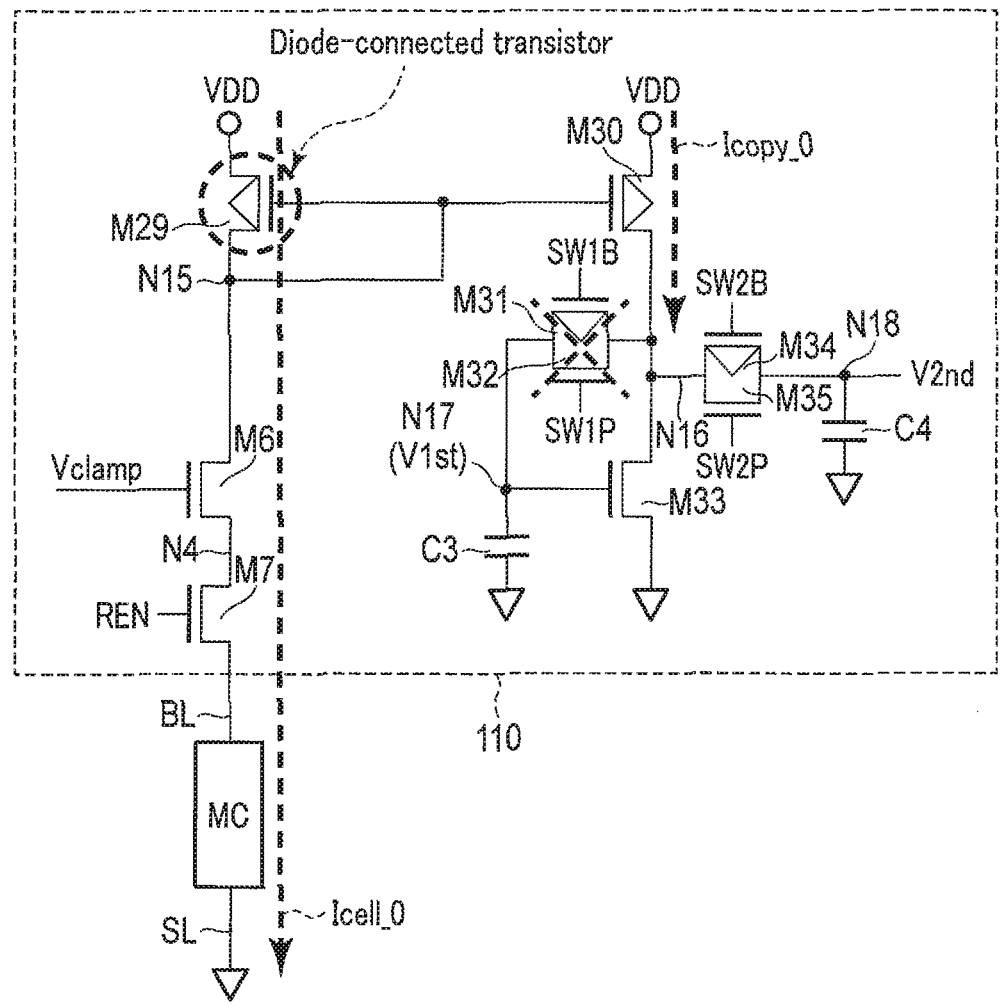
F I G. 24

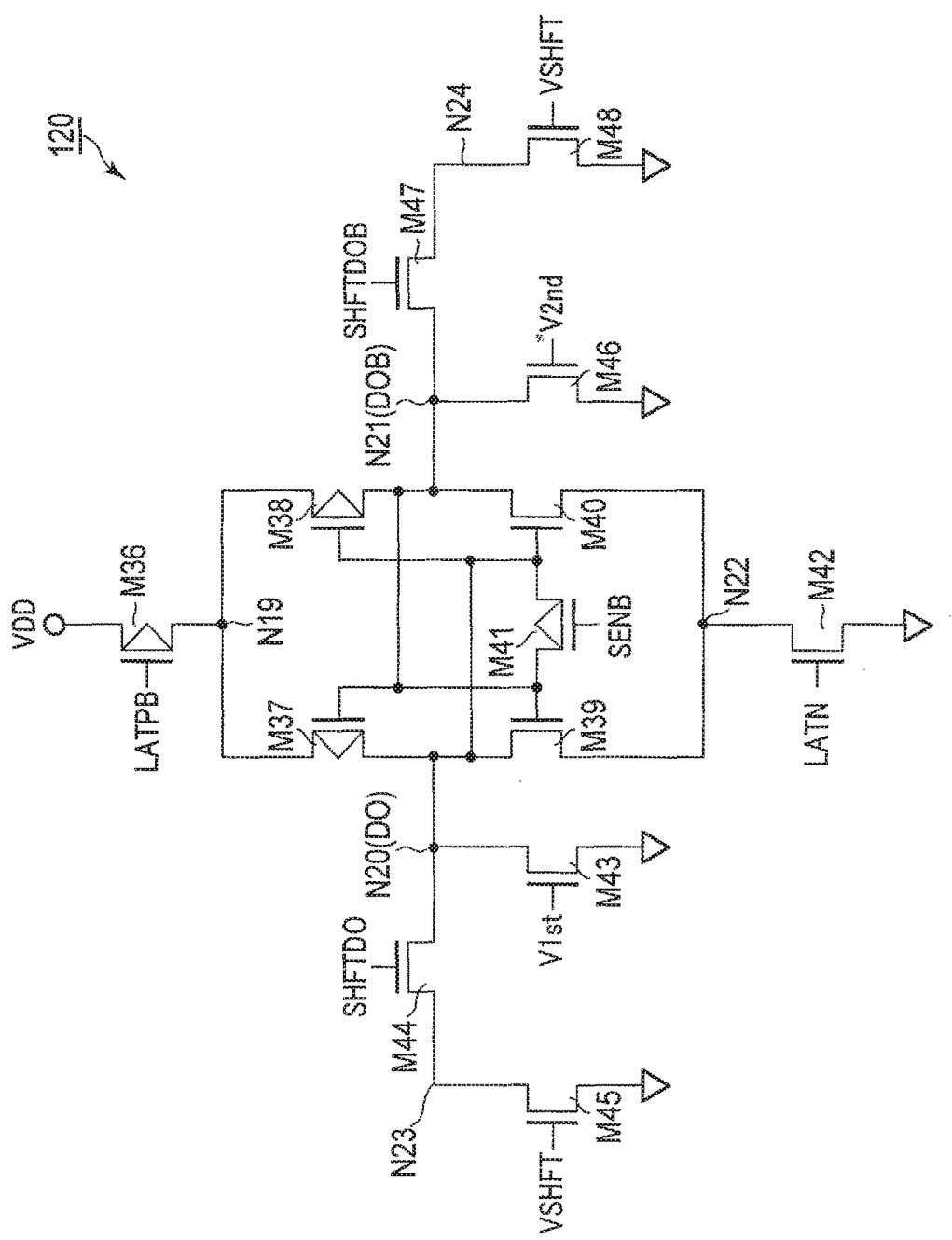
F I G. 31

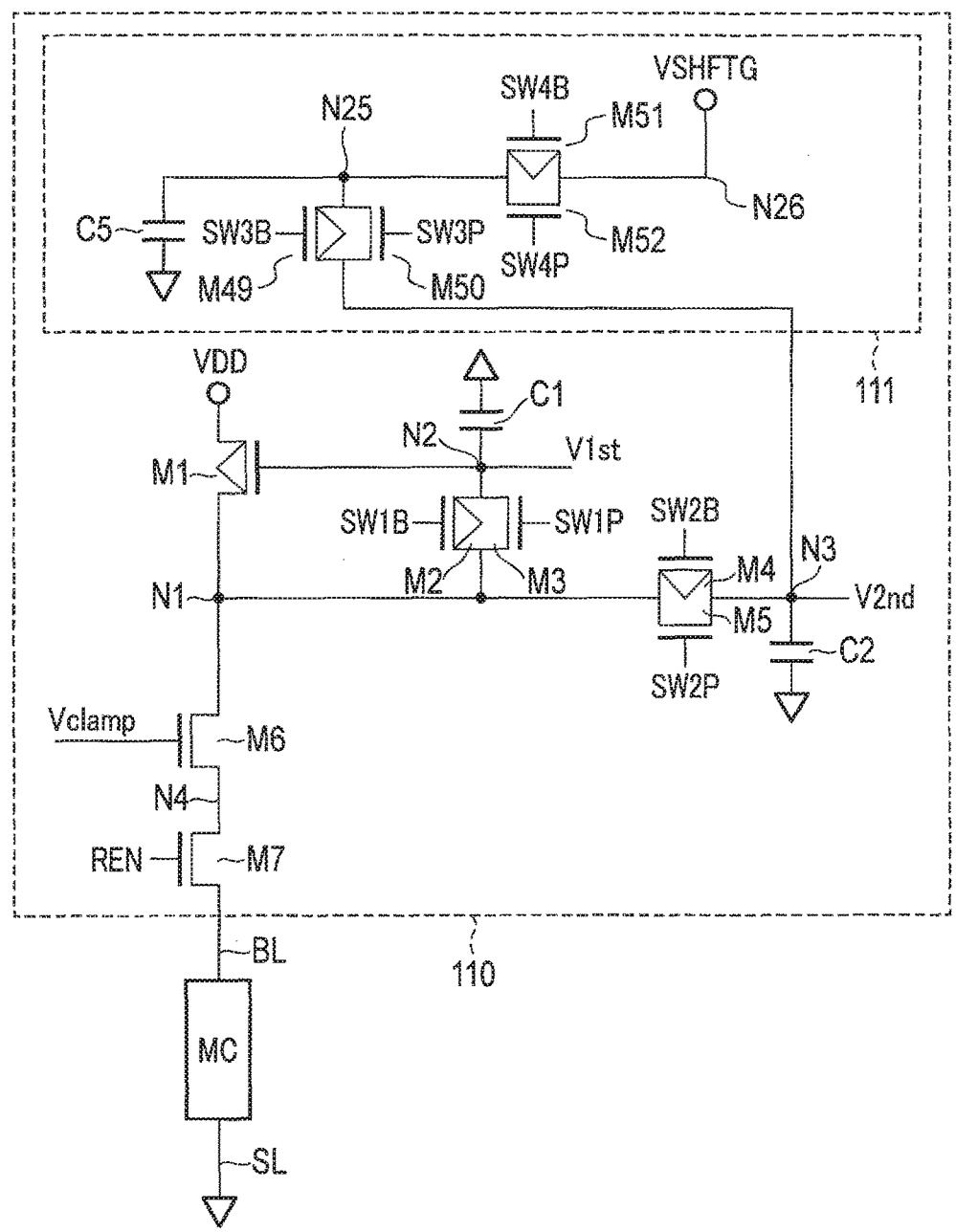
F I G. 36

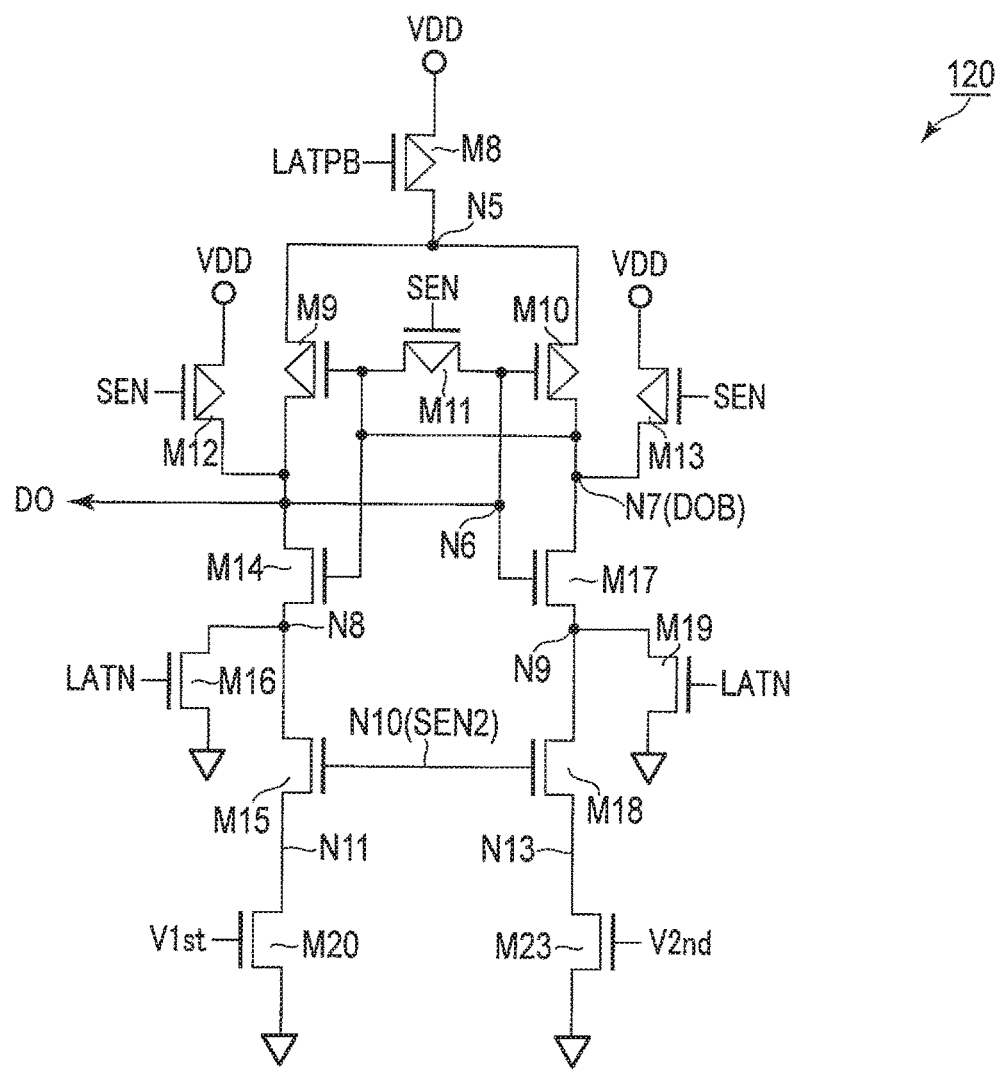
F I G. 37

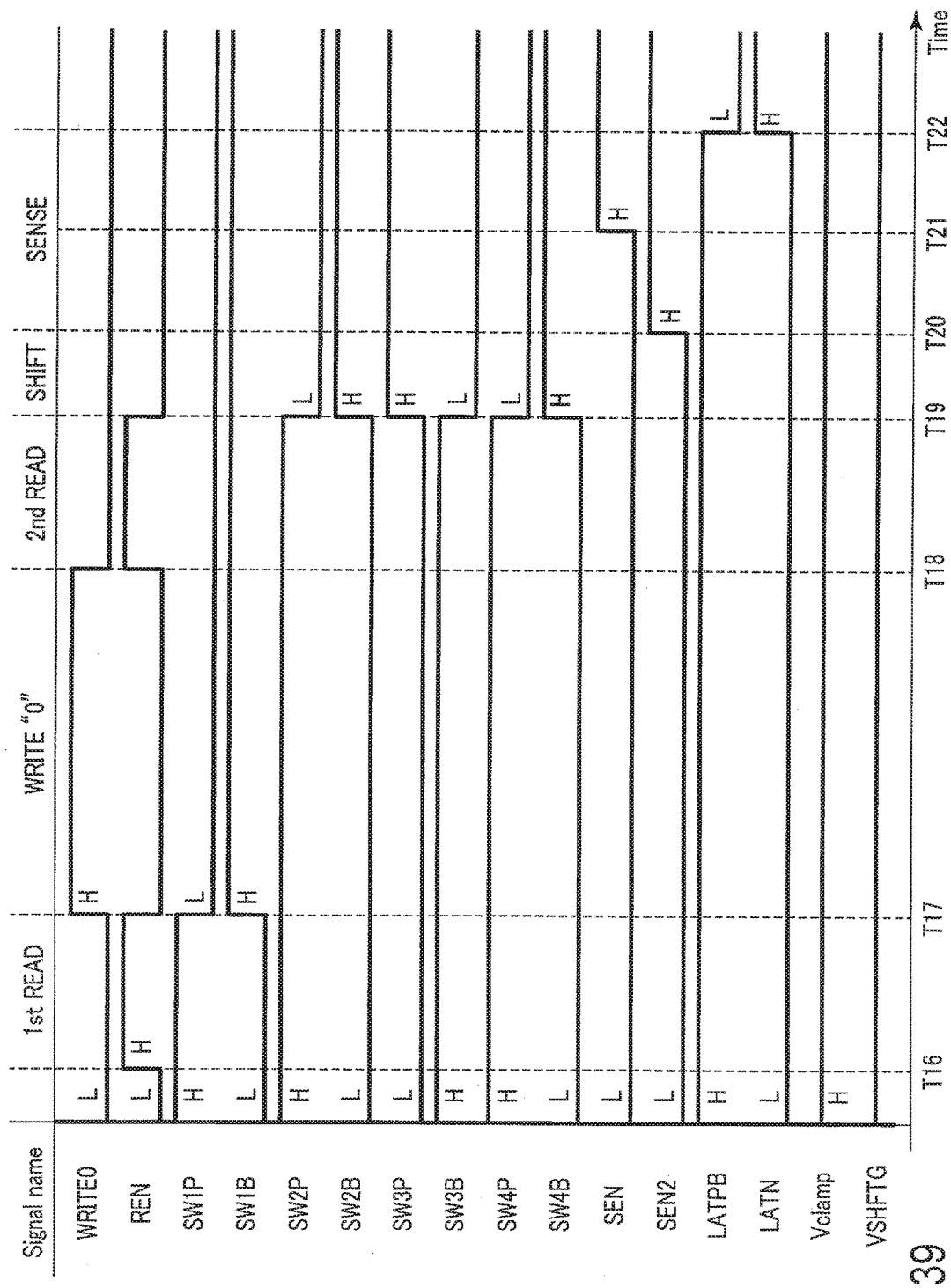
F I G. 39

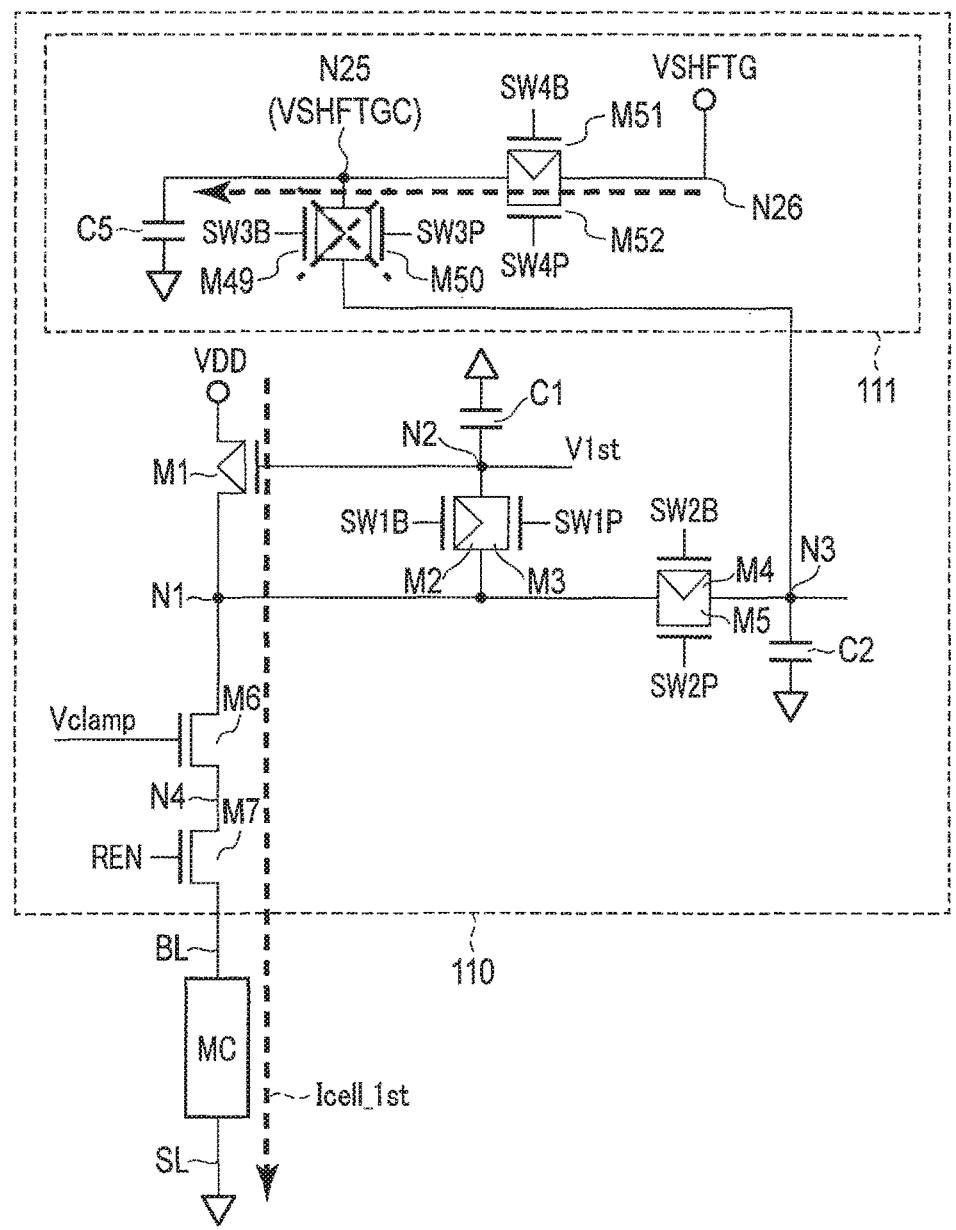
F I G. 40

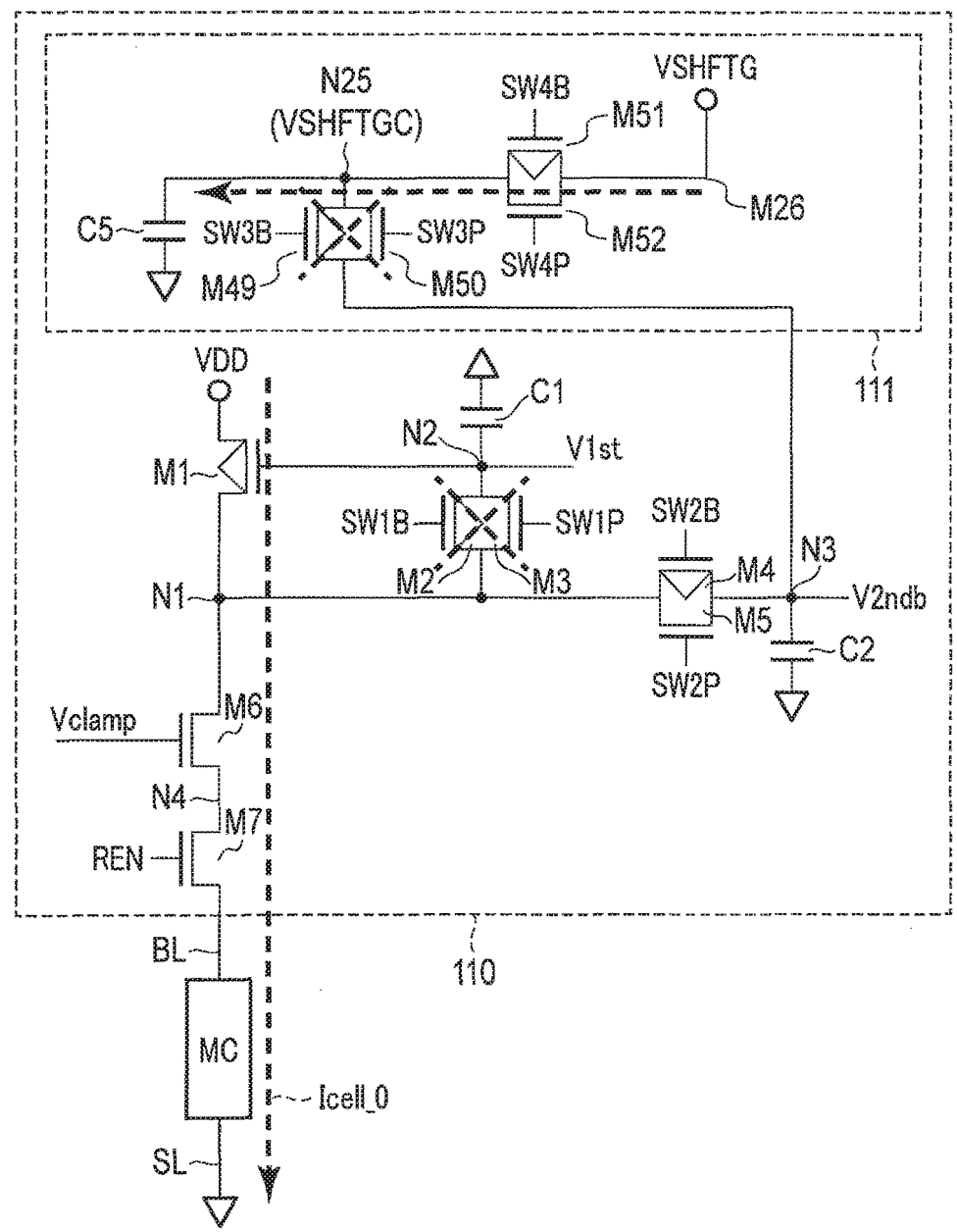
F I G. 42

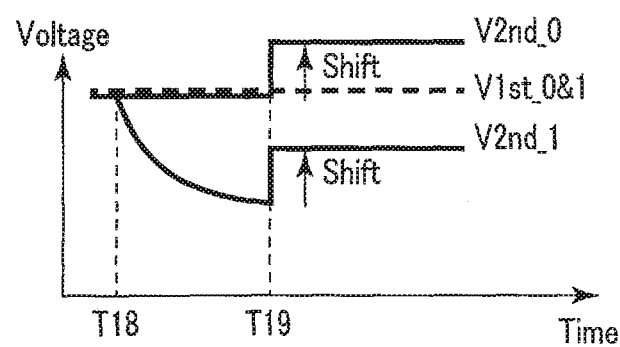
F I G. 44

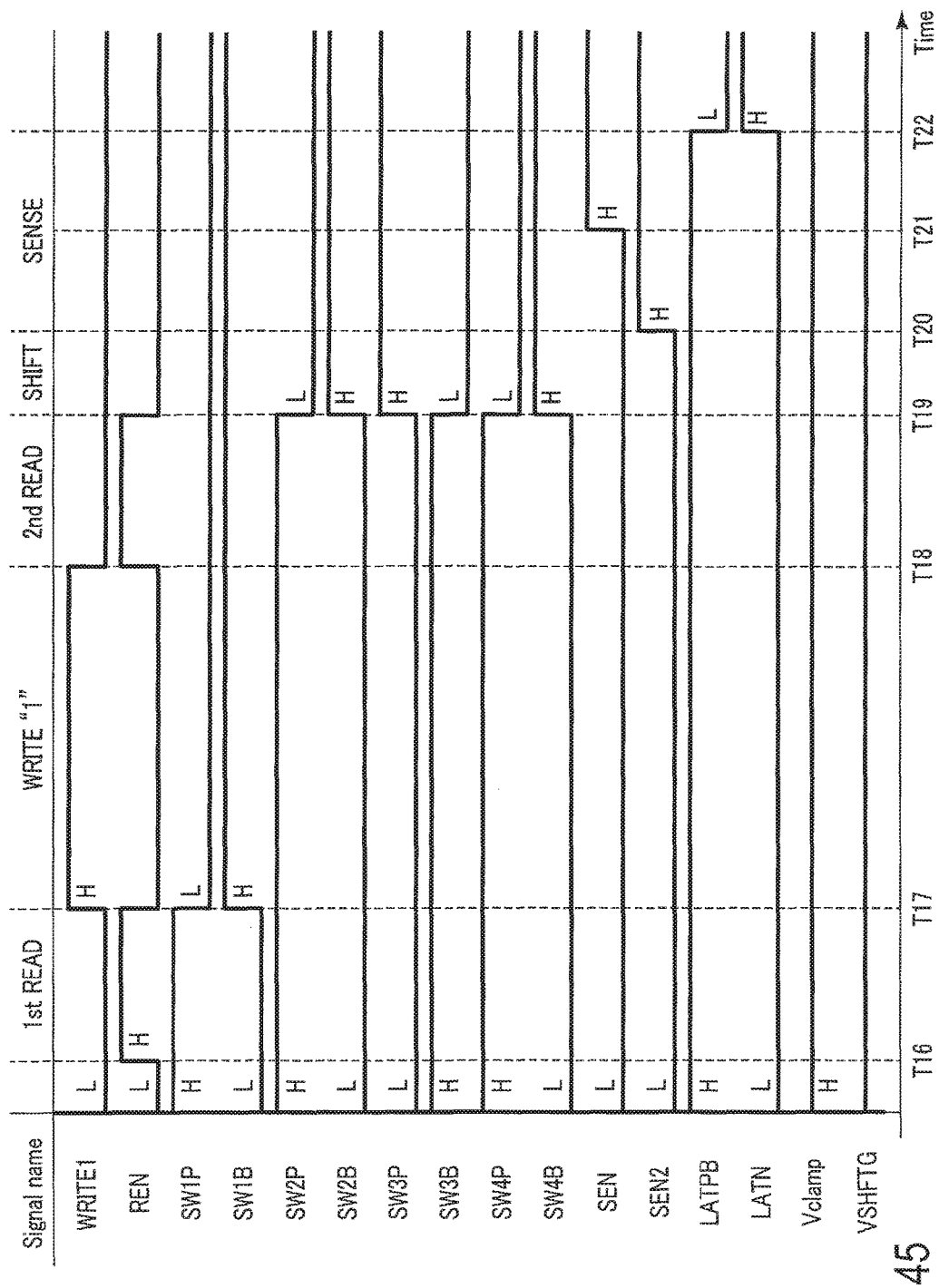
F I G. 45

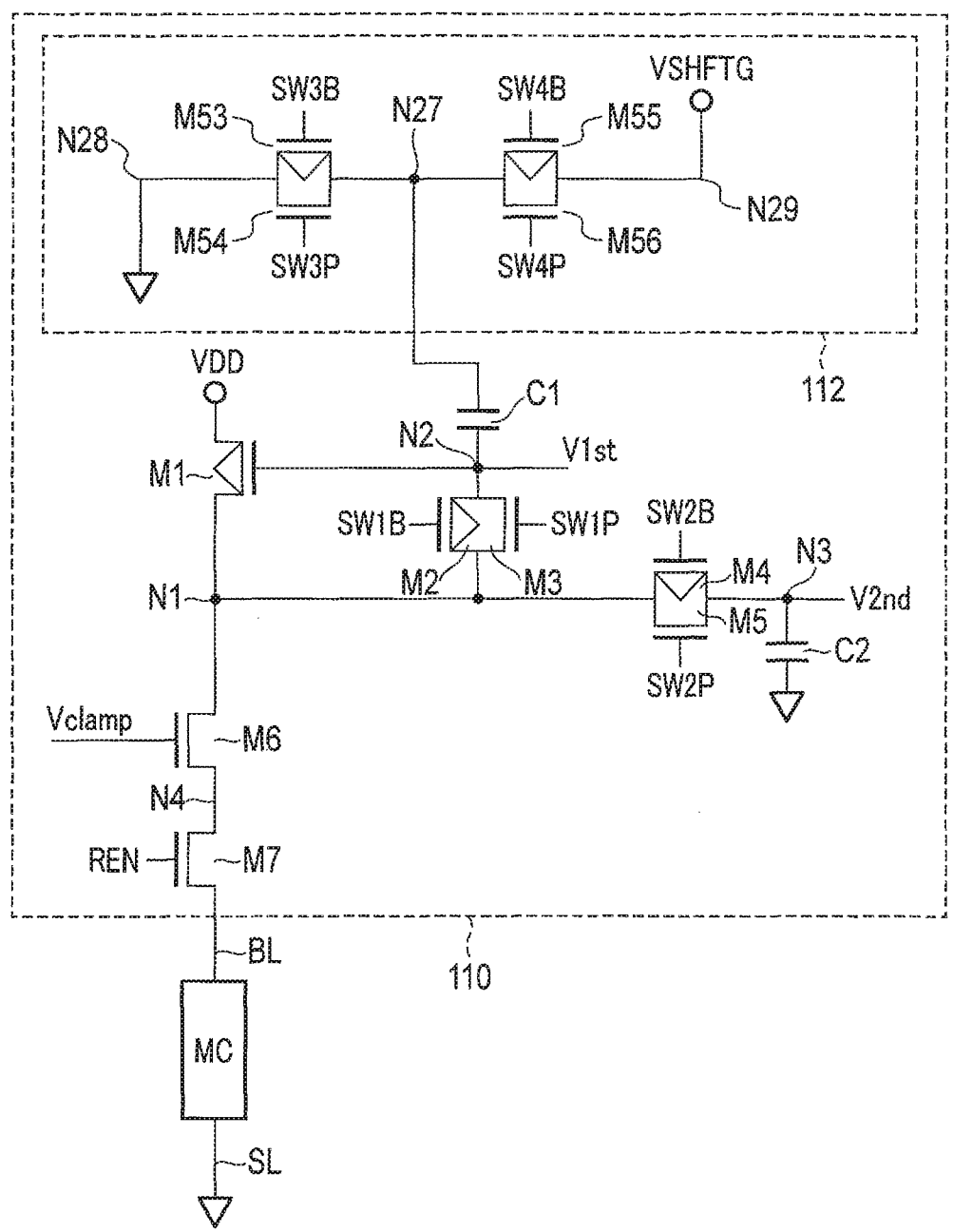
F I G. 46

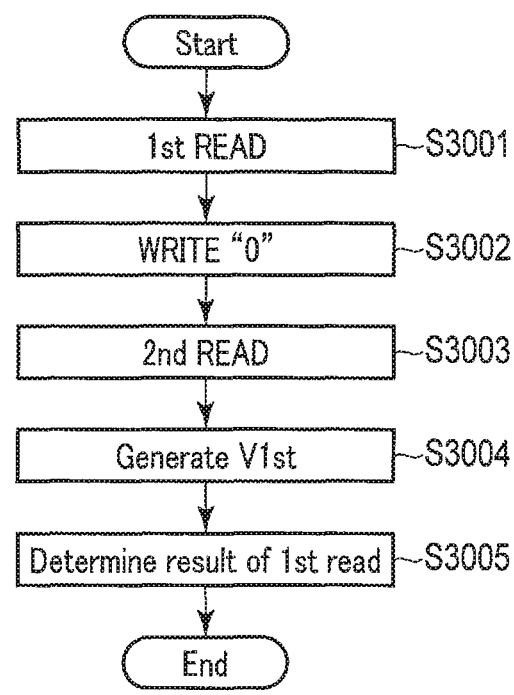
F I G. 47

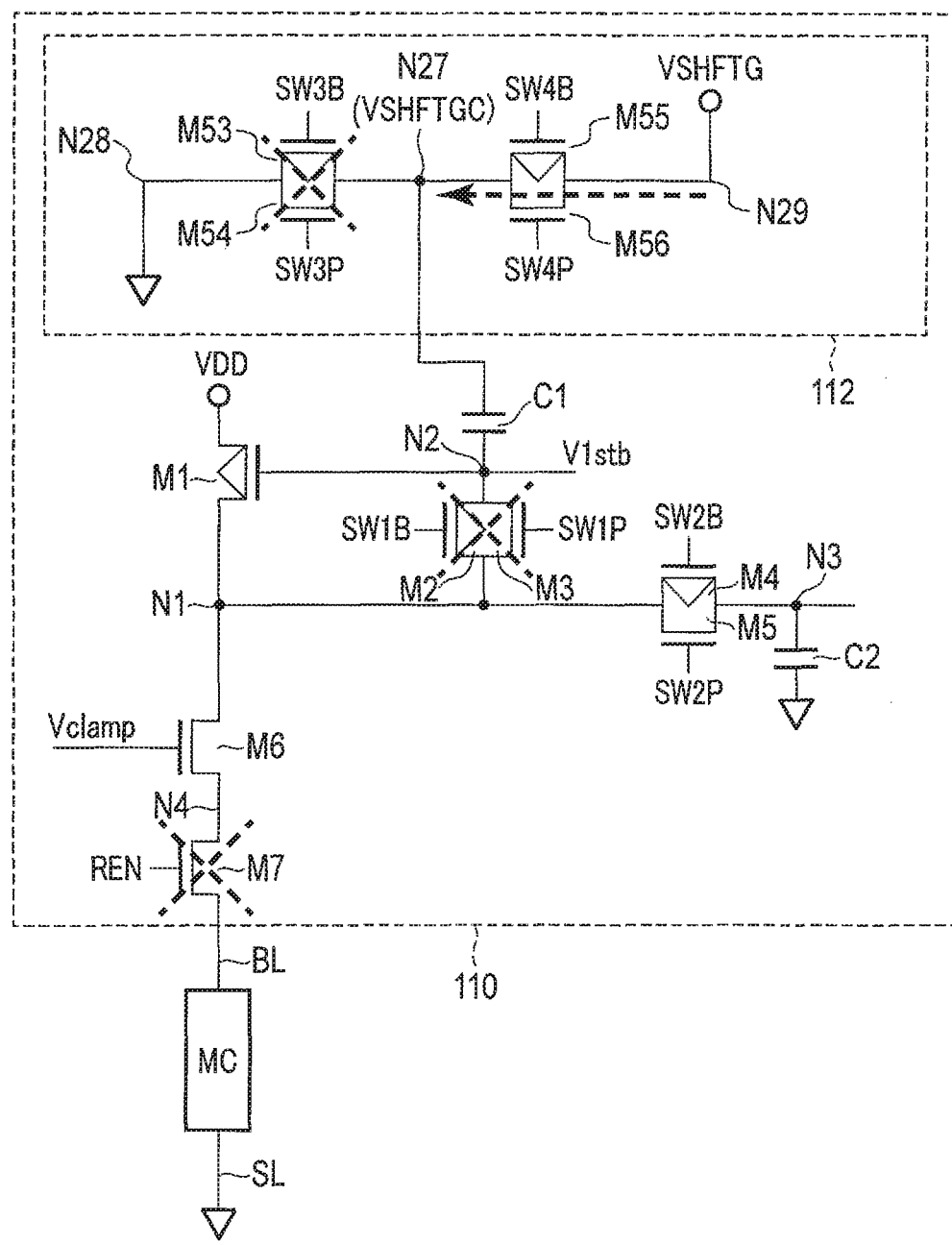
F I G. 49

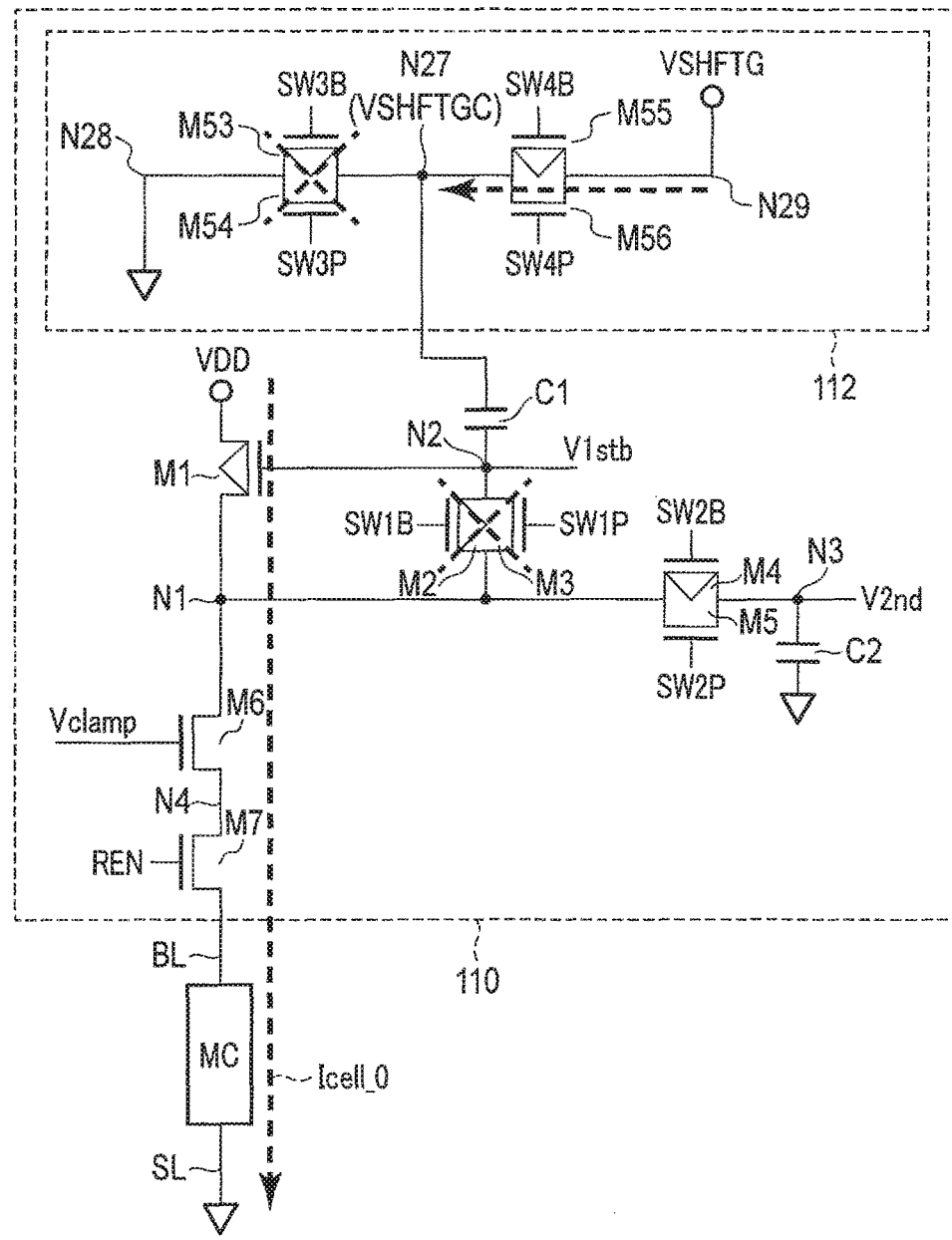
F I G. 50

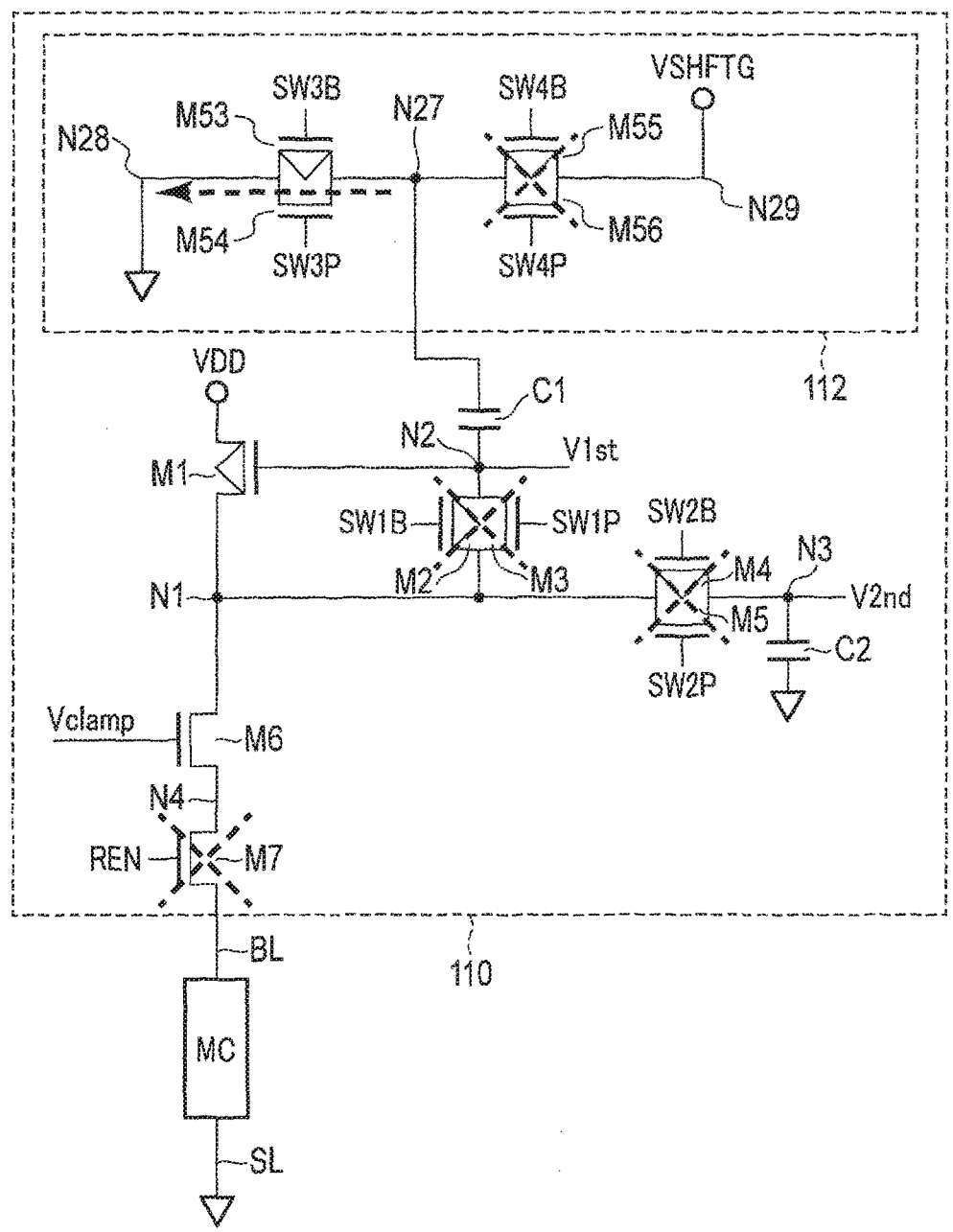
F I G. 51

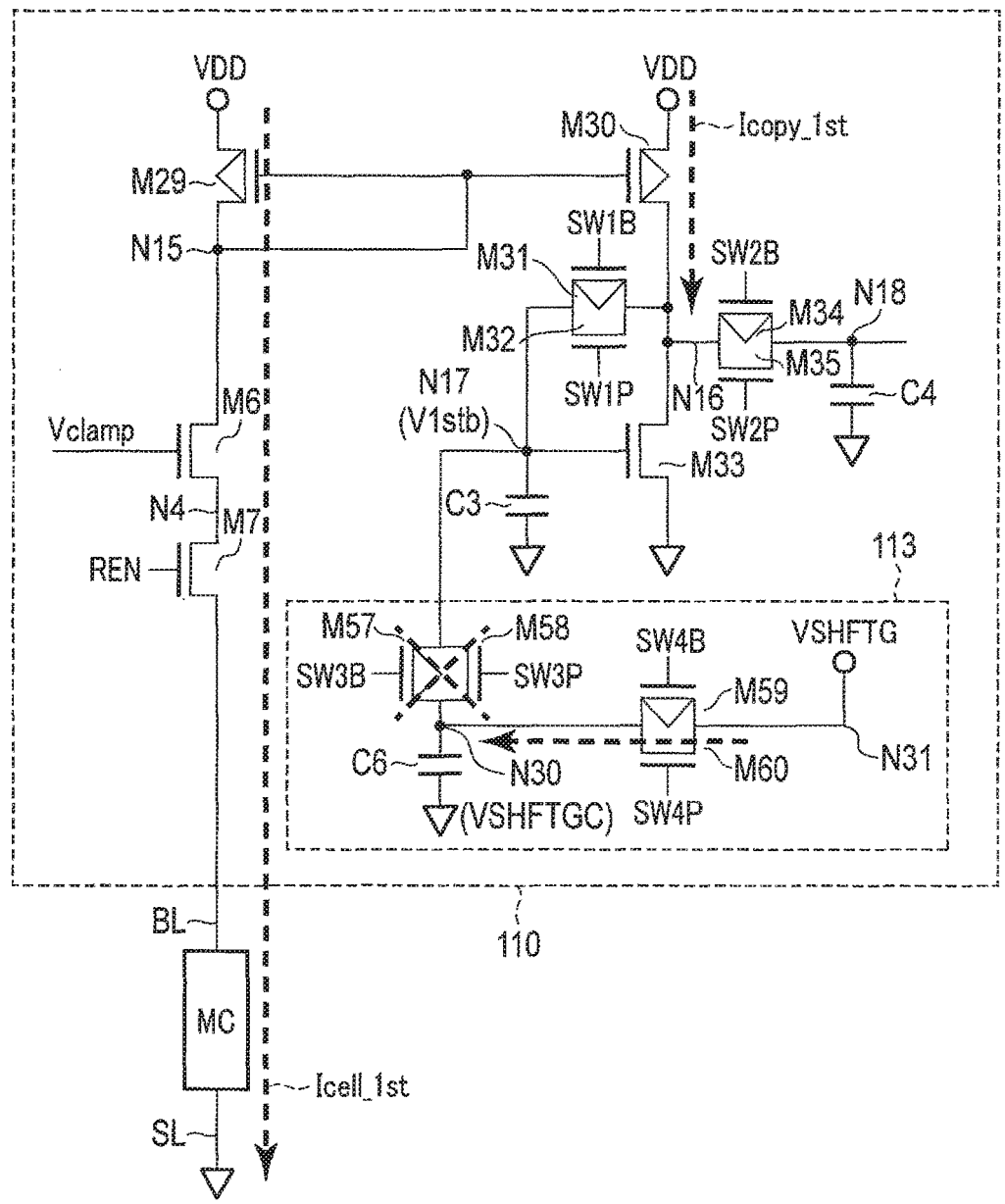
F I G. 54

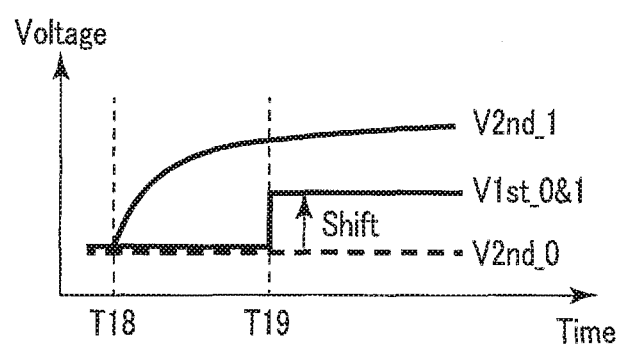
F I G. 58

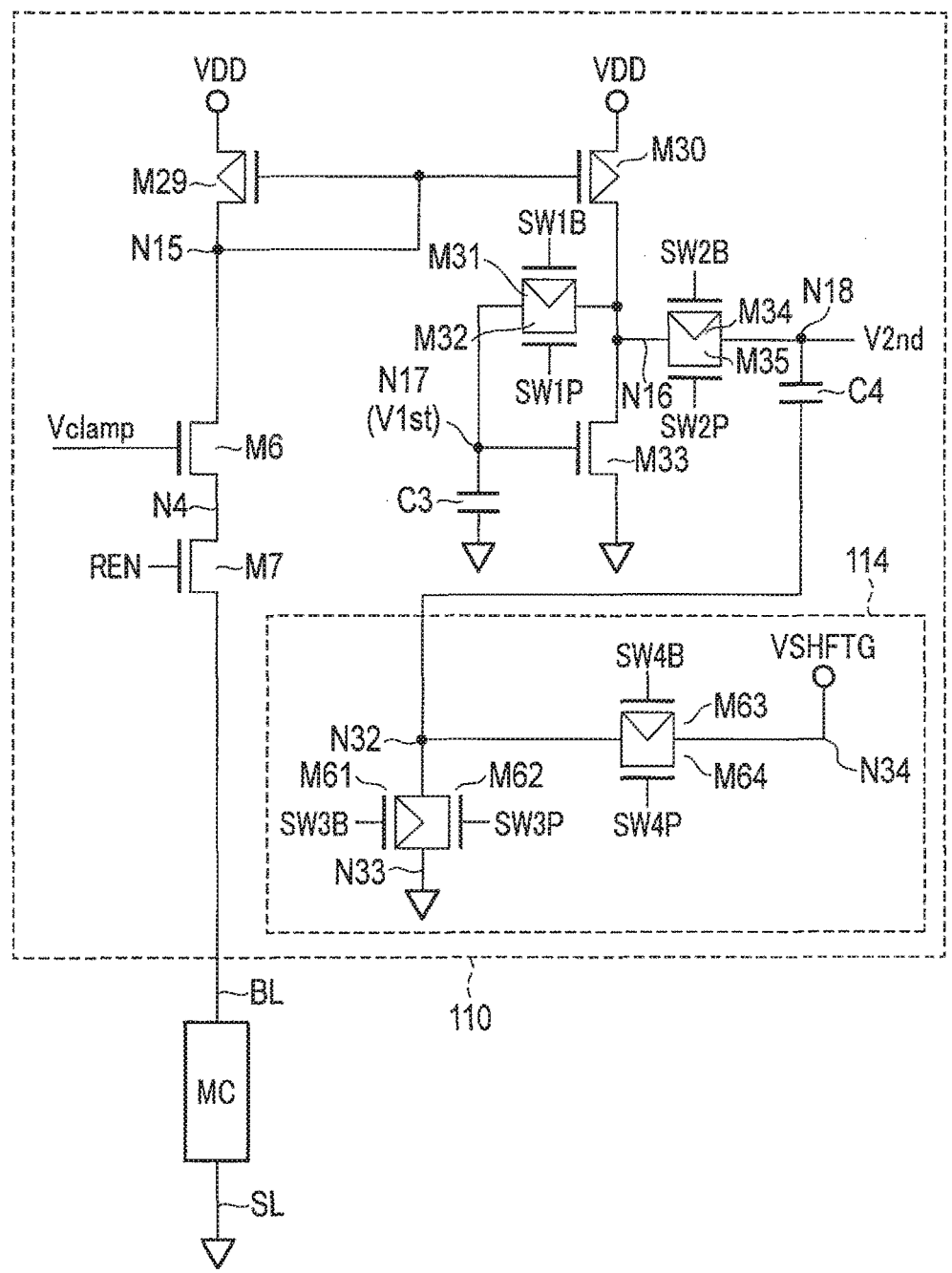
F I G. 59

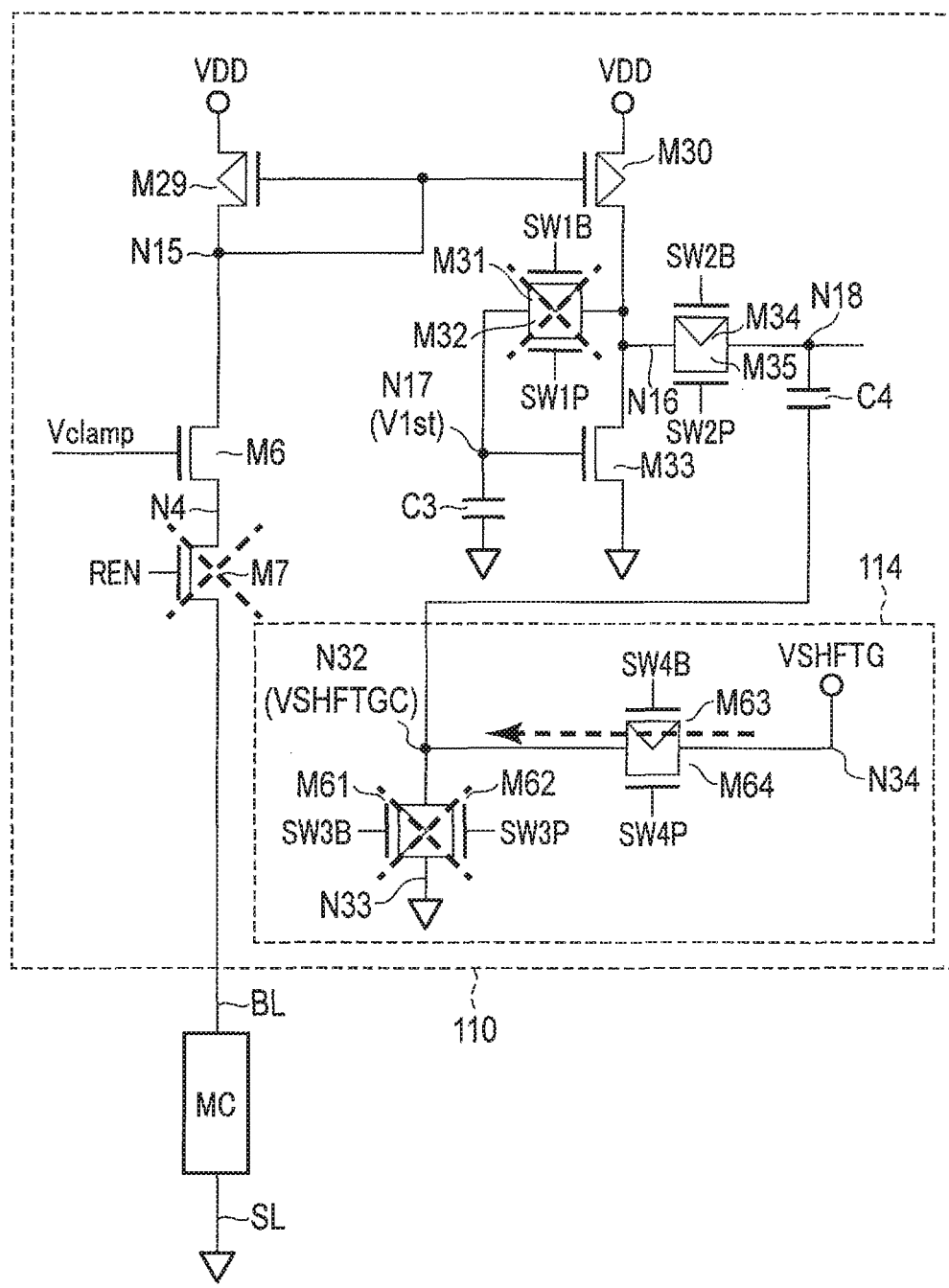
F I G. 61

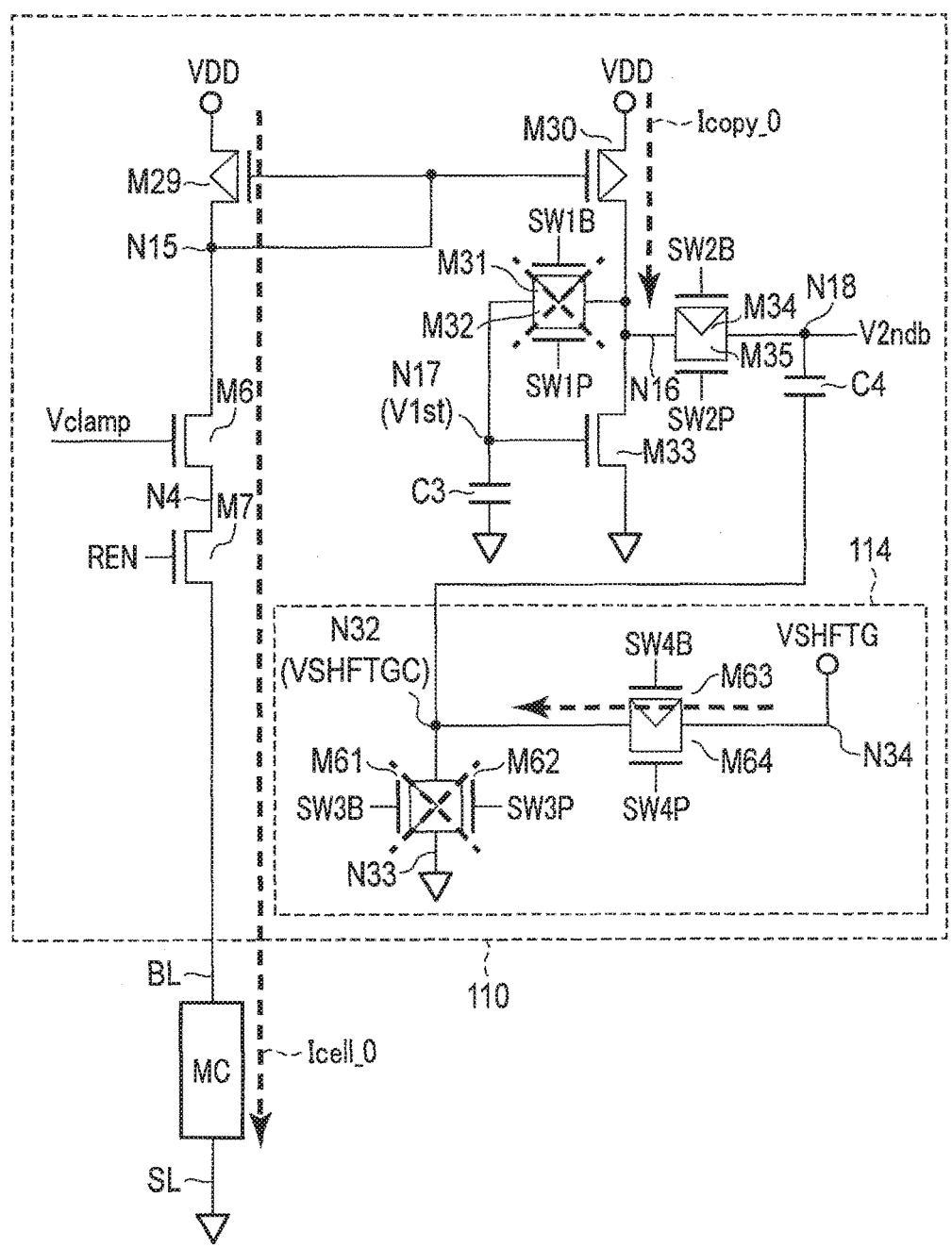
F I G. 62

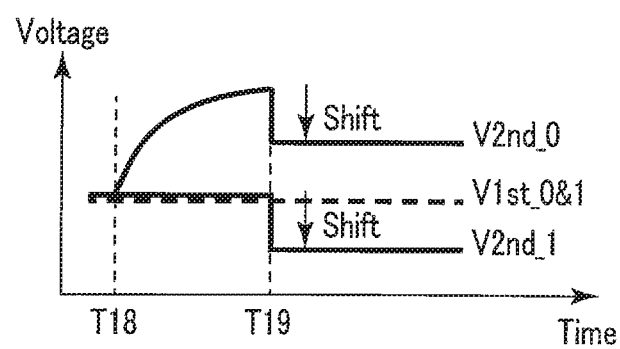
F I G. 64

MEMORY DEVICE

CROSS REFERENCE TO RELATED APPLICATIONS

This application is based upon and claims the benefit of priority from prior Japanese Patent Applications No. 2017-059583, filed Mar. 24, 2017; and No. 2017-153565, filed Aug. 8, 2017; the entire contents of which are incorporated herein by reference.

FIELD

Embodiments described herein relate generally to a memory device.

BACKGROUND

An MRAM (Magnetoresistive Random Access Memory) is a memory device that uses a magnetic element with a magnetoresistive effect as a memory cell configured to store information. The MRAM has received attention as a next-generation memory device featuring a high-speed operation, large capacity, and nonvolatility. The MRAM is under research and development as a replacement for volatile memory such as a DRAM (Dynamic Random Access Memory) or an SRAM (Static Random Access Memory). In this case, the MRAM is preferably operated in the same specifications as the DRAM and the SRAM from the viewpoint of keeping the development cost low and implementing smooth replacement.

BRIEF DESCRIPTION OF THE DRAWINGS

FIG. 7 is a flowchart showing the read operation of the memory system including the memory device according to the first embodiment;

FIG. 11 is a circuit diagram showing the operation of the sense amplifier of the memory device according to the first embodiment in a determination operation;

FIG. 14 is a timing chart showing currents and voltages generated in the sense amplifier in a case in which the memory cell stores "1" data at the time of the first read operation;

FIG. 20 is a graph showing the relationship between the characteristic of the transistor M1 and the characteristic of the memory cell in the first read and the relationship between the characteristic of the transistor M1 and the characteristic of the memory cell in the second read;

FIG. 21 is a graph showing the relationship of voltages after the second read operation;

FIG. 22 is a circuit diagram showing the preamplifier of a memory device according to the second embodiment;

FIG. 23 is a circuit diagram showing the operation of the preamplifier of the memory device according to the second embodiment in a first read operation;

FIG. 24 is a circuit diagram showing the operation of the preamplifier of the memory device according to the second embodiment in a second read operation;

FIG. 31 is a circuit diagram showing the sense amplifier of a memory device according to the third embodiment;

FIG. 36 is a circuit diagram showing the Preamplifier of a memory device according to the fourth embodiment;

FIG. 37 is a circuit diagram showing the sense amplifier of a memory device according to the fourth embodiment;

FIG. 39 is a timing chart of the read operation of the memory system according to the fourth embodiment;

FIG. 40 is a circuit diagram showing the operation of the preamplifier of the memory device according to the fourth embodiment in a first read operation;

FIG. 42 is a circuit diagram showing the operation of the preamplifier of the memory device according to the fourth embodiment in a second read operation;

FIG. 44 is a graph showing the relationship of voltages after the voltage information V2nd generation operation;

FIG. 45 is a timing chart of the read operation of the memory system according to the fourth embodiment;

FIG. 46 is a circuit diagram showing the preamplifier of a memory device according to the fifth embodiment;

FIG. 47 is a flowchart showing the read operation of the memory system including the memory device according to the fifth embodiment;

FIG. 49 is a circuit diagram showing the operation of the preamplifier of the memory device according to the fifth embodiment in a 0 write operation;

FIG. 50 is a circuit diagram showing the operation of the preamplifier of the memory device according to the fifth embodiment in a second read operation;

FIG. 51 is a circuit diagram showing the operation of the preamplifier of the memory device according to the fifth embodiment in a voltage information V1st generation operation;

FIG. 54 is a circuit diagram showing the operation of the preamplifier of the memory device according to the sixth embodiment in a first read operation;

FIG. 58 is a graph showing the relationship of voltages after the voltage information V1st generation operation;

FIG. 59 is a circuit diagram showing the preamplifier of a memory device according to the seventh embodiment;

FIG. 61 is a circuit diagram showing the operation of the preamplifier of the memory device according to the seventh embodiment in a 0 write operation;

FIG. 62 is a circuit diagram showing the operation of the preamplifier of the memory device according to the seventh embodiment in a second read operation;

FIG. 64 is a graph showing the relationship of voltages after the voltage information V2nd generation operation.

DETAILED DESCRIPTION

Figure 1:
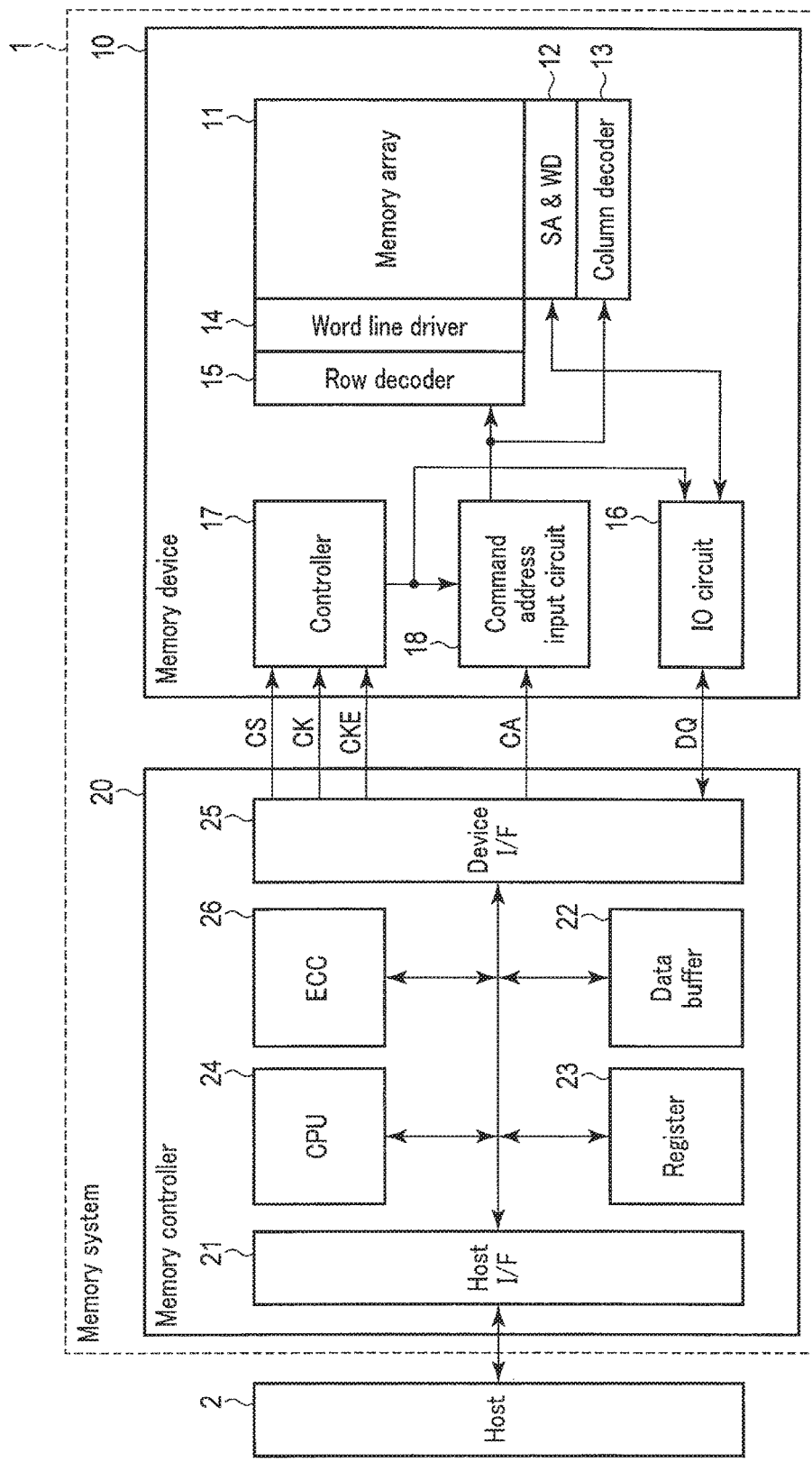
FIG. 1 is a block diagram showing a memory system including a memory device according to the first embodiment.

In general, according to one embodiment, a memory device includes a memory cell; and a first circuit configured to perform first read for the memory cell and generate a first voltage, write first data to the memory cell that has undergone the first read, perform second read for the memory cell to which the first data is written and generate a second voltage, generate a first current based on the first voltage, generate a second current based on the second voltage, and add a third current to one of the first current and the second current, thereby determining data stored in the memory cell at the time of the first read.

Embodiments will now be described with reference to the accompanying drawings. Note that in the following explanation, the same reference numerals denote constituent elements having almost the same functions and arrangements, and a repetitive description will be made only when necessary. The embodiments to be described below merely exemplify devices and methods for embodying the technical concepts of the embodiments, and the technical concepts of the embodiments do not limit the materials, shapes, structures, layouts, and the like of the component, to those tore described below. The technical concepts of the embodiments allow various changes and modifications to be made in the appended claims.

Each functional block can be implemented as one of hardware and computer software or a combination thereof. For this reason, each block will be described from the viewpoint of its function to clearly show that the block is implemented by either of them. Whether the function is executed as hardware or software depends on a detailed embodiment or a design restriction imparted to the whole system. Those skilled in the art can implement these functions by various methods for each detailed embodiment. However, deciding the implementation is incorporated in the present invention.

A case in which an MRAM is applied to a memory array will be described in the following embodiments.

<1> First Embodiment

<1-1> Arrangement
<1-1-1> Arrangement of Memory System
The basic arrangement of a memory system 1 according to the first embodiment will schematically be described with reference to FIG. 1. The memory system 1 includes a memory device 10 and a memory controller 20.

<1-1-2> Arrangement of Memory Controller

The memory controller 20 receives an instruction from a host (external device) 2 such as a personal computer, and reads data from the memory device 10 or writes data to the memory device 10.

The memory controller 20 includes a host interface (I/F) 21, a data buffer 22, a register 23, a CPU (Central Processing Unit) 24, a device interface (I/F) 25, and an FCC (Terror Correcting Code) circuit 26.

The host interface 21 is connected to the host 2. Data transmission/reception or the like is performed between the host 2 and the memory system 1 via the host interface 21.

The data buffer 22 is connected to the host interface 21. The data buffer 22 receives data transmitted from the host 2 to the memory system 1 via the host interface 21 and temporarily stores the data. The data buffer 22 also temporarily stores data to be transmitted from the memory system 1 to the host 2 via the host interface 21. The data buffer 22 can be a volatile memory or a nonvolatile memory.

The register 23 is, for example, a volatile memory, and stores setting information, a command, a status, or the like executed by the CPU 24. The register 23 can be a volatile memory or a nonvolatile memory.

The CPU 24 controls the operation of the entire memory system 1. The CPU 24, for example, executes predetermined processing for the memory device 10 in accordance with a command received from the host 2.

The device interface 25 transmits/receives various kinds of signals between the memory controller 20 and the memory device 10.

The ECC circuit 26 receives, via the data buffer 22, write data received from the host 2. The ECC circuit 26 adds an error correcting code to the write data. The ECC circuit 26 supplies the write data with the added error correcting code to, for example, the data buffer 22 or the device interface 25.

In addition, the ECC circuit 26 receives, via the device interface 25, data supplied from the memory device 10. The data is data stored in a memory cell of a memory array 11. The ECC circuit 26 determines whether an error exists in the data received from the memory device 10. Upon determining that an error exists in the received data, the ECC circuit 26 performs error correction processing for the received data using an error correcting code. The ECC circuit 26 then supplies the data that has undergone the error correction processing to, for example, the data buffer 22 or the device interface 25.

<1-1-3> Arrangement of Memory Device

The memory device 10 according to the first embodiment includes the memory array 11, a sense amplifier & write driver 12, a column decoder 13, a word line driver 14, a row decoder 15, an 10 circuit 16, a controller 17, and a command address input circuit 18.

Various kinds of external control signals, for example, a chip select signal CS, a clock signal CK, a clock enable signal CKE, and a command address signal CA are input from the memory controller 20 to the command address input circuit 18. The command address input circuit 18 transfers the command address signal CA to the controller 17.

The controller 17 identifies commands and addresses. The controller 17 controls the memory device 10.

The memory array 11 is an MRAM in which a plurality of memory cells MC are two-dimensionally arranged in a matrix. Each memory cell MC includes an MTU (Magnetic Tunnel Junction) element 30 (not shown) and a select transistor 31 (not shown). The MTJ element 30 is a magnetic tunnel junction element capable of storing data according to a change in the resistance state and rewriting the data by a current. The select transistor 31 is provided in correspondence with each MTJ element 30 and configured to be rendered conductive when supplying a current to the corresponding MTJ element 30. Note that the MTJ element may be referred to as a resistance change element.

A plurality of word lines WL extend in the row direction, and a plurality of bit lines BL extend in the column direction. The word lines WL and the bit lines BL are wired to cross each other. Two adjacent bit lines BL form a pair, and a memory cell MC is provided in correspondence with the intersection between a word line WL and a bit line pair (to the referred to as the bit line BL and a source line SL for the descriptive convenience in this embodiment). The MTJ element 30 and the select transistor 31 of each memory cell MC are connected in series between the bit line BL and the source line SL (in a bit line pair). The gate of the select transistor 31 is connected to the word line WL.

The word line driver 14 is arranged at least along one side of the memory array 11. The word line driver 14 is configured to apply a voltage to the word line WL in data read or data write.

The row decoder 15 decodes the address of the command address signal. CA supplied from the command address input circuit 18. More specifically, the row decoder 15 supplies the decoded row address to the word line driver 14. Accordingly, the word line driver 14 can apply a voltage to the selected word line WL.

The column decoder 13 decodes the address of the command address signal CA supplied from the command address input circuit 18. The column decoder 13 supplies the decoded column address to the sense amplifier & write driver 12.

The sense amplifier & write driver 12 includes a sense amplifier and a write driver. The sense amplifier & write driver 12 is arranged at least along one side of the memory array 11. The sense amplifier is connected to the bit line BL via a global bit line GBL and detects a current flowing to the memory cell MC connected to the selected word line WL, thereby reading data stored in the memory cell MC. The write driver is connected to the bit line BL via the global bit line GBL or to the source line SL via a global source line GSL. When writing data to the selected memory cell MC, the write driver supplies a current to the selected memory cell MC connected to the selected word line WL.

In addition, the sense amplifier & write driver 12 includes a page buffer (not shown). The page buffer is, for example, a volatile memory and stores data read by the sense amplifier or write data transferred via the IO circuit 16.

Data transmission/reception between the sense amplifier & write driver 12 and a data line DQ is done via the IO circuit 16.

<1-1-4> Memory Array

Figure 2:
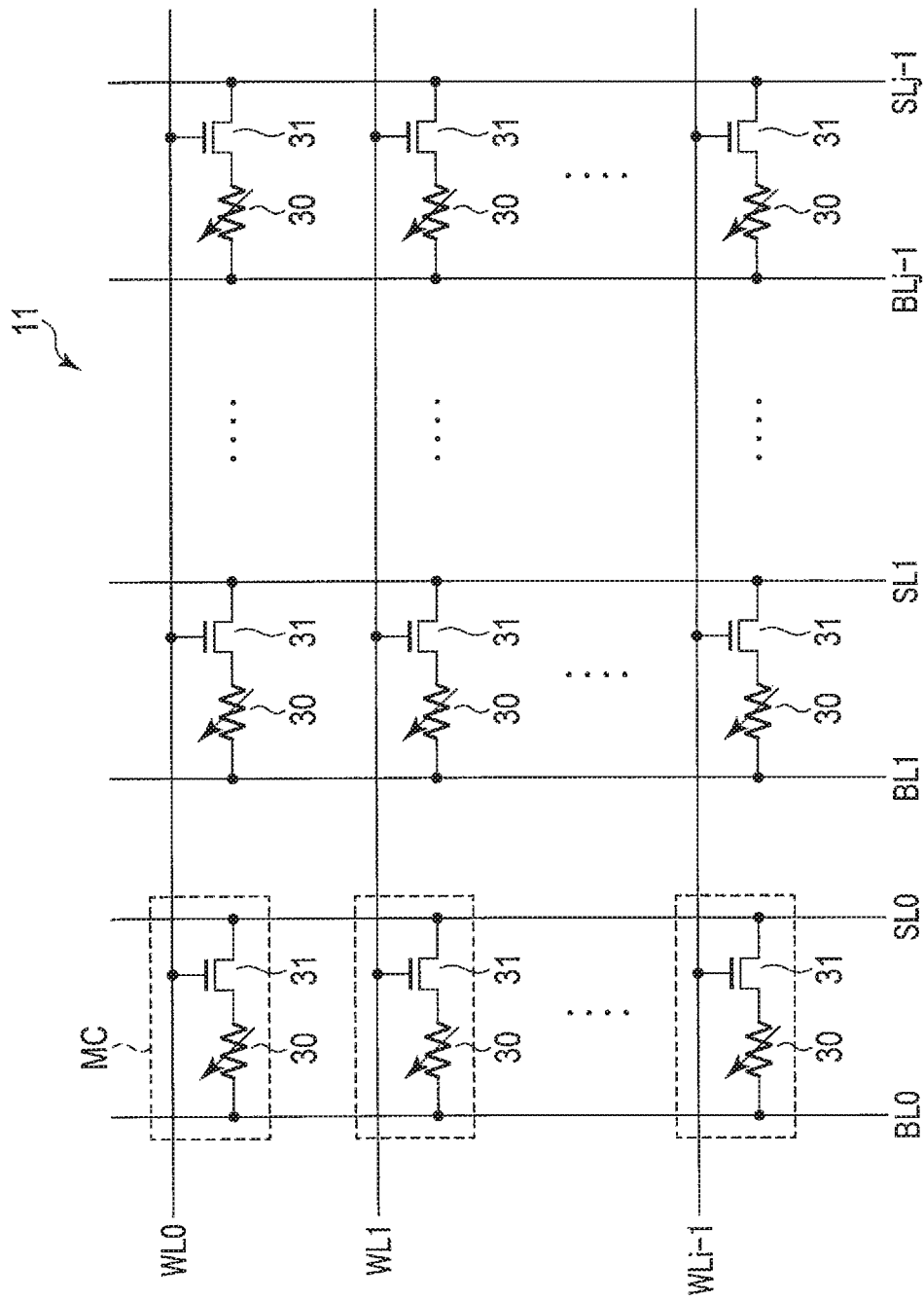
FIG. 2 is a circuit diagram showing the memory array of the memory device according to the first embodiment.

A detailed arrangement of the memory array of the memory device according to the first embodiment will be described next with reference to FIG. 2. As described above, the memory array 11 is formed by arranging the plurality of memory cells MC in a matrix. More specifically, the memory array 11 is provided with a plurality of word lines WL0 to WLi−1 (i: an integer of 2 or more), a plurality of bit lines BL0 to BLj−1, and a plurality of source lines SL0 to SLj−1 (j: an integer of 2 or more).

The memory cell MC is formed by the MTJ element 30 and the select transistor 31. The select transistor 31 is formed from, for example, an N-channel MOSFET (Metal Oxide Silicon Field Effect Transistor).

One terminal of the MTJ element 30 is connected to the bit line and the other terminal is connected to the drain of the select transistor 31. The gate of the select transistor 31 is connected to the word line WL, and the source is connected to the source line SL.

<1-1-5> Memory Cell

The memory cell of the memory device according to the first embodiment will schematically be described next with reference to FIG. 3.

Figure 3:
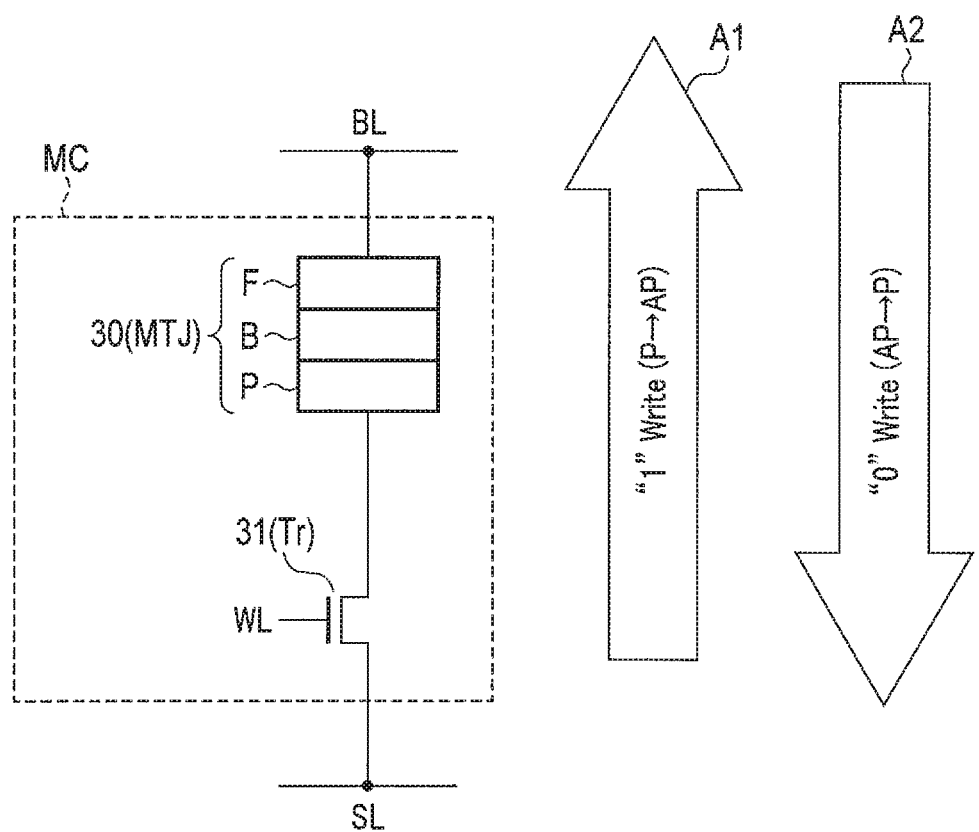
FIG. 3 is a view showing the basic arrangement of a memory cell of the memory device according to the first embodiment.

As shown in FIG. 3, the MTJ element 30 using a TMR (Tunneling MagnetoResistive) effect has a stacked structure including two ferromagnetic layers F and P and a nonmagnetic layer (tunnel insulating film) B sandwiched between them, and stores digital data based on a change in the magnetoresistance by a spin polarization tunneling effect. The MTJ element 30 can obtain a low resistance state and a high resistance state according to the magnetic alignment of the two ferromagnetic layers F and P. For example, when the low resistance state is defined as "0" data, and the high resistance state is defined as "1" data, 1-bit data can be recorded in the MTJ element 30. The low resistance state may be defined as "1" data, and the high resistance state may be defined as "0" data, as a matter of course.

For example, the MTJ element 30 is formed by sequentially stacking the fixed layer (pinned layer) P the tunnel barrier layer B, and the recording layer (free layer) F. The pinned layer P is a layer in which the direction of magnetic alignment is fixed. In the free layer F, the direction of magnetic alignment can change. The free layer F stores data depending on the direction of magnetization. The pinned layer P and the free layer F are made of a ferromagnetic material, and the tunnel barrier layer B is made of an insulating film.

More specifically, for example, cobalt iron boron (CoFeB) or iron boride (FeB) may be used for the free layer F. For example, cobalt platinum (CoPt), cobalt nickel (CoNi), or cobalt palladium (CoPd) may be used for the pinned layer P. The tunnel barrier layer B is made of a nonmagnetic material, and a nonmagnetic metal, nonmagnetic semiconductor, or an insulating material can be used. For example, magnesium oxide (MgO) or aluminum oxide ($Al_2O_3$) may be used for the tunnel barrier layer B.

When a current is supplied in the direction of an arrow A1 at the time of write, the direction of magnetization in the free layer F is set in an antiparallel state (AP state) with respect to that in the pinned layer P, and the high resistance state ("1" data) is obtained. This write operation can be referred to as a "1" write operation. When a current is supplied in the direction of an arrow A2 at the time of write, the direction of magnetization in the pinned layer P and that in the free layer F are set in a parallel state (P state), and the low resistance state ("0" data) is obtained. This write operation can be referred to as a "0" write operation. In this way, the MTJ element can write different data depending on the direction to supply the current.

<1-1-6> Sense Amplifier & Write Driver

The sense amplifier & write driver 12 of the memory device according to the first embodiment will be described with reference to FIG. 4.

Figure 4:
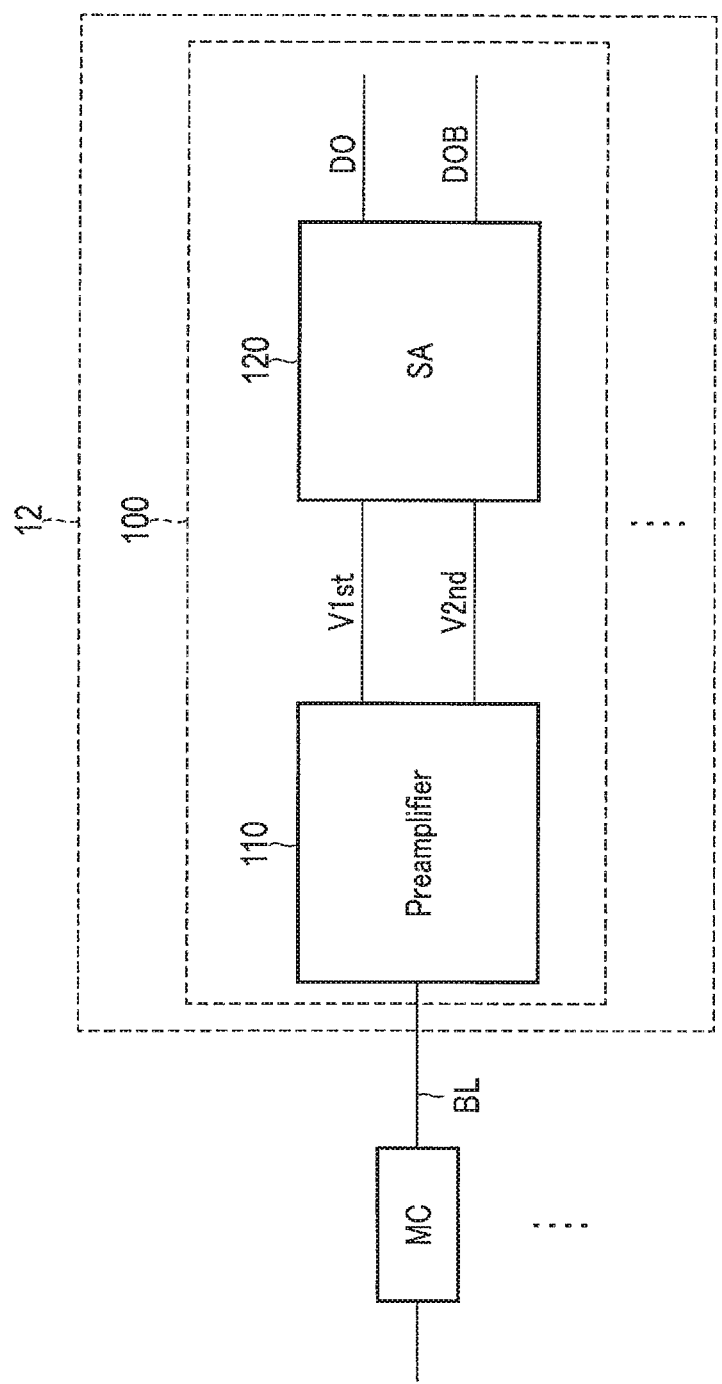
FIG. 4 is a block diagram showing a sense amplifier & write driver of the memory device according to the first embodiment.

As shown in FIG. 4, the sense amplifier & write driver 12 includes a plurality of sense circuits 100. The plurality of sense circuits 100 are provided in correspondence with the bit lines (global bit lines), respectively. Each of the plurality of sense circuits 100 includes a preamplifier 110 and a sense amplifier (SA) 120.

The preamplifier 110 supplies a current (cell current) to the memory cell MC via the bit line, and stores voltages V1st and V2nd based on the cell current.

The sense amplifier 120 determines data (DO or DOB) based on the voltages V1st and V2nd stored in the preamplifier 110.

<1-1-6-1> Arrangement of Preamplifier

The arrangement of the preamplifier 110 of the memory device according to the first embodiment will be described next with reference to FIG. 5.

Figure 5:
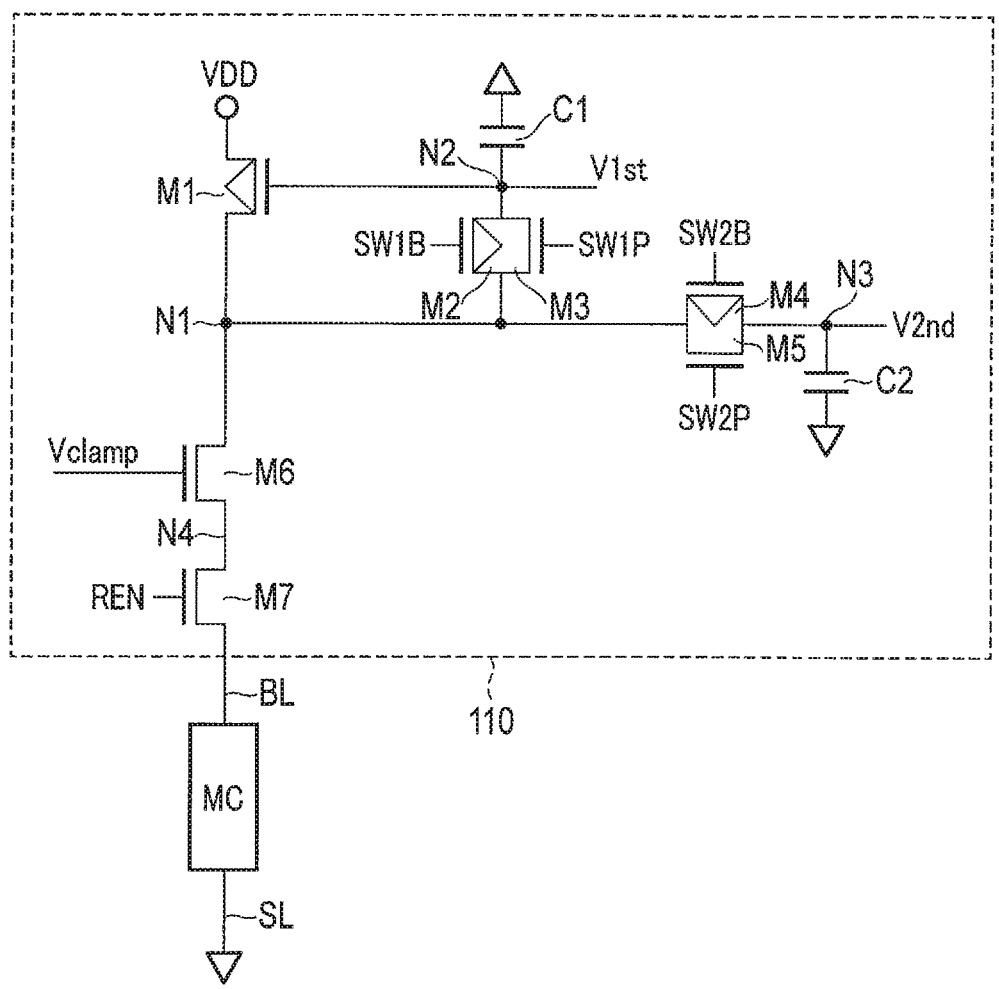
FIG. 5 is a circuit diagram showing the preamplifier of the memory device according to the first embodiment.

As shown in FIG. 5, the preamplifier 110 includes PMOS transistors M1, M2, and M4, NMOS transistors M3, M5, M6, and M7, and capacitors C1 and C2.

A power supply voltage VDD is applied to one terminal of the transistor M1, the other terminal is connected to a node N1, and the gate electrode is connected to a node N2.

One terminal of the transistor M2 is connected to the node N1, the other terminal is connected to the node N2, and a signal SW1B is supplied to the gate electrode.

One terminal of the transistor M3 is connected to the node N1, the other terminal is connected to the node N2, and a signal SW1P is supplied to the gate electrode.

The transistor M2 and the transistor M3 function as one switch.

One terminal of the transistor M4 is connected to the node N1, the other terminal is connected to a node N3, and a signal SW2B is supplied to the gate electrode.

One terminal of the transistor M5 is connected to the node N1, the other terminal is connected to the node N3, and a signal SW2P is supplied to the gate electrode.

The transistor M4 and the transistor M5 function as one switch.

One terminal of the transistor M6 is connected to the node N1, the other terminal is connected to a node N4, and a signal Vclamp is supplied to the gate electrode.

One terminal of the transistor M7 is connected to the node N4, the other terminal is connected to a bit line (global bit line), and a signal REN is supplied to the gate electrode.

One terminal of the capacitor C1 is connected to the node N2, and a ground voltage VSS is applied to the other terminal.

One terminal of the capacitor C2 is connected to the node N3, and the ground voltage VSS is applied to the other terminal.

The potential of the node N2 is supplied to the sense amplifier 120 as V1st.

The potential of the node N3 is supplied to the sense amplifier 120 as V2nd.

The operation of the preamplifier 110 will be described later.

<1-1-6-2> Arrangement of Sense Amplifier

The arrangement of the sense amplifier 120 of the memory device according to the first embodiment will be described next with reference to FIG. 6.

Figure 6:
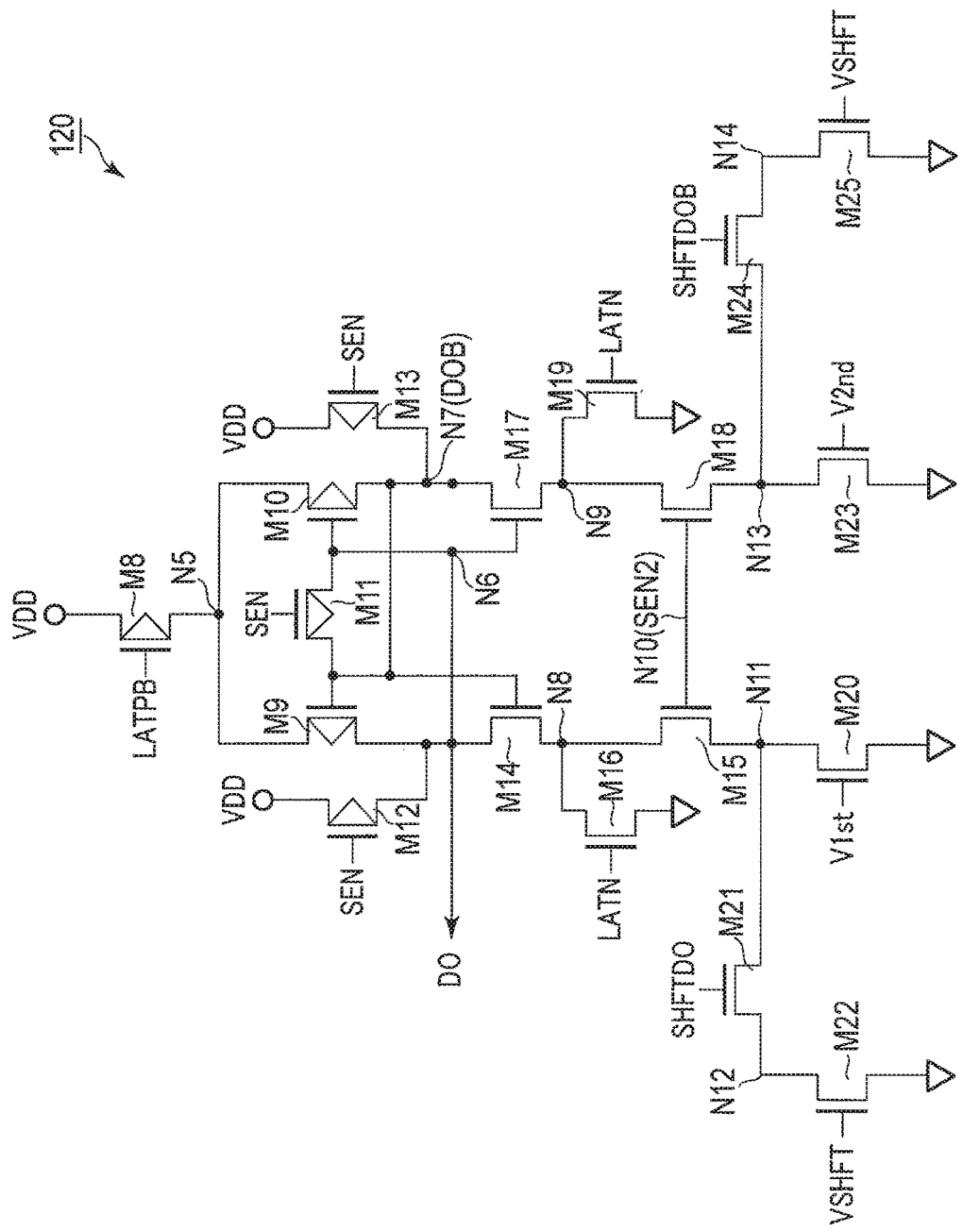
FIG. 6 is a circuit diagram showing the sense amplifier of the memory device according to the first embodiment.

As shown in FIG. 6, the sense amplifier 120 includes PMOS transistors M8, M9, M10, M11, M12, and M13 and NMOS transistors M14, M15, M16, M17, M18, M19, M20, M21, M22, M23, M24, and M25.

The power supply voltage VDD is applied to one terminal of the transistor M8, the other terminal is connected to a node N5, and a signal LATPB is supplied to the gate electrode.

One terminal of the transistor M9 is connected to the node N5, the other terminal is connected to a node N6, and the gate electrode is connected to a node N7.

One terminal of the transistor M10 is connected to the node N5, the other terminal is connected to the node N7, and the gate electrode is connected to the node N6.

One terminal of the transistor M11 is connected to the node N6, the other terminal is connected to the node N7, and a signal SEN is supplied to the gate electrode.

The power supply voltage VDD is applied to one terminal of the transistor M12, the other terminal is connected to the node N6, and the signal SEN is supplied to the gate electrode.

The power supply voltage VDD is applied to one terminal of the transistor M13, the other terminal is connected to the node N6, and the signal SEN is supplied to the gate electrode.

One terminal of the transistor M14 is connected to the node N6, the other terminal is connected to a node N8, and the gate electrode is connected to the node N7.

One terminal of the transistor M15 is connected to the node N8, the other terminal is connected to a node N11, and a signal SEN2 is supplied to the gate electrode via a node N10.

One terminal of the transistor M16 is connected to the node N8, the ground voltage VSS is applied to the other terminal, and a signal LATN is supplied to the gate electrode.

One terminal of the transistor M17 is connected to the node N7, the other terminal is connected to a node N9, and the gate electrode is connected to the node N6.

One terminal of the transistor M18 is connected to the node N9, the other terminal is connected to a node N13, and the signal SEN2 is supplied to the gate electrode via the node N10.

One terminal of the transistor M19 is connected to the node N9, the ground voltage VSS is applied to the other terminal, and the signal LATN is supplied to the gate electrode.

One terminal of the transistor M20 is connected to the node N11, the ground voltage VSS is applied to the other terminal, and the signal V1st is supplied to the gate electrode.

One terminal of the transistor M21 is connected to the node N11, the other terminal is connected to a node N12, and a signal SHFTDO is supplied to the gate electrode.

One terminal of the transistor M22 is connected to the node N12, the ground voltage VSS is applied to the other terminal, and a signal VSHFT is supplied to the gate electrode.

One terminal of the transistor M23 is connected to the node N13, the ground voltage VSS is applied to the other terminal, and the signal V2nd is supplied to the gate electrode.

One terminal of the transistor M24 is connected to the node N13, the other terminal is connected to a node N14, and a signal SHFTDOB is supplied to the gate electrode.

One terminal of the transistor M25 is connected to the node N14, the ground voltage VSS is applied to the other terminal, and the signal VSHFT is supplied to the gate electrode.

The potential of the node N6 is supplied to the IO circuit 16 as DO.

The potential of the node N7 is supplied to the IO circuit 16 as DOB.

The operation of the sense amplifier 120 will be described later.

<1-2> Operation

As described above, the MTJ element of the memory device according to the first embodiment stores data using a change in the resistance value. To read information stored in the MTJ element, the memory device supplies a read current (to be also referred to as a cell current) to the MTJ element. The memory device then converts the resistance value of the MTJ element into a current value or a voltage value and compares the value with a reference value, thereby determining the resistance state.

However, if the resistance variation of the MTJ element increases, the interval of the resistance value distribution of the "0" state and the "1" state may narrow. For this reason, in a read method of setting the reference value in the resistance value distribution and discriminating the state of the MTJ element based on the magnitude of a value relative to the reference value, the read margin considerably decreases.

In the first embodiment, shift signal information is added to the signal information (the current value or the voltage value) of one of the "0" state and the "1" state of the MTJ element to generate a reference signal. A self-reference read method of discriminating the initial state of the MTJ element based on the reference signal will be described.

The read operation of the memory system according to the first embodiment will be described next.

<1-2-1> Outline of Read Operation

The outline of the read operation of the memory system according to the first embodiment will be described with reference to FIG. 7.

[Step S1001]

Upon receiving a read instruction from the host 2, the memory controller 20 issues an active command and a read command to the memory device 10.

The memory device 10 receives the active command and the read command from the memory controller 20, and performs a first read operation (1st READ) for a read target memory cell. By the first read operation, the preamplifier 110 stores the resistance state of the read target memory cell as the voltage information (signal voltage) V1st.

[Step 1002]

The memory device 10 performs a "0" write operation (WRITE "0") for the memory cell as the target of the first read operation. Accordingly, "0" data is overwritten to the memory cell as the target of the first read operation. In this operation, the memory cell is set in a standard state ("0" here) to generate V2nd to be described later. That is, the write operation may be referred to as a standardization operation.

[Step S1003]

The memory device 10 performs a second read operation (2nd READ) for the memory cell as the target of the first read operation. By the second read operation, the preamplifier 110 generates the voltage information (signal voltage) V2nd.

[Step S1004]

Based on V2nd generated in step S1003, the sense amplifier 120 determines the result of V1st generated in step S1001. More specifically, the sense amplifier 120 compares a current obtained by adding a current I1st based on V1st and a reference current Ishift with a current I2nd based on V2nd, thereby determining data stored in the memory cell.

<1-2-2> Details of Read Operation

Details of the read operation of the memory system according to the first embodiment will be described with reference to the timing chart of FIG. 8.

[Time T0] to [Time T1]

In the first read operation (step S1001), the controller 17 sets the signal REN, the signal SW1P, the signal SW2P, and the signal Vclamp to "H (High)" level, and sets the signal SW1B and the signal SW2B to "L (Low)" level (L<H).

Figure 9:
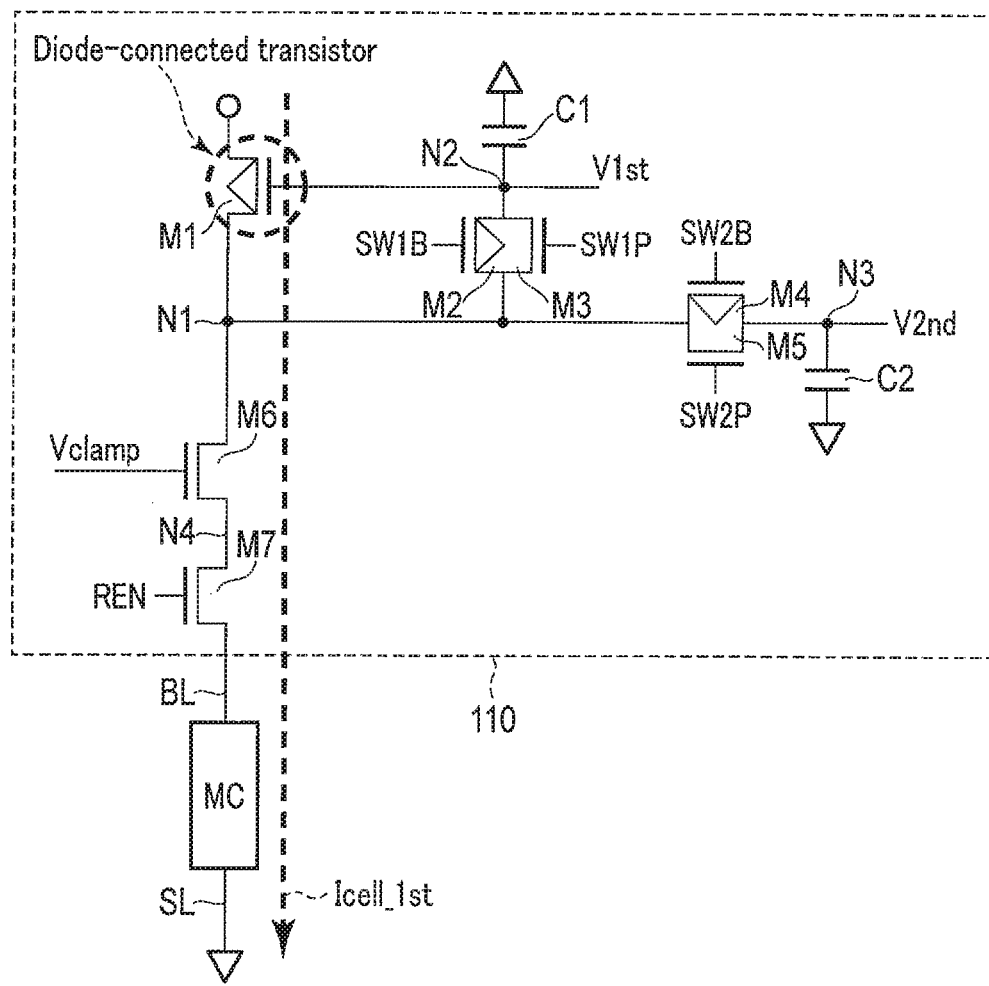
FIG. 9 is a circuit diagram showing the operation of the preamplifier of the memory device according to the first embodiment in a first read operation.

Accordingly, as shown in FIG. 9, the transistors M2, M4, M5, M6, and M7 change to the ON (conductive) state. The node N2 is thus grounded via the node N1, the node N4, the bit line (global bit line), the memory cell MC, and the source line (global source line). As a result, the potential of the node N2 lowers, and the transistor M1 is turned on.

In the ON state, the transistor M1 supplies a cell current (Icell_1st) to the memory cell MC. Since the transistors M2 and M3 are ON, the transistor M1 is driven as a diode-connection transistor.

The potential of the node N2 is the voltage information (signal voltage) V1st based on the cell current (Icell_1st).

[Time T1] to [Time T2]

In the "0" write operation (step S1002), the controller 17 lowers the signal REN and the signal SW1P to "L" level, and raises a signal WRITE0 and the signal SW1B to "H" level. The signal WRITE0 is a signal concerning the "0" write operation. When the signal WRITE0 is at "H" level, the "0" write operation is performed.

Accordingly, "0" data is written to the memory cell by a write driver (not shown).

In addition, the transistors M2 and M3 of the preamplifier 110 change to the OFF (nonconductive) state. The node N2 thus stores the voltage information (signal voltage) V1st.

[Time T2] to [Time T3]

In the second read operation (step S1003), the controller 17 raises the signal REN to "H" level, and lowers the signal WRITE0 to "L" level.

Figure 10:
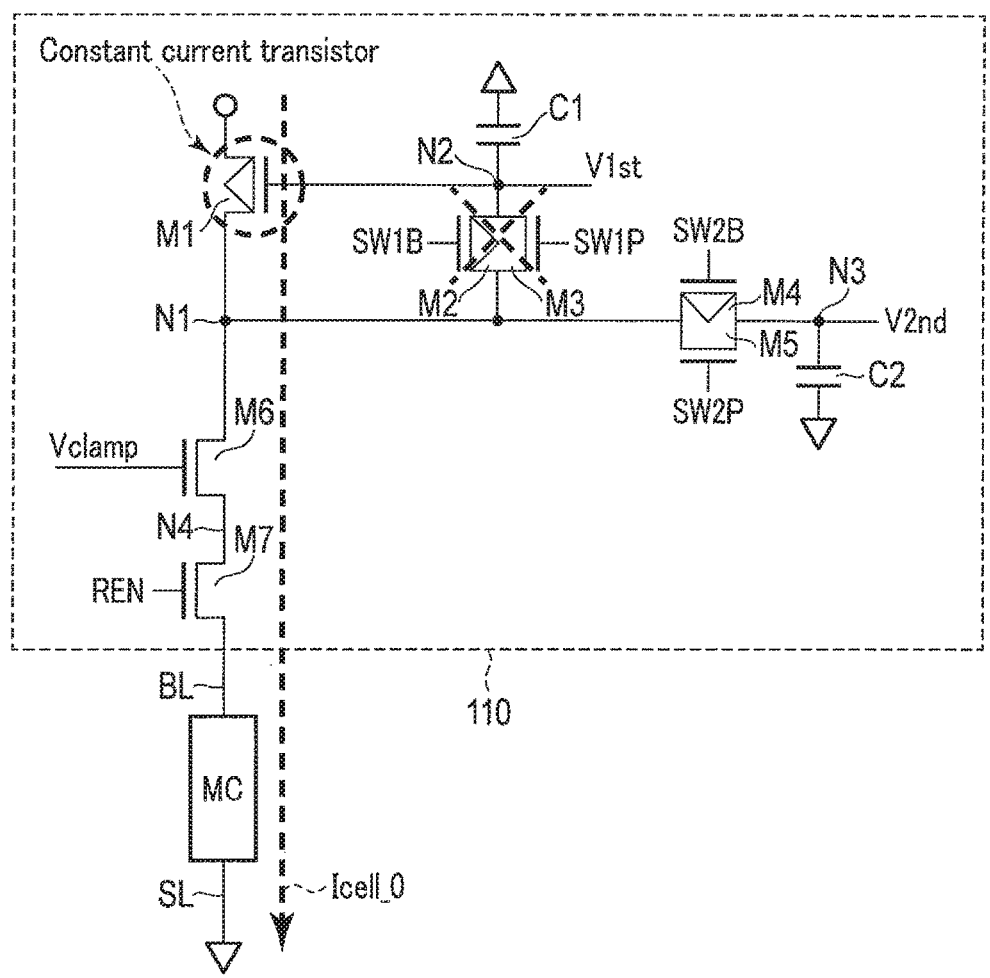
FIG. 10 is a circuit diagram showing the operation of the preamplifier of the memory device according to the first embodiment in a second read operation.

Accordingly, as shown in FIG. 10, the transistors M4, M5, M6, and M7 are turned on. In addition, the transistor M1 is turned on based on V1st.

The transistor M1 supplies a cell current (Icell_0) to the memory cell MC that stores "0" data. The transistor M1 is driven as a constant current transistor based on the voltage V1st.

The potential of the node N3 is the voltage information (signal voltage) V2nd based on the cell current (Icell_0).

[Time T3] to [Time T5]

In the determination operation (step S1004), the controller 17 lowers the signal REN and the signal SW2P to "L" level, and raises the signal SW2B and the signal SEN2 to "H" level. The controller 17 also sets the signal SHFTDOB, the signal VSHFT, and the signal LATPB to "H" level, and sets the signal SHFTDO, the signal LATN, and the signal SEN to "L" level.

Accordingly, the transistors M4 and M5 of the preamplifier 110 change to the OFF (nonconductive) state. The node N3 thus stores the voltage information (signal voltage) V2nd.

As shown in FIG. 11, in the sense amplifier 120, the transistors M11, M12, M13, M14, M15, M17, M18, M20, M23, M24, and M25 are turned on. The transistor M21 is turned off.

Accordingly, the transistor M20 supplies the current I1st corresponding to V1st.

In addition, the transistor M23 supplies a current I2nd corresponding to V2nd, and the transistor M25 supplies the shift current shift corresponding to VSHFT.

When the signal SEN is set to "H" level, the transistors M12 and M13 change to the OFF state, and the current supply from the transistors M12 and M13 is cut off. Accordingly, the potential of the node N6 is decided based on the current I1st. The potential of the node N7 is decided based on the current I2nd and the shift current Ishift. Hence, a voltage difference is generated between the node N6 and the node N7. The voltage difference is widened immediately by the positive feedback of the transistors M9, M10, M14, and M17.

The sense amplifier 120 thus determines the signal DO and the signal DOB.

[Time T5]

When the determination operation. (step S1004) ends, the controller 17 lowers the signal LATPB to "L" level, and raises the signal LATN to "H" level. The transistors M8, M16, and M19 of the sense amplifier 120 are thus turned on. Accordingly, the potential difference between the signal DO and the signal DOB is widened to the difference between "H" level and "L" level.

<1-2-3> Determination Method of Read Operation

A detailed determination method in the determination operation (step S1004) will be described next.

The operation characteristic of the preamplifier 110 will be described with reference to FIG. 12.

Figure 12:
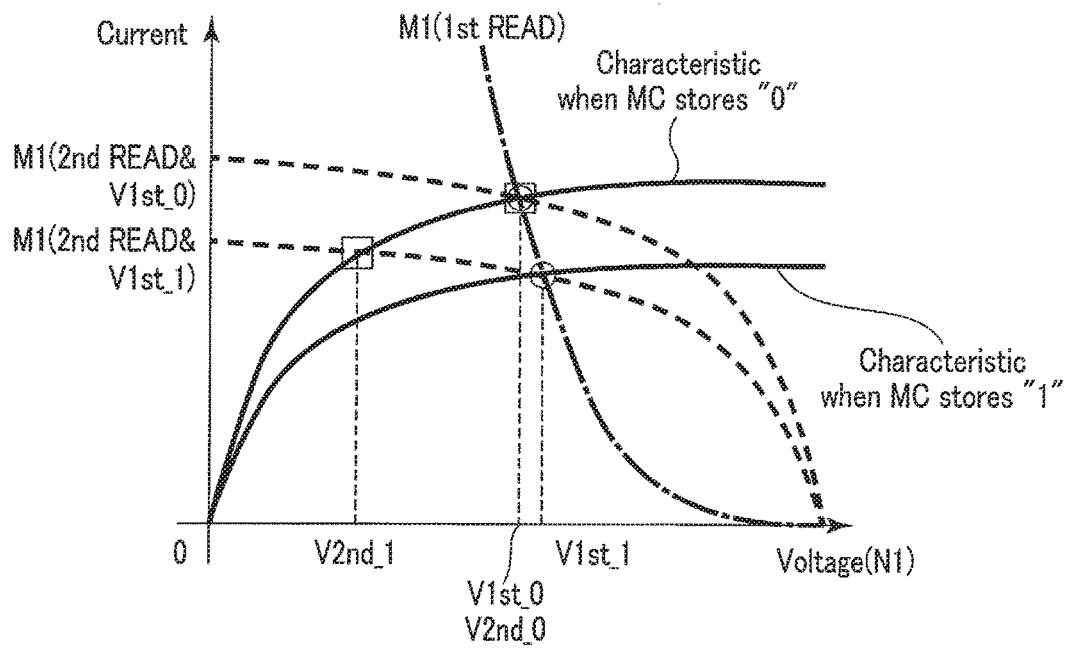
FIG. 12 is a graph showing the relationship between the characteristic of a transistor M1 and the characteristic of a memory cell in the first read and the relationship between the characteristic of the transistor M1 and the characteristic of the memory cell in the second read.

FIG. 12 shows the relationship between the characteristic of the transistor M1 and the characteristic of the memory cell in the first read. FIG. 12 also shows the relationship between the characteristic of the transistor M1 and the characteristic of the memory cell in the second read.

As shown in FIG. 12, when the memory cell stores "1" data, V1st is set to V1st_1 by the first read operation. In the second read operation, if V1st is V1st_1, V2nd is V2nd_1 (V2nd_1<V1st_1).

As shown in FIG. 12, when the memory cell stores "0" data, V1st is set to V1st_0 (V2nd_1<V1st_0<V1st_1) by the first read operation. In the second read operation, if V1st is V1st_0, V2nd is V2nd_0 (V1st_0=V2nd_ 0).

Figure 13:
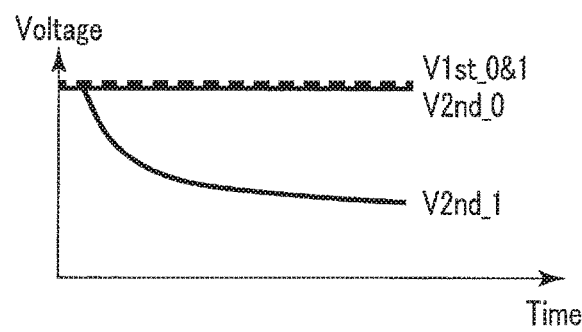
FIG. 13 is a graph showing the relationship of voltages after the second read operation.

FIG. 13 shows the relationship of voltages. As shown in FIG. 13, V1st_0, V1st_1, and V2nd_0 almost equal. Only V2nd_1 is lowered. Note that the timing chart of FIG. 13 is merely an example.

The operation of the sense amplifier 120 in a case in which the memory cell stores "1" data at the time of the first read operation will be described next with reference to FIG. 14. If the memory cell stores "1" data at the time of the first read operation, V1st is V1st_1, and V2nd is V2nd_1.

As described above, V2nd_1 is lower than V1st_1. For this reason, I2nd (I2nd_1) flowing to the transistor M23 based on V2nd_1 is smaller than I1st (I1st_1) flowing to the transistor M20 based on V1st_1.

Additionally, as described above, the sense amplifier 120 compares I1st with I2nd+Ishift. Note that VSHFT is set such that I1st_1 becomes larger than I2nd_1+Ishift.

As shown in FIG. 14, I2nd_1+Ishift is much smaller than I1st_1. For this reason, when the determination operation is performed in times T3 to T4 of FIG. 8, the signal DO and the signal DOB can appropriately be generated.

The operation of the sense amplifier 120 in a case in which the memory cell stores "0" data at the time of the first read operation will be described next with reference to FIG. 15. If the memory cell stores "0" data at the time of the first read operation, V1st is V1st_0, and V2nd is V2nd_0.

As described above, V2nd_0 almost equals V1st_0. For this reason, I2nd (I2nd_0) flowing to the transistor M23 based on V2nd_0 almost equals I1st (I1st_ 0) flowing to the transistor M20 based on V1st_0. Note that in FIG. 15 illustrates, for example, as if a magnitude relationship were held between I1st_0 and I2nd_0.

As described above, the sense amplifier 120 compares I1st with I2nd+Ishift. Note that VSHFT is set such that Ishift becomes I2nd_0.

Figure 15:
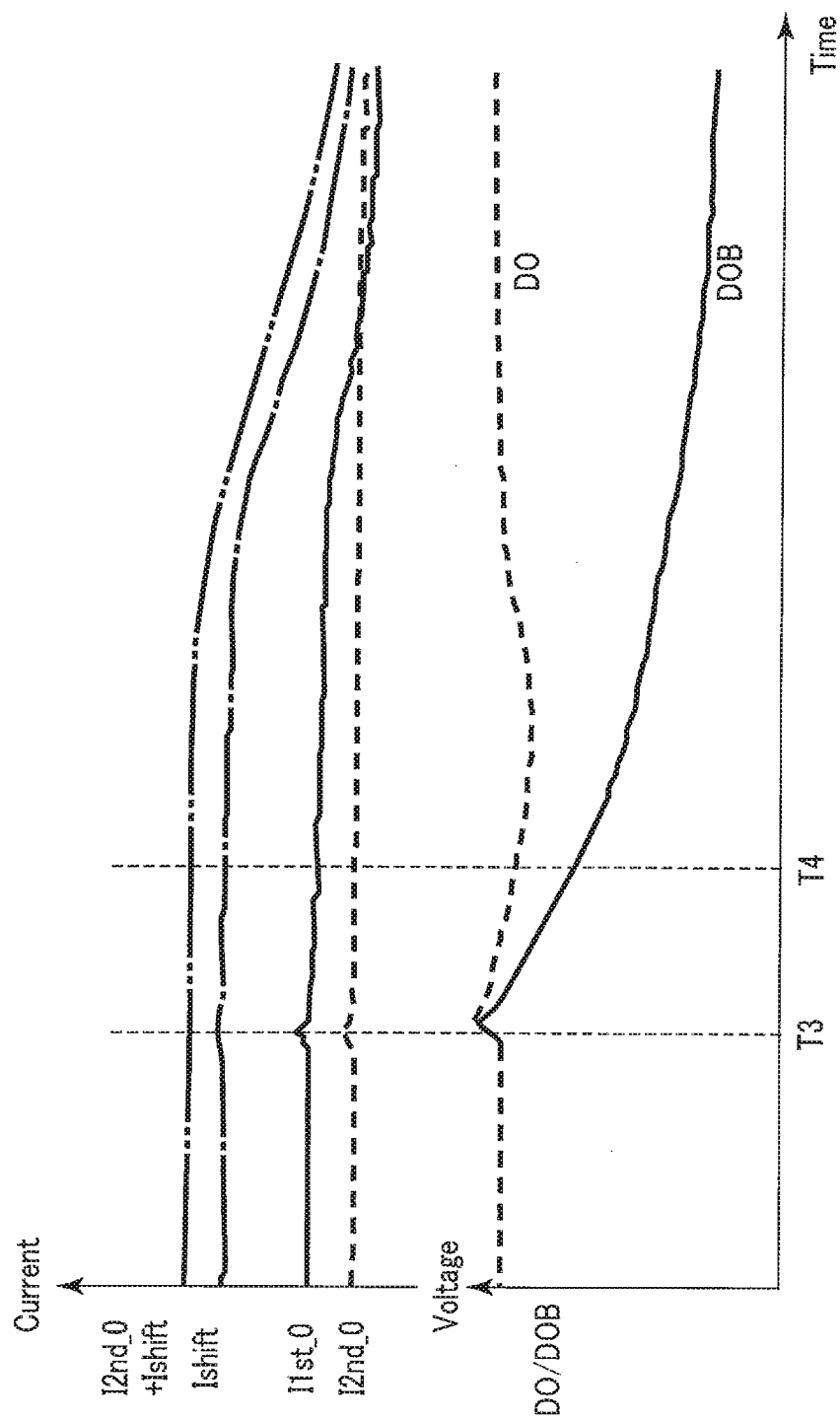
FIG. 15 is a timing chart showing currents and voltages generated in the sense amplifier in a case in which the memory cell stores "0" data at the time of the first read operation.

As shown in FIG. 15, I2nd_0+Ishift is larger than I1st_0. For this reason, when the determination operation is performed in times T3 to T4 of FIG. 8, the signal DO and the signal DOB can appropriately be generated.

Note that in the above-described embodiment, the operation of writing "0" to the memory cell as the target of the first read operation by the memory device 10 in step S1002 has been described. However, the memory device 10 may write "1" to the memory cell as the target of the first read operation in step S1002.

That is, "1" may be the standard state.

Figure 16:
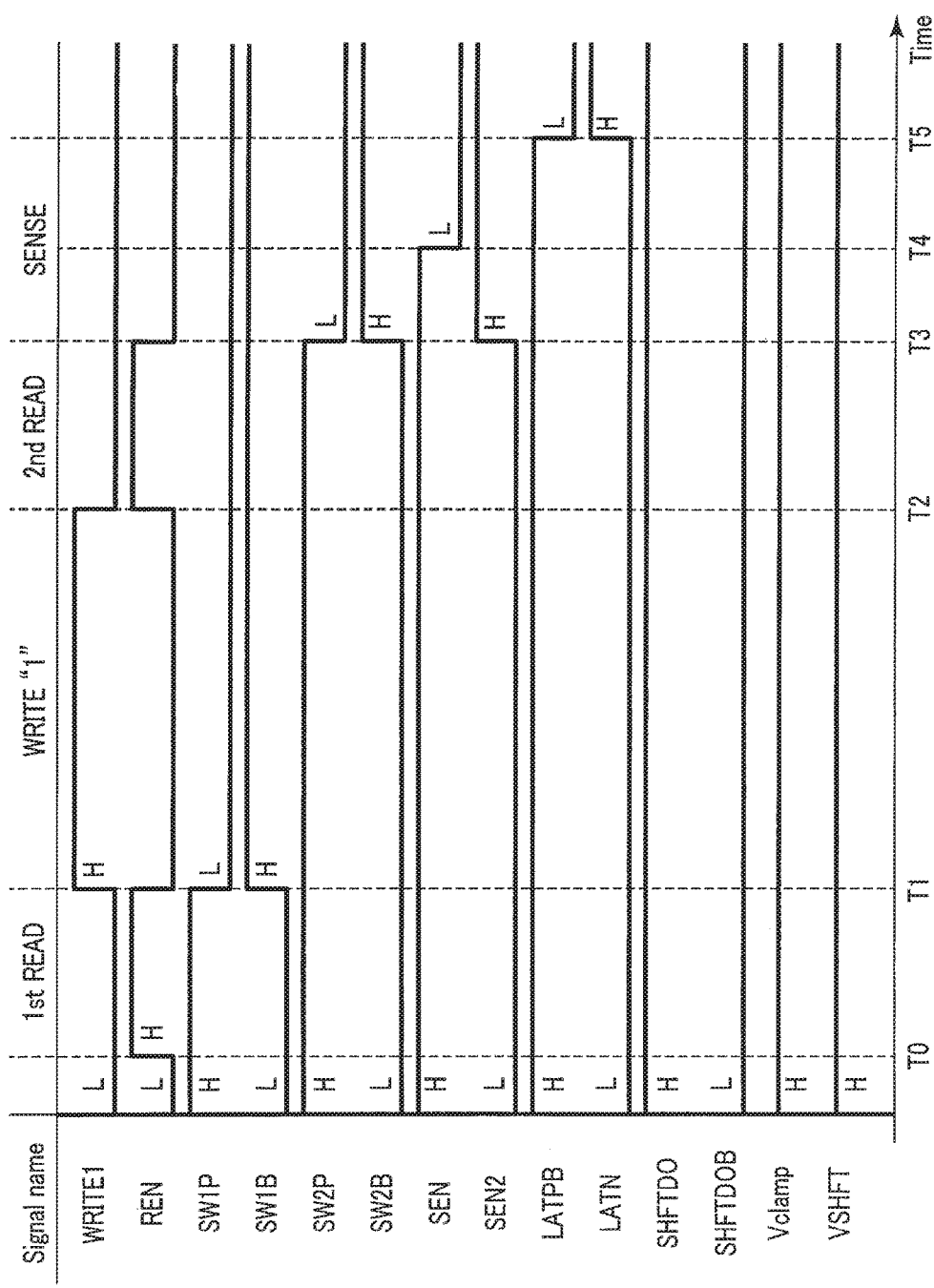
FIG. 16 is a timing chart of the read operation of the memory system according to the first embodiment.
Figure 17:
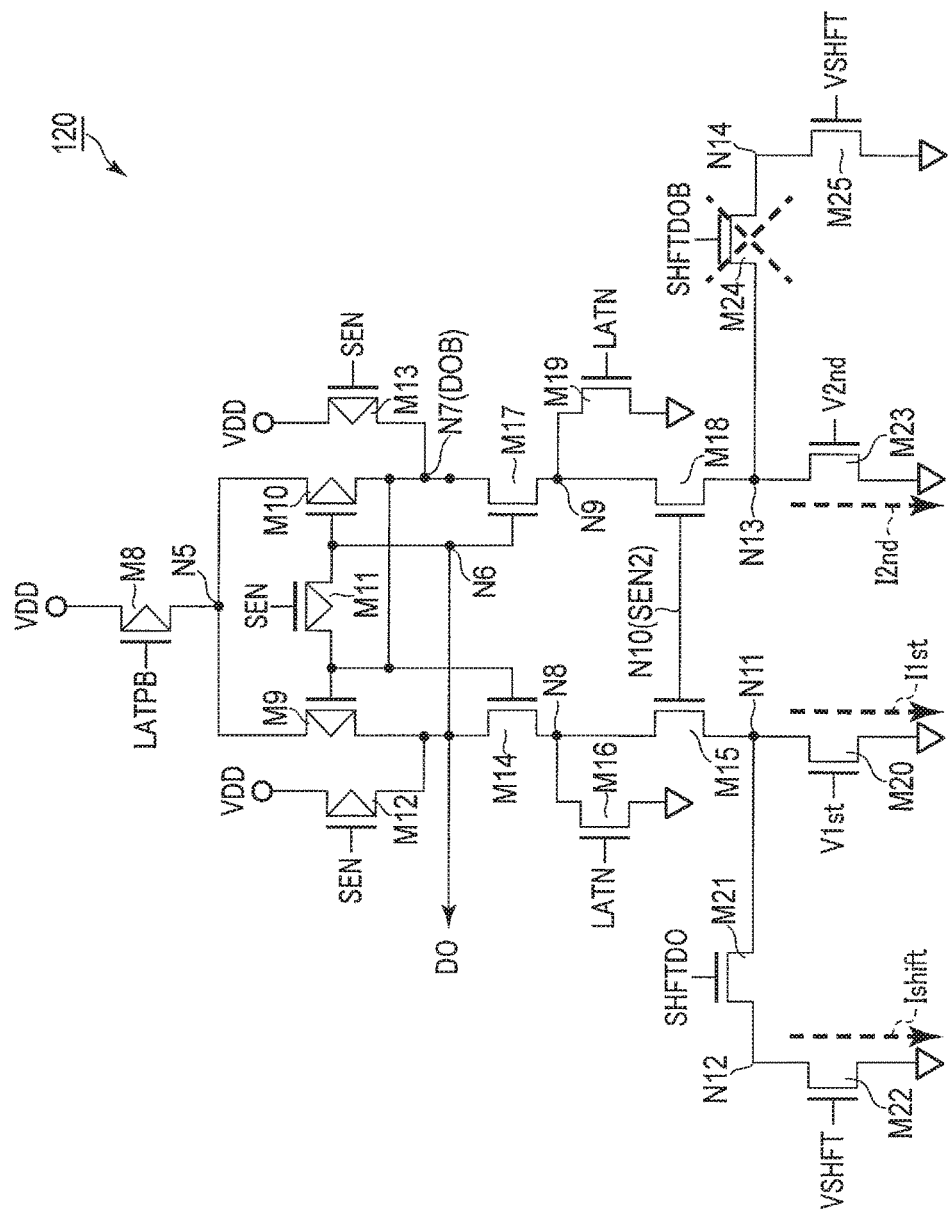
FIG. 17 is a circuit diagram showing the operation of the sense amplifier of the memory device according to the first embodiment in the determination operation.

Note that when writing "1" in step S1002, the controller 17 sets the signal SHFTDO to "H" level, and sets the signal SHFTDOB to "L" level in the read operation (see FIG. 16). Accordingly, I2nd is supplied to the node N7, and I1st+Ishift is supplied to the node N6 in the determination operation (step S1004). The determination operation can thus be performed (see FIG. 17).

<1-3> Effects

According to the above-described embodiment, the shift current is generated by the sense amplifier. It is therefore possible to perform a high-quality read operation by easy control.

For easy understanding of the above-described embodiment, a comparative example will be described below. In the comparative example, a case in which the shift current is generated by the preamplifier will be described. Although not illustrated, the sense amplifier according to the comparative example does not include the transistors M21, M22, M24, and M25. For this reason, the sense amplifier cannot generate the shift current.

Figure 18:
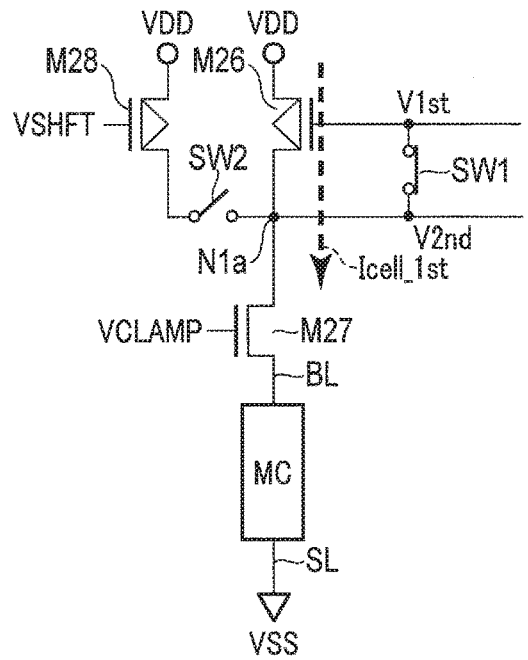
FIG. 18 is a circuit diagram showing the operation of the preamplifier of a memory device according to a comparative example of the first embodiment in the first read operation.

FIG. 18 shows the preamplifier of a memory device according to the comparative example. As shown in FIG. 18, the preamplifier of the memory device according to the comparative example includes PMOS transistors M26 and M28, an NMOS transistor M27, and switches SW1 and SW2.

As shown in FIG. 18, at the time of the first read operation, the transistor M27 is turned on, and the switch SW1 is connected. The cell current Icell_1st is thus supplied via the transistor M26. As a result, the potential V1st corresponding to the data in the memory cell MC is stored.

Figure 19:
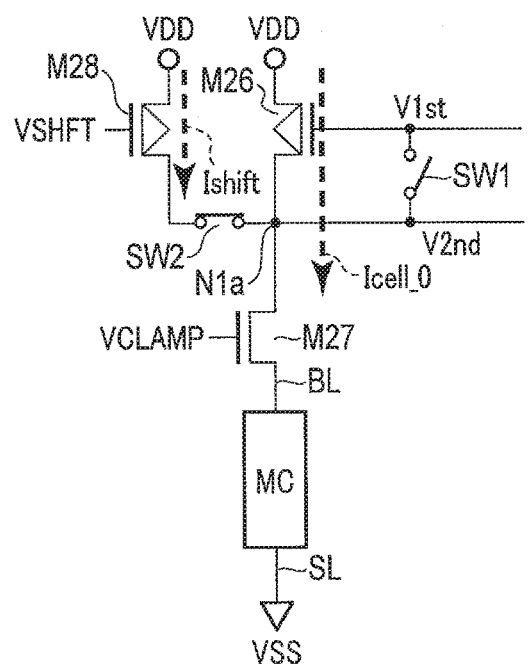
FIG. 19 is a circuit diagram showing the operation of the preamplifier of the memory device according to the comparative example of the first embodiment in the second read operation.

Next, as shown in FIG. 19, at the time of the second read operation, the transistors M27 and M28 are turned on, and the switch SW2 is connected. The cell current Icell_0 is thus supplied via the transistor M26, and the shift current Ishift is supplied via the transistor M28.

As described above, in the comparative example, when, in the second read operation, generating V2nd using V1st obtained by the first read operation, the shift current Ishift is supplied to the bit line, thereby adjusting V2nd. The shift current Ishift needs to be adjusted such that I1st is set between V2nd in the "0" state and that in the "1" state (see FIGS. 20 and 21). An examination will be made here while neglecting a variation in the read current for the sake of simplicity. The read margin can be maximized by setting the shift current Ishift to the intermediate current ((Icell_0+Icell_1)/2) between the read current (Icell_0) in the "0" state and the read current (Icell_1) in the "1" state. However, as the memory cell size is reduced, the read current becomes small, and the current difference between Icell_0 and Icell_1 narrows, high accuracy is required to adjust the shift current Ishift. That is, control of the shift current becomes difficult along with the decrease in the read current. In addition, V2nd is amplified from the read current and the shift current and thus generated. For this reason, the control voltage noise of the shift current may be amplified to affect V2nd. The comparative example assumes that "0" is set as the standard state in the write operation after the first read operation. In the arrangement of the comparative example, "1" cannot be set as the standard state in the write operation after the first read operation.

As described above, the preamplifier according to the comparative example needs to do accurate offset control and control the noise of the power supply voltage VDD. Additionally, in the preamplifier according to the comparative example, the standard state cannot be selected.

However, as described above, the sense circuit 100 according to the embodiment generates the shift current Ishift not by the preamplifier 110 but by the sense amplifier 120 at the time of the determination operation. It is therefore unnecessary to control the shift current to the intermediate current ((Icell_0+Icell_1)/2) between the read current (Icell_0) in the "0" state and the read current (Icell_1) in the "1" state. For this reason, even if the read current becomes small, and the current difference between Icell_0 and Icell_1 narrows, the sense circuit 100 need not generate the intermediate current ((Icell_0+Icell_1)/2). Hence, accurate shift control as in the comparative example is not need.

Also, as described above, the sense circuit 100 according to the embodiment generates the shift current by the transistors M22 and M25. The transistors M22 and M25 are NMOS transistors associated with the voltage VSS and are insensitive to the noise of the voltage VDD. For this reason, the influence of the noise of the power supply voltage VDD is small and therefore need not be taken into consideration as much as in the comparative example.

Furthermore, as described above, the sense circuit 100 according to the embodiment can appropriately generate the shift current by the transistors M22 and M25 even if the standard state is changed. As a result, the standard state can be selected flexibly.

As described above, according to the above-described embodiment, it is possible to provide a memory device capable of performing a high-quality read operation by easy control.

<2> Second Embodiment

The second embodiment will be described. In the second embodiment, a case in which a current mirror is employed in a preamplifier will be described. Note that the basic arrangement and the basic operation of a memory system according to the second embodiment are the same as those of the memory system according to the above-described first embodiment. Hence, a description of matters explained in the above-described first embodiment and matters easily supposable from the above-described first embodiment will be omitted.

<2-1> Arrangement of Preamplifier

The arrangement of a preamplifier 110 of a memory device according to the second embodiment will be described next with reference to FIG. 22.

As shown in FIG. 22, the preamplifier 110 includes PMOS transistors M29, M30, M31, and M34, NMOS transistors M6, M7, M32, M33, and M35, and capacitors C3 and C4.

A power supply voltage VDD is applied to one terminal of the transistor M29, and the other terminal and the gate electrode are connected to a node N15.

The power supply voltage VDD is applied to one terminal of the transistor M30, the other terminal is connected to a node N16, and the gate electrode is connected to the node N15.

One terminal of the transistor M6 is connected to a node N1, the other terminal is connected to a node N4, and a signal Vclamp is supplied to the gate electrode.

One terminal of the transistor M7 is connected to the node N4, the other terminal is connected to a bit line (global bit line), and a signal REN is supplied to the gate electrode.

One terminal of the transistor M31 is connected to the node N16, the other terminal is connected to a node N17, and a signal SW1B is supplied to the gate electrode.

One terminal of the transistor M32 is connected to the node N16, the other terminal is connected to the node N17, and a signal SW1P is supplied to the gate electrode.

The transistor M31 and the transistor M32 function as one switch.

One terminal of the transistor M33 is connected to the node N16, a around voltage VSS is applied to the other terminal, and the gate electrode is connected to the node N17.

One terminal of the capacitor C3 is connected to the node N17, and the ground voltage VSS is applied to the other terminal.

One terminal of the transistor M34 is connected to the node N16, the other terminal is connected to a node N18, and a signal SW2B is supplied to the gate electrode.

One terminal of the transistor M35 is connected to the node N16, the other terminal is connected to the node N18, and a signal SW2P is supplied to the gate electrode.

The transistor M34 and the transistor M35 function as one switch.

One terminal of the capacitor C4 is connected to the node N18, and the ground voltage VSS is applied to the other terminal.

The potential of the node N17 is supplied to a sense amplifier 120 as V1st. The transistors M31, M32, and M33, the capacitor C3, and the node N17 can be considered as a V1st generation unit.

The potential of the node N18 is supplied to the sense amplifier 120 as V2nd.

The transistors M33, M34, and M35, the capacitor C4, and the node N18 can be considered as a V2nd generation unit.

<2-2> Operation

<2-2-1> Details of Read Operation

Details of the read operation of the memory system according to the second embodiment will be described with reference to the timing chart of FIG. 8.

[Time T0] to [Time T1]

In the first read operation (step S1001), a controller 17 sets the signal REN, the signal SW1P, the signal SW2P, and the signal Vclamp to "B" level, and sets the signal SW1B and the signal SW2B to "L" level.

Accordingly, as shown in FIG. 23, the transistors M6, M7, M31, M32, M34, and M35 are turned on. The node N15 is thus grounded via the node N4, the bit line (global bit line), a memory cell MC, and a source line (global source line). As a result, the potential of the node N15 lowers, and the transistors M29 and M30 are turned on.

In the ON state, the transistor M29 supplies a cell current (Icell_1st) to the memory cell MC. Since the transistors M2 and M3 are ON, the transistor M29 is driven as a diode-connection transistor.

The transistor M30 is driven based on the potential of the node N15. For this reason, the transistor M30 supplies a copy current (Icopy_1st) of the cell current (Icell_1st) to the node N16.

As described above, the transistors M29 and M30 constitute a current mirror.

The potential of the node N17 is the voltage information V1st based on the copy current (Icopy_1st).

As described above, the preamplifier 110 supplies the cell current (Icell_1st) to the memory cell MC via a first current path formed from the transistors M29, M6, and M7. The preamplifier 110 also supplies the copy current (Icopy_1st) to the node N17 via a second current path formed from the transistor M30. The first current path and the second current path are electrically separated.

[Time T1] to [Time T2]

In the "0" write operation (step S1002), the controller 17 lowers the signal REN and the signal SW1P to "L" level, and raises a signal WRITE0 and the signal SW1B to "H" level.

Accordingly, "0" data is written to the memory cell by a write driver (not shown).

In addition, the transistors M31 and M32 of the preamplifier 110 change to the OFF state. The node N2 thus stores the voltage information V1st.

[Time T2] to [Time T3]

In the second read operation (step S1003), the controller 17 raises the signal REN to "H" level, and lowers the signal WRITE0 to "L" level.

Accordingly, as shown in FIG. 24, the transistors M6, M7, M30, M34, and M35 are turned on. The node N15 is thus grounded via the node N4, the bit line (global bit line), the memory cell MC, and the source line (global source line). As a result, the potential of the node N15 lowers, and the transistors M29 and M30 are turned on. The transistor M33 is turned on based on V1st.

The transistor M29 supplies a cell current (Icell_0) to the memory cell MC that stores "0" data. The transistor M29 is driven as a diode-connection transistor.

The transistor M30 is driven based on the potential of the node N15. For this reason, the transistor M30 supplies a copy current (Icopy_0) of the cell current (Icell_0) to the node N16.

The transistor M33 is driven as a constant current transistor based on the voltage V1st.

The potential of the node N18 is the voltage information (signal voltage) V2nd based on the copy current (Icopy_0).

As described above, the preamplifier 110 supplies the cell current (Icell_0) to the memory cell MC via the first current path formed from the transistors M29, M6, and M7. The preamplifier 110 also supplies the copy current (Icopy_0) to the node N18 via the second current path formed from the transistor M30. The first current path and the second current path are electrically separated.

[Time T3] to [Time T5]

A memory system 1 performs the same operation as that described in the first embodiment.

<2-2-2> Determination Method of Read Operation

A detailed determination method in the determination operation (step S1004) will be described next.

The operation characteristic of the preamplifier 110 will be described with reference to FIG. 25.

Figure 25:
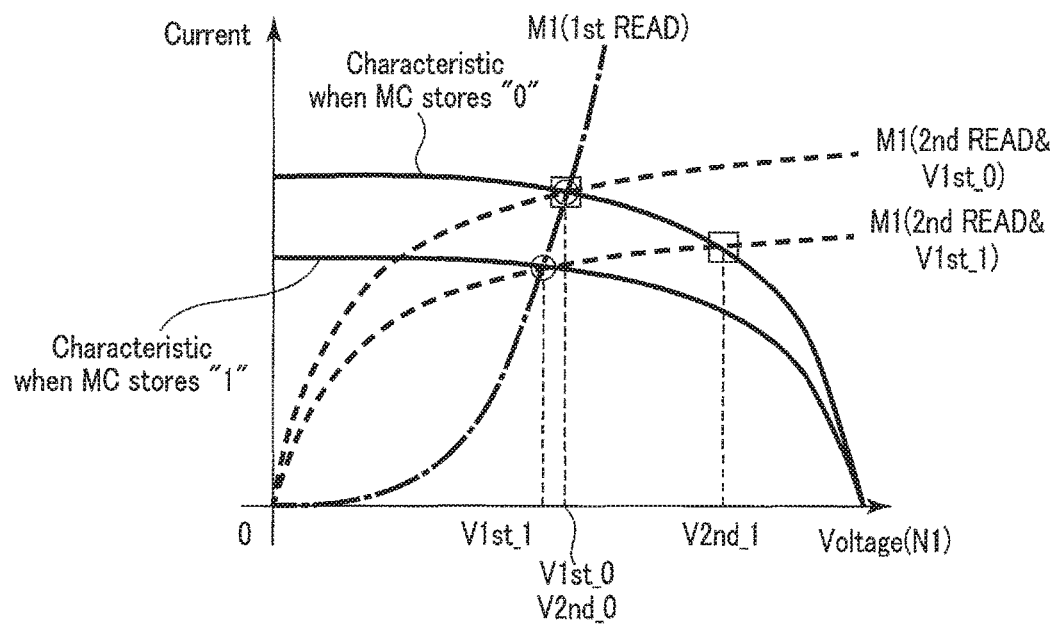
FIG. 25 is a graph showing the relationship between the characteristic of a transistor M1 and the characteristic of a memory cell in the first read and the relationship between the characteristic of the transistor M1 and the characteristic of the memory cell in the second read.

FIG. 25 shows the relationship between the characteristic of a transistor M1 and the characteristic of the memory cell in the first read. FIG. 25 also shows the relationship between the characteristic of the transistor M1 and the characteristic of the memory cell in the second read.

As shown in FIG. 25, when the memory cell stores "1" data, V1st is set to V1st_1 by the first read operation. In the second read operation, if V1st is V1st_1, V2nd is V2nd_1 (V1st_1<V2nd_1).

As shown in FIG. 25, when the memory cell stores "0" data, V1st is set to V1st_0 (V1st_1<V1st_0<V2nd_1) by the first read operation. In the second read operation, if V1st is V1st_0, V2nd is V2nd_0 (V1st_0=V2nd_0).

Figure 26:
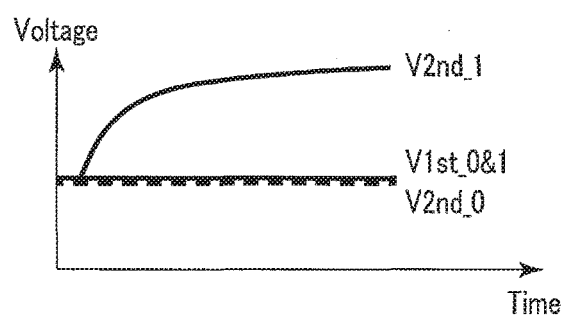
FIG. 26 is a graph showing the relationship of voltages after the second read operation.

FIG. 26 shows the relationship of voltages.

As shown in FIG. 26, V1st_0, V1st_1, and V2nd_0 almost equal.

The operation of the sense amplifier 120 in a case in which the memory cell stores "1" data at the time of the first read operation will be described next with reference to FIG. 27. If the memory cell stores "1" data at the time of the first read operation, V1st is V1st_1, and V2nd is V2nd_1.

As described above, V2nd_1 is higher than V1st_1. For this reason, I2nd (I2nd_1) flowing to the transistor M23 based on V2nd_1 is larger than I1st (I1st_1) flowing to the transistor M20 based on V1st_1.

Additionally, as described above, the sense amplifier 120 compares I1st+Ishift with I2nd. Note that VSHFT is set such that I1st_1+Ishift becomes smaller than I2nd_1.

Figure 27:
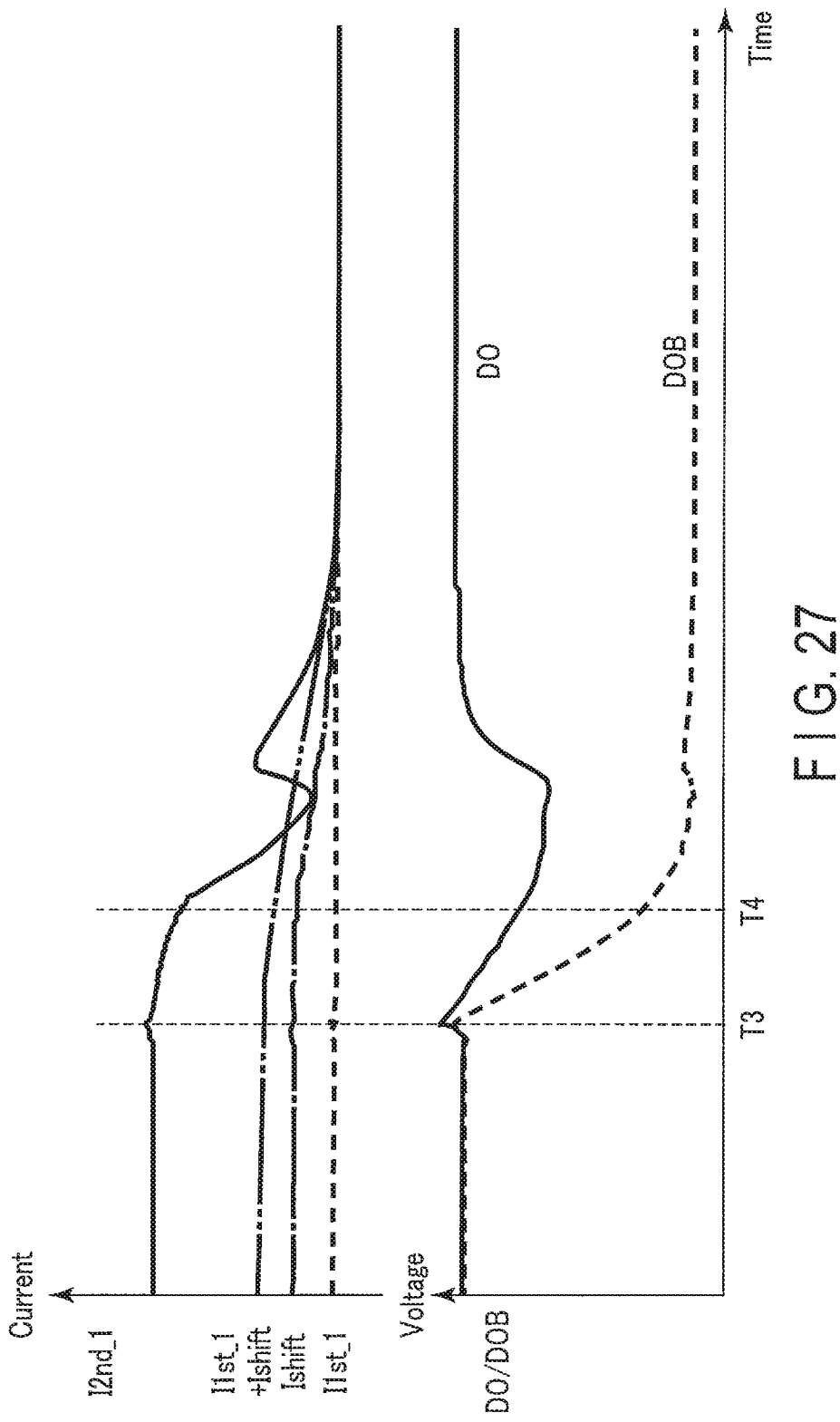
FIG. 27 is a timing chart showing currents and voltages generated in a sense amplifier in a case in which the memory cell stores "1" data at the time of the first read operation.

However, as shown in FIG. 27, I2nd_1 is much larger than I1st_1+Ishift. For this reason, when the determination operation is performed in times T3 to T4 of FIG. 8, a signal DO and a signal DOB can appropriately be generated.

The operation of the sense amplifier 120 in a case in which the memory cell stores "0" data at the time of the first read operation will be described next with reference to FIG. 28. If the memory cell stores "0" data at the time of the first read operation, V1st is V1st_0, and V2nd is V2nd_0.

As described above, V2nd_0 almost equals V1st_0. For this reason, I2nd (I2nd_0) flowing to the transistor M23 based on V2nd_0 almost equals I1st (I1st_0) flowing to the transistor M20 based on V1st_0.

As described above, the sense amplifier 120 compares I1st+Ishift with I2nd. Note that VSHFT is set such that Ishift becomes I2nd_0.

Figure 28:
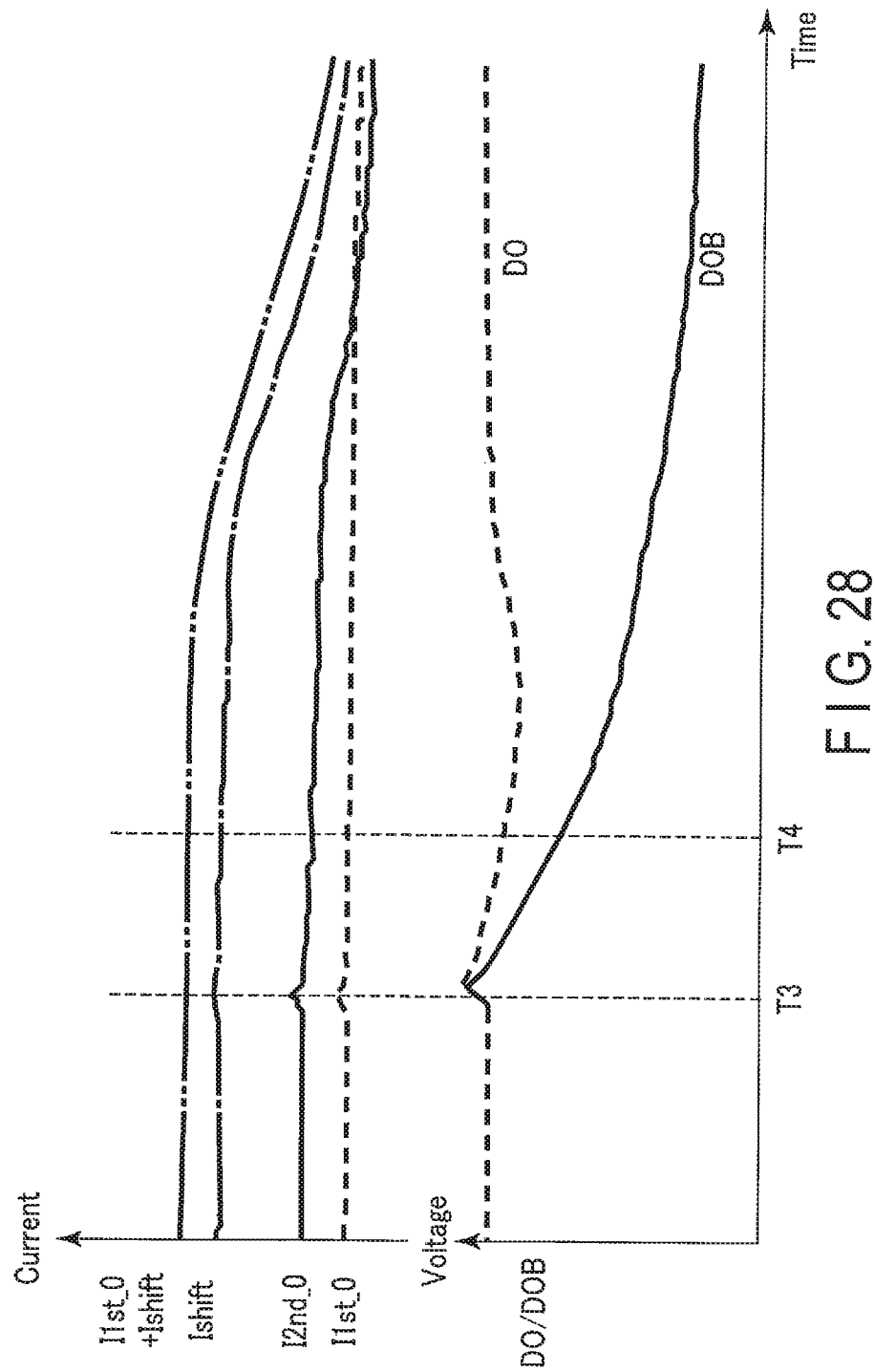
FIG. 28 is a timing chart showing currents and voltages generated in the sense amplifier in a case in which the memory cell stores "0" data at the time of the first read operation.

As shown in FIG. 28, I2nd_0+Ishift is smaller than I1st_0+Ishift. For this reason, when the determination operation is performed in times T3 to T4 of FIG. 8, the signal DO and the signal DOB can appropriately be generated.

<2-3> Effects

According to the above-described, embodiment, in the first read operation and the second read operation, the transistor M29 that charges the bit line (global bit line) is driven as a diode-connection transistor. It is therefore possible to quickly charge the bit line and increase the speed of the read operation.

For easy understanding of the above-described embodiment, a comparative example will be described below. In the comparative example, a case in which a transistor M26 that charges the bit line (global bit line) is driven as a constant current transistor in the second read operation will be described.

Figure 29:
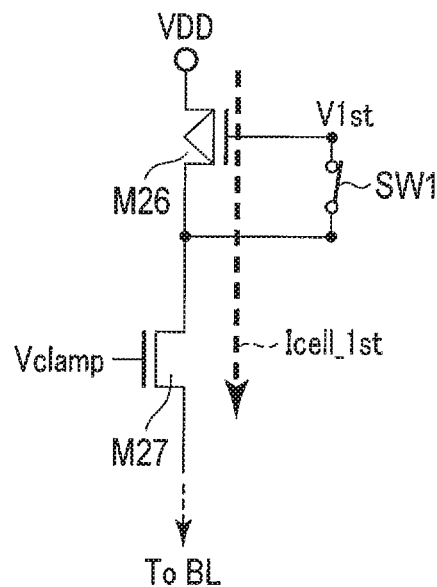
FIG. 29 is a circuit diagram showing the operation of the preamplifier of a memory device according to a comparative example of the second embodiment in the first read operation.

FIG. 29 shows the preamplifier of a memory device according to the comparative example. As shown in FIG. 29, the preamplifier of the memory device according to the comparative example includes a PMOS transistor M26, an NMOS transistor M27, and a switch SW1. The cell current Icell_1st is thus supplied via the transistor M26. As a result, the potential V1st corresponding to the data in the memory cell is stored.

Figure 30:
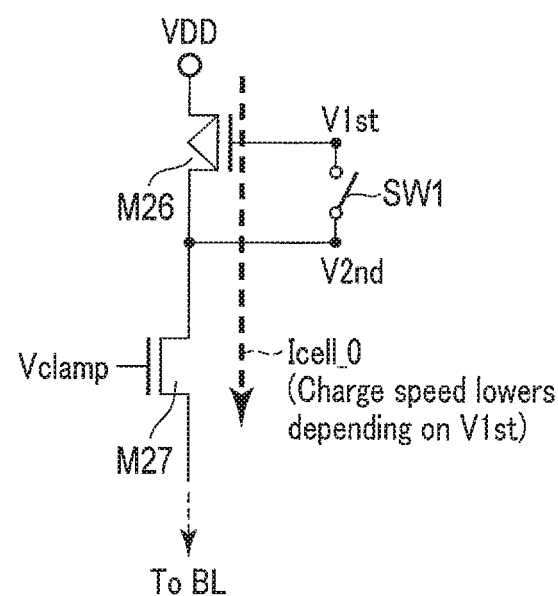
FIG. 30 is a circuit diagram showing the operation of the preamplifier of the memory device according to the comparative example of the second embodiment in the second read operation.

Next, as shown in FIG. 30, at the time of the second read operation, the switch SW1 is turned off. The transistor M26 thus supplies the cell current Icell_0 as a constant current transistor. However, if the read current in the first read operation is small, and V1st is high, the speed of bit line charge decreases. As a result, the time required for the second read operation may increase. If scaling for making the MTJ element small progresses, the read current also needs to be smaller. In the comparative example, this means that the read speed becomes low.

According to the above-described embodiment, the currant path to charge the bit line and the path to generate V1st and V2nd are electrically separated. For this reason, in the current path to charge the bit line, the bit line can be charged using diode connection. Hence, even if the first read result is small, and V1st is large, the preamplifier according to the above-described embodiment can charge the bit line using diode connection independently of the magnitude of V1st.

In addition, when the sense amplifier described in the first embodiment is employed, the effects described in the first embodiment can be obtained.

<3> Third Embodiment

The third embodiment will be described. In the third embodiment, another example of the sense amplifier will be described. Note that the basic arrangement and the basic operation of a memory system according to the third embodiment are the same as those of the memory systems according to the above-described first and second embodiments. Hence, a description of matters explained in the above-described first and second embodiments and matters easily supposable from the above-described first and second embodiments will be omitted.

<3-1> Arrangement of Sense Amplifier

The arrangement of a sense amplifier 120 of a memory device according to the third embodiment will be described next with reference to FIG. 31.

As shown in FIG. 31, the sense amplifier 120 includes CMOS transistors M36, M37, M38, and M41, and NMOS transistors M39, M40, M42, M43, M44, M45, M46, M47, and M48.

A power supply voltage VDD is applied to one terminal of the transistor M36, the other terminal is connected to a node N19, and a signal LATPB is supplied to the gate electrode.

One terminal of the transistor M37 is connected to the node N19, the other terminal is connected to a node N20, and the gate electrode is connected to a node N21.

One terminal of the transistor M38 is connected to the node N19, the other terminal is connected to the node N21, and the gate electrode is connected to the node N20.

One terminal of the transistor M39 is connected to the node N20, the other terminal is connected to a node N22, and the gate electrode is connected to the node N21.

One terminal of the transistor M40 is connected to the node N21, the other terminal is connected to the node N22, and the gate electrode is connected to the node N20.

One terminal of the transistor M41 is connected to the node N20, the other terminal is connected to the node N21, and a signal SENB is supplied to the gate electrode.

One terminal of the transistor M42 is connected to the node N22, a ground voltage VSS is applied to the other terminal, and a signal LATN is supplied to the gate electrode.

One terminal of the transistor M43 is connected to the node N20, the ground voltage VSS is applied to the other terminal, and a signal V1st is supplied to the gate electrode.

One terminal of the transistor M44 is connected to the node N20, the other terminal is connected to a node N23, and a signal SHFTDO is supplied to the gate electrode.

One terminal of the transistor M45 is connected to node N23, the ground voltage VSS is applied to the other terminal, and a signal VSHFT is supplied to the gate electrode.

One terminal of the transistor M46 is connected to the node N21, the ground voltage VSS is applied to the other terminal, and a signal V2nd is supplied to the gate electrode.

One terminal of the transistor M47 is connected to the node N21, the other terminal is connected to a node N24, and a signal SHFTDOB is supplied to the gate electrode.

One terminal of the transistor M48 is connected to the node N24, the ground voltage VSS is applied to the other terminal, and the signal VSHFT is supplied to the gate electrode.

The potential of the node N20 is supplied to an IO circuit 16 as DO.

The potential of the node N21 is supplied to the IO circuit 16 as DOB.

<3-2> Details of Read Operation

Figure 32:
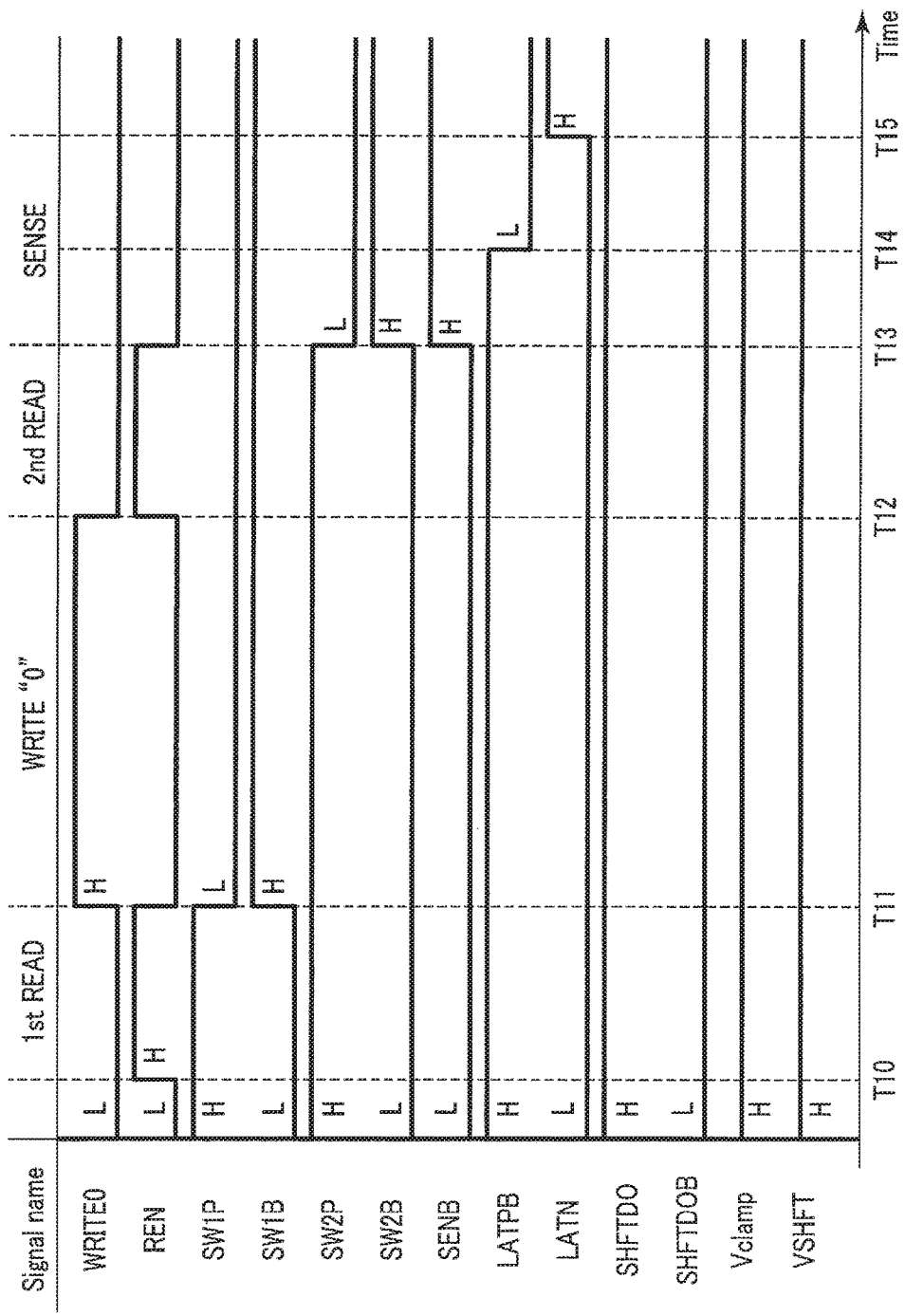
FIG. 32 is a timing chart of the read operation of a memory system according to the third embodiment.

Details of the read operation of the memory system according to the third embodiment will be described with reference to the timing chart of FIG. 32. Note that as a preamplifier 110, either the preamplifier described in the first embodiment or the preamplifier described in the second embodiment can be applied. For example, a case in which the preamplifier described in the first embodiment is applied will be described here.

[Time T10] to [Time T13]

Figure 8:
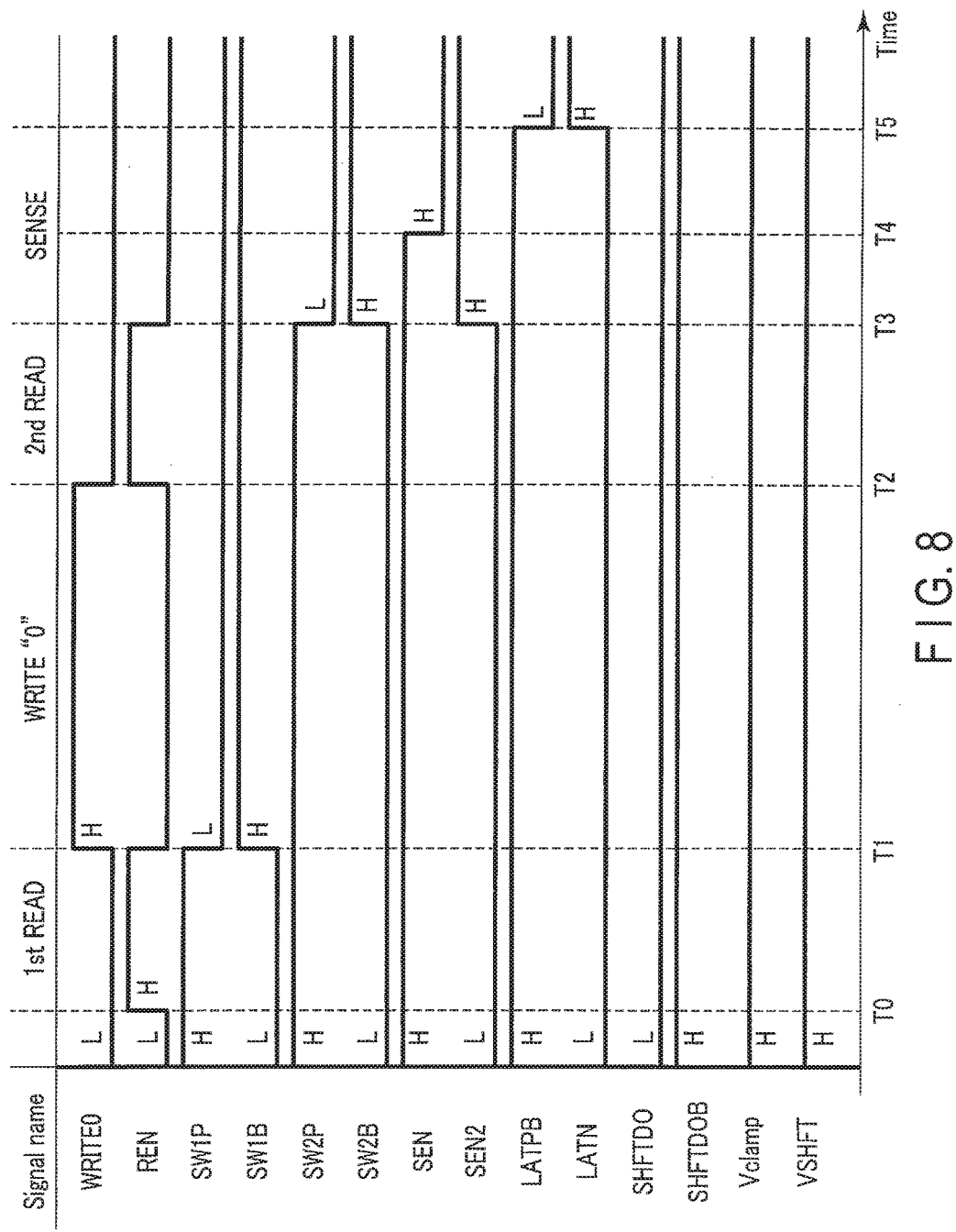
FIG. 8 is a timing chart of the read operation of the memory system according to the first embodiment.

A memory device 10 performs the same operation as in the times T0 to T3 described in the first embodiment with reference to FIG. 8.

[Time T13] to [Time T15]

In the determination operation (step S1004), a controller 17 lowers a signal REN and a signal SW2P to "L" level, and raises a signal SW2B and the signal SENB to "H" level. The controller 17 also sets the signal SHFTDO, the signal VSHFT, and the signal LATPB to "H" level, and sets the signal SHFTDOB and the signal LATN to "L" level.

Accordingly, transistors M4 and M5 of the preamplifier 110 change to the OFF (nonconductive) state. A node N3 thus stores the voltage information (signal voltage) V2nd.

Figure 33:
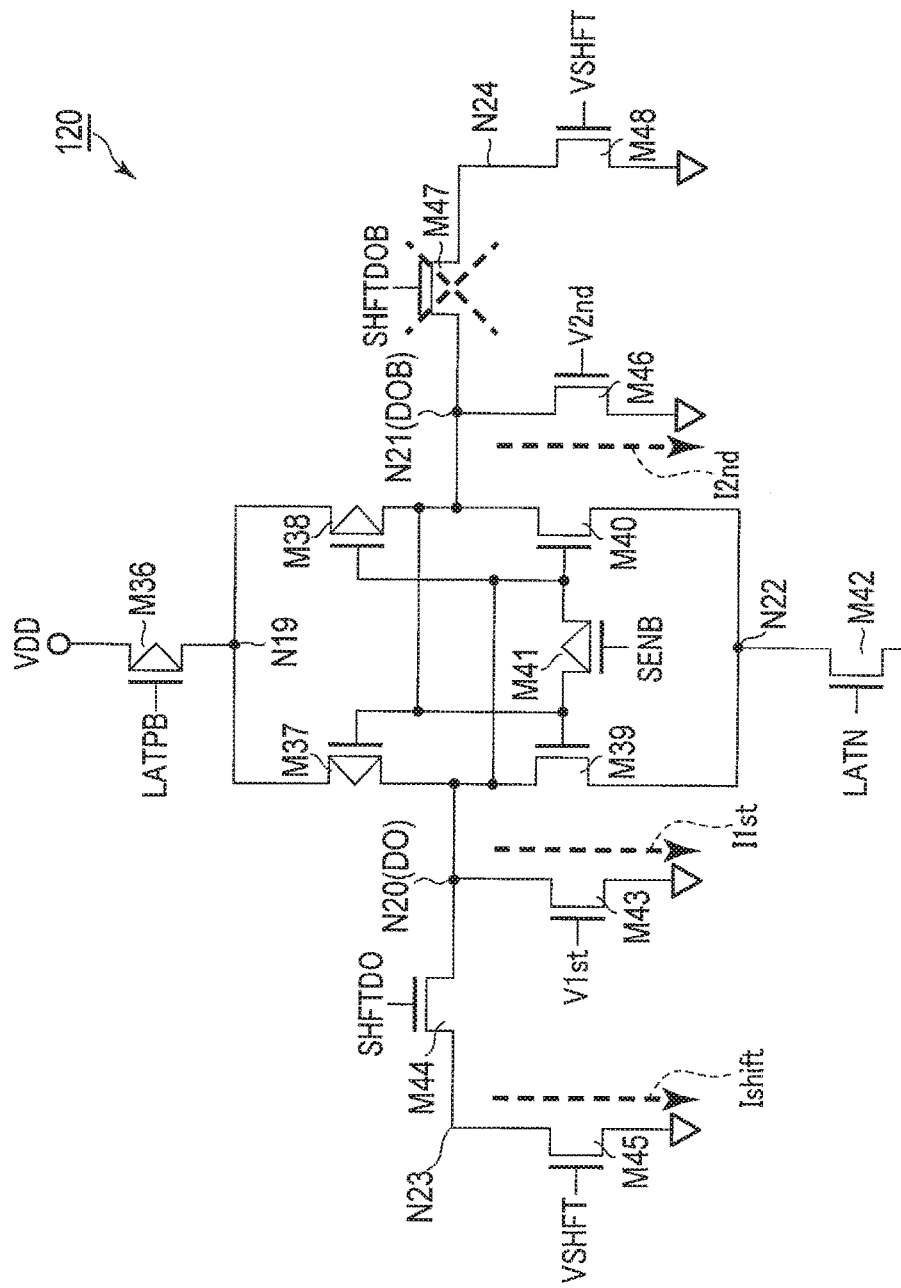
FIG. 33 is a circuit diagram showing the operation of the sense amplifier of the memory device according to the third embodiment in a determination operation.

As shown in FIG. 33, in the sense amplifier 120, the transistors M43, M44, M45, and M46 are turned on. The transistor M47 is turned off.

Accordingly, the transistor M43 supplies a current I1st corresponding to V1st, and the transistor M45 supplies a shift current Ishift corresponding to VSHFT. That is, the potential of the node N20 is decided based on the current I1st and the shift current Ishift.

In addition, the transistor M46 supplies a current I2nd corresponding to V2nd. That is, the potential of the node N21 is decided based on the current I2nd.

At the time T14 at which a sufficient difference is generated between the potential of the node N20 and the potential of the node N21, the controller 17 lowers the signal LATPB to "L" level.

Accordingly, the sense amplifier 120 determines the signal DO and the signal DOB.

[Time T15]

When the determination operation (step S1004) ends, the controller 17 raises the signal LATN to "H" level. The transistor M42 of the sense amplifier 120 is thus turned on. Accordingly, the potential difference between the signal DO and the signal DOB is widened to the difference between "H" level and "L" level.

Note that in the above-described embodiment, the operation of writing "0" to the memory cell as the target of the first read operation by the memory device 10 in step S1002 has been described. However, the memory device 10 may write "1" to the memory cell as the target of the first read operation in step S1002. That is, "1" may be the standard state.

Figure 34:
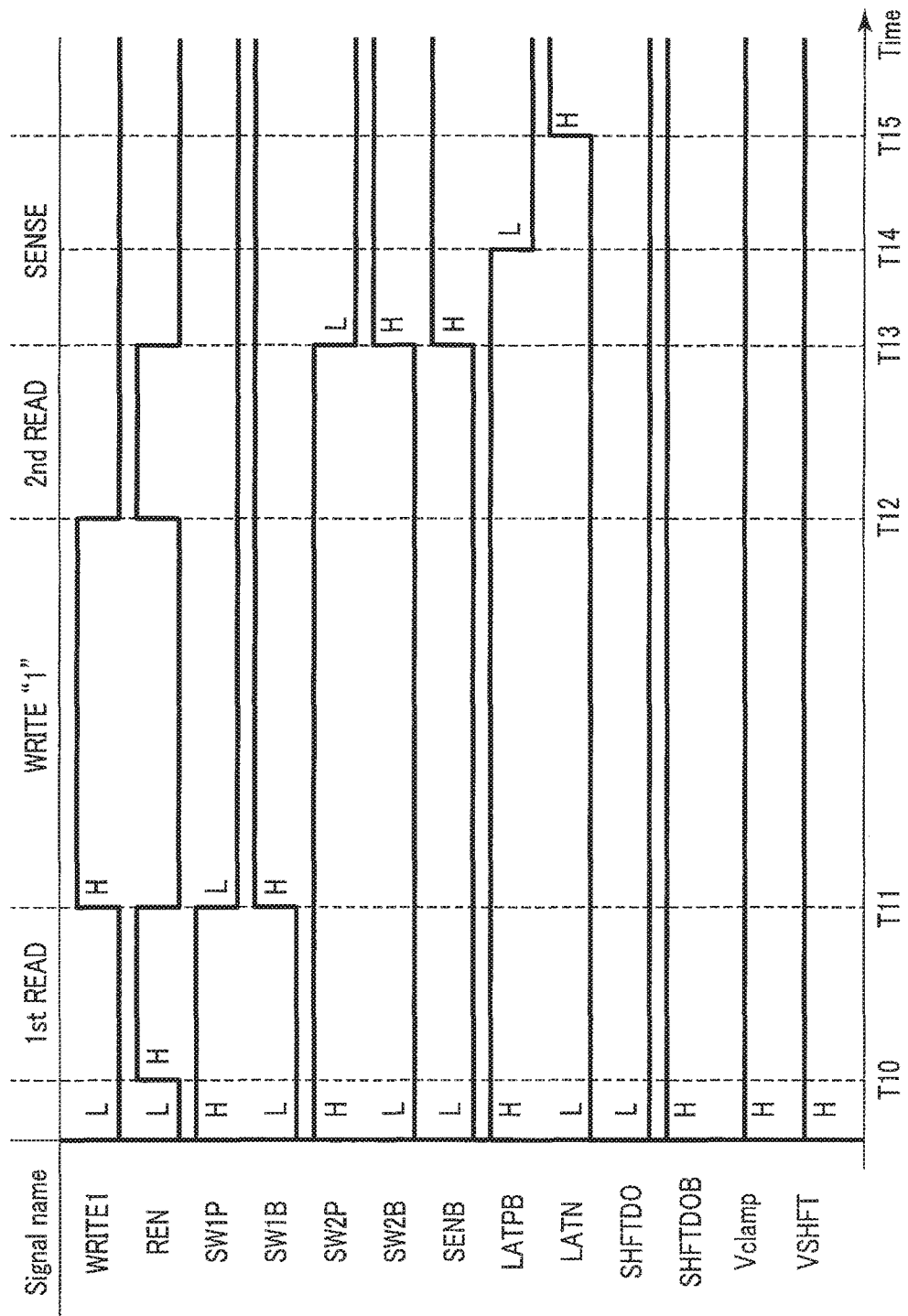
FIG. 34 is a timing chart of the read operation of the memory system according to the third embodiment.
Figure 35:
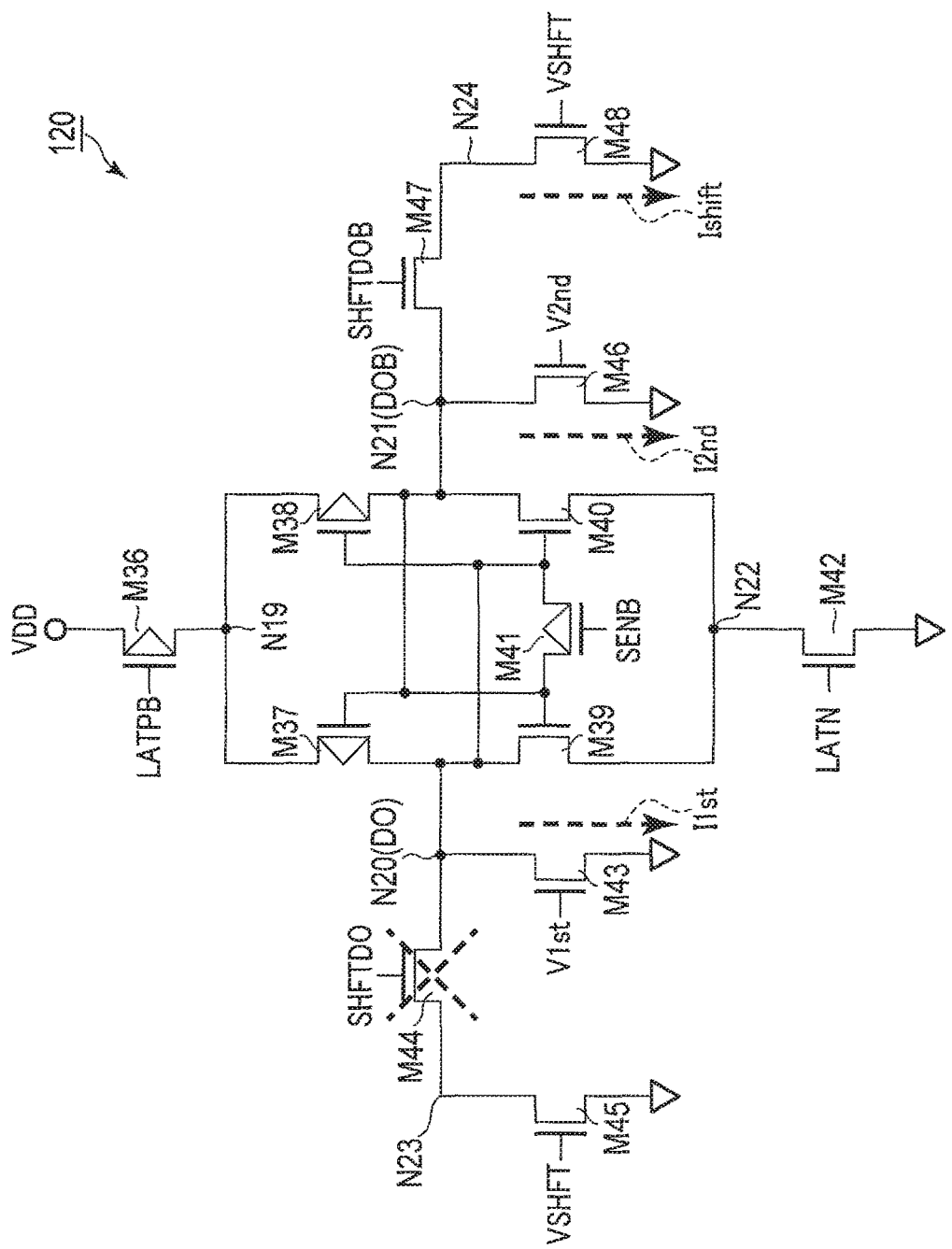
FIG. 35 is a circuit diagram showing the operation of the sense amplifier of the memory device according to the third embodiment in a determination operation.

Note that when writing "1" in step S1002, the controller 17 sets the signal SHFTDO to "L" level, and sets the signal SHFTDOB to "H" level in the read operation (see FIG. 34). Accordingly, I2nd+Ishift is supplied to the node N21, and I1st is supplied to the node N20 in the determination operation (step S1004) (see FIG. 35). The determination operation can thus be performed.

<3-3> Effects

As described above, if a circuit that generates an offset current by a sense amplifier is used, the same effects as described in the first embodiment can be obtained.

When the preamplifier described in the second embodiment is applied, the effects described in the second embodiment can also be obtained.

<4> Fourth Embodiment

The fourth embodiment will be described. In the sense circuit 100 according to each of the above-described first to third embodiments, not the preamplifier 110 but the sense amplifier 120 generates the shift current Ishift at the time of the determination operation. That is, in the first to third embodiments, shift control is done not by the preamplifier 110 but by the sense amplifier 120. In the fourth embodiment, however, an example in which shift control is done not by a sense amplifier 120 but by a preamplifier 110 will be described. Note that the basic arrangement and the basic operation of a memory system according to the fourth embodiment are the same as those of the memory system according to the above-described first embodiment. Hence, a description of matters explained in the above-described first embodiment and matters easily supposable from the above-described first embodiment will be omitted.

<4-1> Arrangement

<4-1-1> Arrangement of Preamplifier

The arrangement of the preamplifier 110 of a memory device according to the fourth embodiment will be described with reference to FIG. 36.

The preamplifier 110 includes a shift circuit 111. More specifically, as shown in FIG. 36, the shift circuit 111 includes PMOS transistors M49 and M51, NMOS transistors M50 and M52, and a capacitor C5.

One terminal of the transistor M49 is connected to a node N3, the other terminal is connected to a node N25, and a signal SW3B is supplied to the gate electrode.

One terminal of the transistor M50 is connected to the node N3, the other terminal is connected to the node N25, and a signal SW3P is supplied to the gate electrode.

The transistor M49 and the transistor M50 function as one switch.

One terminal of the transistor M51 is connected to the node N25, the other terminal is connected to a node N26, and a signal SW4B is supplied to the gate electrode.

One terminal of the transistor M52 is connected to the node N25, the other terminal is connected to the node N26, and a signal SW3P is supplied to the gate electrode.

The transistor M51 and the transistor M52 function as one switch.

A voltage VSHFTG is applied, to the node N26.

One terminal of the capacitor C5 is connected to the node N25, and a ground voltage VSS is applied to the other terminal.

The operation of the preamplifier 110 will be described later.

<4-1-2> Arrangement of Sense Amplifier

The arrangement of the sense amplifier 120 of a memory device according to the fourth embodiment will be described next with reference to FIG. 37.

As described above, in the fourth embodiment, shift control is done not by the sense amplifier 120 but by the preamplifier 110. For this reason, in the fourth embodiment, the circuits for shift control which are provided in the sense amplifier 120 of the memory device according to the first embodiment are unnecessary. As a detailed arrangement, as shown in FIG. 37, the sense amplifier 120 of the memory device according to the fourth embodiment has an arrangement formed by removing the NMOS transistors M21, M22, M24, and M25 from the sense amplifier 120 (see FIG. 6) of the memory device according to the first embodiment.

The operation of the sense amplifier 120 will be described later.

<4-2> Operation

<4-2-1> Outline of Read Operation

The outline of the read operation of the memory system according to the fourth embodiment will be described with reference to FIG. 38.

[Step S2001]

In step S2001, a memory device 10 performs the same operation as in step S1001 described with reference to FIG. 7.

[Step S2002]

In step S2002, the memory device 10 performs the same operation as in step S1002 described with reference to FIG. 7.

[Step S2003]

The memory device 10 performs a second read operation for a memory cell that is the target of a first read operation. The preamplifier 110 generates voltage information (signal voltage) V2ndb by the second read operation.

[Step S2004]

The preamplifier 110 shifts the voltage information (signal voltage) V2ndb generated in step S2003, thereby generating voltage information (signal voltage) V2nd.

[Step S2005]

Based on V2nd generated in step S2004, the sense amplifier 120 determines the result of V1st generated in step S2001.

<4-2-2> Details of Read Operation

Details of the read operation of the memory system according to the fourth embodiment will be described with reference to the timing chart of FIG. 39.

[Time T16] to [Time T17]

In the first read operation (step S2001), a controller 17 sets a signal REN, a signal SW1P, a signal SW2P, the signal SW3B, the signal SW4P, and a signal Vclamp to "H" level, and sets a signal SW1B, a signal SW2B, the signal SW3P, and the signal SW4B to "L" level.

Accordingly, as shown in FIG. 40, transistors M2, M3, M4, M5, M6, M7, M51, and M52 are turned on. The transistors M49 and M50 are turned off. The potential of a node N2 thus lowers, and a transistor M1 is turned on.

In the ON state, the transistor M1 supplies a cell current (Icell_1st) to a memory cell MC. Since the transistors M2 and M3 are ON, the transistor M1 is driven as a diode-connection transistor.

The potential of the node N2 is the voltage information (signal voltage) V1st based on the cell current (Icell_1st).

In addition, the node N25 is charged to a voltage VSHFTGC via the node N26 and the transistors M51 and M52.

In this way, the preamplifier 110 performs the charge operation of the shift circuit 111 in parallel to the first read operation.

[Time T17] to [Time T18]

Referring back to FIG. 39, the subsequent operation waveform will be described. In the "0" write operation (step S2002), the controller 17 lowers the signal REN and the signal SW1P to "L" level, and raises a signal WRITE0 and the signal SW1B to "H" level.

Accordingly, "0" data is written to the memory cell by a write driver (not shown).

Figure 41:
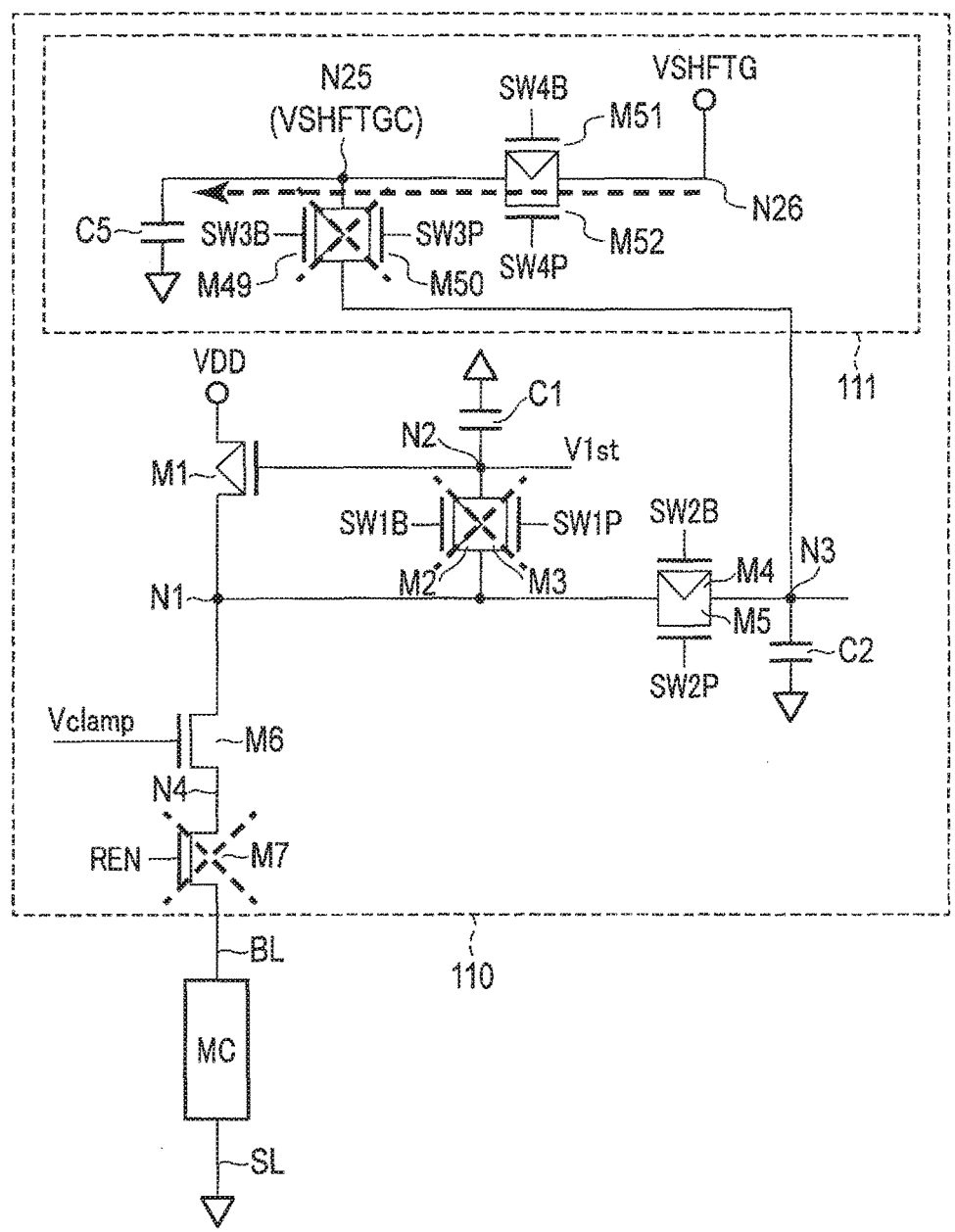
FIG. 41 is a circuit diagram showing the operation of the preamplifier of the memory device according to the fourth embodiment in a 0 write operation.

As shown in FIG. 41, the transistors M2, M3, and M7 of the preamplifier 110 are turned off. The node N2 thus stores the voltage information (signal voltage) V1st.

In addition, the node N25 is charged to the voltage VSHFTGC via the node N26 and the transistors M51 and M52. In this way, the preamplifier 110 performs the charge operation of the shift circuit 111 in parallel to the "0" write operation.

[Time T18] to [Time T19]

Referring back to FIG. 39, the subsequent operation waveform will be described. In the second read operation (step S2003), the controller 17 raises the signal REN to "H" level, and lowers the signal WRITE0 to "L" level.

Accordingly, as shown in FIG. 42, the transistors M4, M5, M6, and M7 are turned on. In addition, the transistor M1 is turned on based in V1st.

The potential of the node N3 is the voltage information (signal voltage) V2ndb based on a cell current (Icell_0).

In addition, the node N25 is charged to the voltage VSHFTGC via the node N26 and the transistors M51 and M52. In this way, the preamplifier 110 performs the charge operation of the shift circuit 111 in parallel to the second read operation.

[Time T19] to [Time T20]

Referring back to FIG. 39, the subsequent operation waveform will be described. In the shift operation (step S2004), the controller 17 raises the signals SW2B, SW3P, and SW4B to "H" level, and lowers the signals REN, SW2P, SW3B, and SW4P "L" level.

Figure 43:
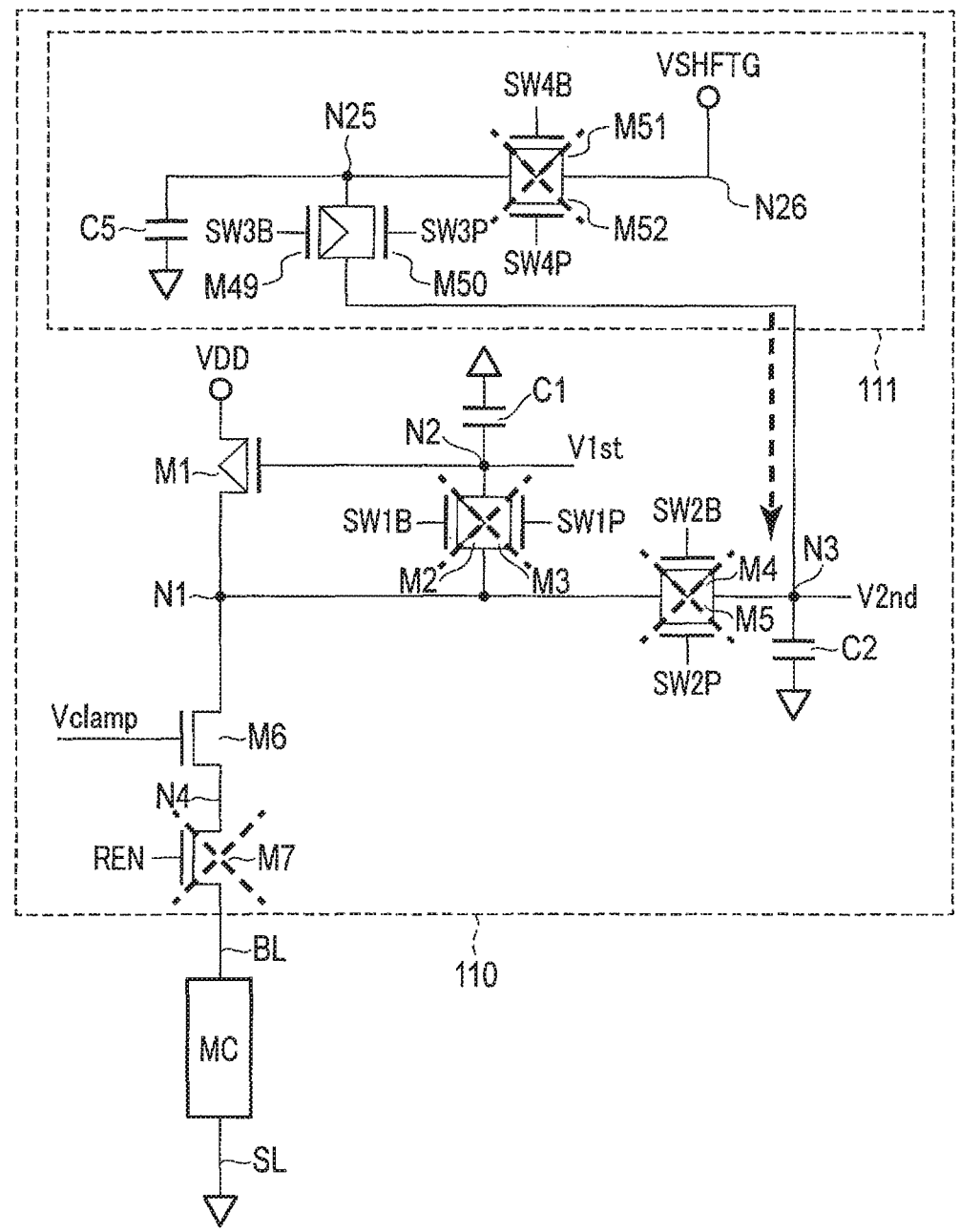
FIG. 43 is a circuit diagram showing the operation of the preamplifier of the memory device according to the fourth embodiment in a voltage information V2nd generation operation.

Accordingly, as shown in FIG. 43, the transistors M49 and M50 are turned on, and the transistors M7, M4, M5, M7, M51, and M52 are turned off. For this reason, the voltage VSHFTGC stored in the node N25 is shared by the node N3. This operation will also be referred to as charge share or the like.

For this reason, as shown in FIG. 44, charge share is performed for the voltage information (signal voltage) V2ndb, the voltage information (signal voltage) V2ndb is shifted (boosted) in the positive direction, and the voltage information (signal voltage) V2nd (V2nd_0, V2nd_1) is generated. The node N3 thus stores the voltage information (signal voltage) V2nd.

The voltage information (signal voltage) V2nd (V2nd_0, V2nd_1) is generated based on VSHFTG. Hence, VSHFTG is set such that the voltage information (signal voltage) V1st is set between: the pieces of voltage information (signal voltages) V2nd_0 and V2nd_1.

[Time T20] to [Time T22]

Referring back to FIG. 39, the subsequent operation waveform will be described. In the determination operation (step S2005), the controller 17 raises a signal SEN2 to "H" level. The controller 17 also sets a signal VSHFT and a signal LATPB to "H" level, and sets a signal LATN and a signal SEN to "L" level.

Transistors M11, M12, M13, M14, M15, M17, M18, M20, and M23 in the sense amplifier 120 are turned on.

Accordingly, the transistor M20 supplies a current I1st corresponding to V1st, and the transistor M23 supplies a current I2nd corresponding to V2nd.

When the controller 17 sets the signal SEN to "H" level at the time T21, the transistors M12 and M13 are turned off, and the current supply from the transistors M12 and M13 is cut off. Accordingly, the potential of a node N6 is decided based on the current I1st. The potential of a node N7 is decided based on the current I2nd. Hence, a voltage difference is generated between the node N6 and the node N7. The voltage difference is widened immediately by the positive feedback of the transistors M9, M10, M14, and M17.

The sense amplifier 120 thus determines a signal DO and a signal DOB.

[Time T22]

Referring back to FIG. 39, the subsequent operation waveform will be described. When the determination operation (step S2005) ends, the controller 17 lowers the signal LATPB to "L" level, and raises the signal LATN to "H" level. The transistors M8, M16, and M19 of the sense amplifier 120 are thus turned on. Accordingly, the potential difference between the signal DO and the signal DOB is widened to the difference between "H" level and "L" level.

Figure 38:
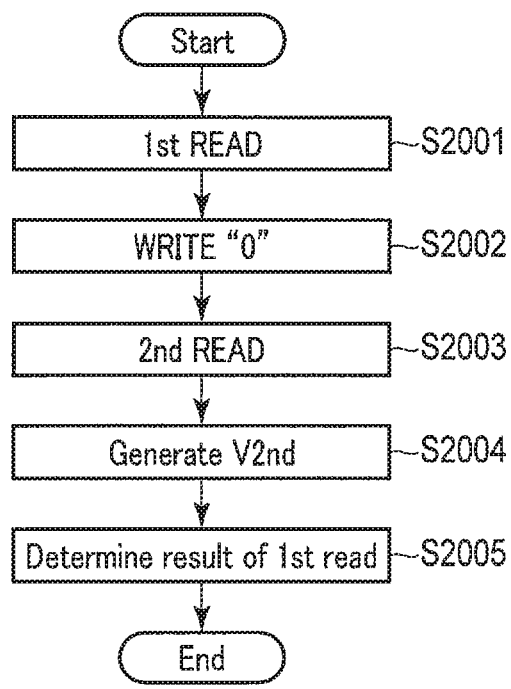
FIG. 38 is a flowchart showing the read operation of the memory system including the memory device according to the fourth embodiment.

Note that in this embodiment, the operation of writing "0" to the memory cell as the target of the first read operation by the memory device 10 in step S2002 of FIG. 38 has been described. However, the memory device 10 may write "1" to the memory cell as the target of the first read operation in step S2002. That is, "1" may be the standard state. When writing "1" in step S2002 of FIG. 38, the controller 17 sets a signal WRITE1 to "H" level (see FIG. 45).

<4-3> Effects

According to the above-described embodiment, the preamplifier generates the voltage V2nd by charge share. It is therefore possible to reduce the influence of power supply noise or a PVT (Process, Voltage, and Temperature) variation and improve the read margin.

As described in the first embodiment with reference to FIGS. 18, 19, 20, and 21, in the comparative example, when generating V2nd using V1st obtained by the first read operation, the shift current Ishift is supplied to the bit line, thereby adjusting V2nd. However, as the memory cell size is reduced, the read current becomes small, and the current difference between Icell_0 and Icell_1 narrows, high accuracy is required to adjust the shift current Ishift. That is, along with the decrease in the read current, the influence of power supply noise or PVT variation becomes large, and control of the shift current becomes difficult. In addition, V2nd is amplified from V1st, the read current, and the shift current and thus generated. For this reason, the control voltage noise of the shift current may be amplified to affect V2nd. The comparative example assumes that "0" is set as the standard state in the write operation after the first read operation. In the arrangement of the comparative example, "1" cannot be set as the standard state in the write operation after the first read operation.

As described above, the preamplifier according to the comparative example needs to do accurate shift control and control the noise of a power supply voltage VDD. Additionally, in the preamplifier according to the comparative example, the standard state cannot be selected.

However, as described above, the preamplifier 110 according to this embodiment generates V2nd using the voltage stored in advance. The voltage stored in advance is insensitive to the noise of the voltage VDD. For this reason, the influence of the noise of the power supply voltage VDD is small and need not be taken into consideration, unlike the comparative example.

In addition, as described above, the preamplifier 110 according to this embodiment can appropriately generate the shift current even if the standard state is changed. As a result, the standard state can be selected flexibly.

As described above, according to the above-described embodiment, it is possible to provide a memory device capable of performing a high-quality read operation by easy control.

<5> Fifth Embodiment

The fifth embodiment will be described.

In the fifth embodiment, shift control is done not by a sense amplifier 120 but by a preamplifier 110, as in the fourth embodiment in the fifth embodiment, another example of the preamplifier will be described. Note that the basic arrangement and the basic operation of a memory system according to the fifth embodiment are the same as those of the memory systems according to the above-described first and fourth embodiments. Hence, a description of matters explained in the above-described first and fourth embodiments and matters easily supposable from the above-described first and fourth embodiments will be omitted.

<5-1> Arrangement of Preamplifier

The arrangement of the preamplifier 110 of a memory device according to the fifth embodiment will be described with reference to FIG. 46.

The preamplifier 110 includes a shift circuit 112. More specifically, as shown in FIG. 46, the shift circuit 112 includes PMOS transistors M53 and M55, and NMOS transistors M54 and M56.

One terminal of the transistor M53 is connected to a node N27, the other terminal is connected to a node N28, and a signal SW3B is supplied to the gate electrode.

One terminal of the transistor M54 is connected to the node N27, the other terminal is connected to the node N28, and a signal SW3P is supplied to the gate electrode.

The transistor M53 and the transistor M54 function as one switch.

The node N27 is connected to the other terminal of a capacitor C1, and the node N28 is grounded.

One terminal of the transistor M55 is connected to the node N27, the other terminal is connected to a node N29, and a signal SW4B is supplied to the gate electrode.

One terminal of the transistor M56 is connected to the node N27, the other terminal is connected to the node N29, and a signal SW4P is supplied to the gate electrode.

The transistor M55 and the transistor M56 function as one switch.

A voltage VSHFTG is applied to the node N29.

The operation of the preamplifier 110 will be described later.

<5-2> Operation

<5-2-1> Outline of Read Operation

The outline of the read operation of the memory system according to the fifth embodiment will be described with reference to FIG. 47.

[Step S3001]

Upon receiving a read instruction from a host 2, a memory controller 20 issues an active command and a read command to a memory device 10.

The memory device 10 receives the active command and the read command from the memory controller 20, and performs a first read operation for a read target memory cell.

By the first read operation, the preamplifier 110 stores the resistance state of the read target memory cell as voltage information (signal voltage) V1stb. The voltage information (signal voltage) V1stb is thus generated.

[Step S3002]

In step S3002, the memory device 10 performs the same operation as in step S1002 described with reference to FIG. 7.

[Step S3003]

In step S3003, the memory device 10 performs the same operation as in step S1003 described with reference to FIG. 7.

[Step S3004]

The preamplifier 110 shifts the voltage information (signal voltage) V1stb stored in step S3001, thereby generating voltage information (signal voltage) V1st.

[Step S3005]

Based on V2nd generated in step S3003, the sense amplifier 120 determines the result of V1st generated in step S3004.

<5-2-2> Details of Read Operation

Details of the read operation of the memory system according to the fifth embodiment will be described with reference to the timing chart of FIG. 39.

[Time T16] to [Time T17]

In the first read operation (step S3001), a controller 17 sets a signal REN, a signal SW1P, a signal SW2P, the signal SW3B, the signal SW4P, and a signal Vclamp to "H" level, and sets a signal SW1B, a signal SW2B, the signal SW3P, and the signal SW4B to "L" level.

Figure 48:
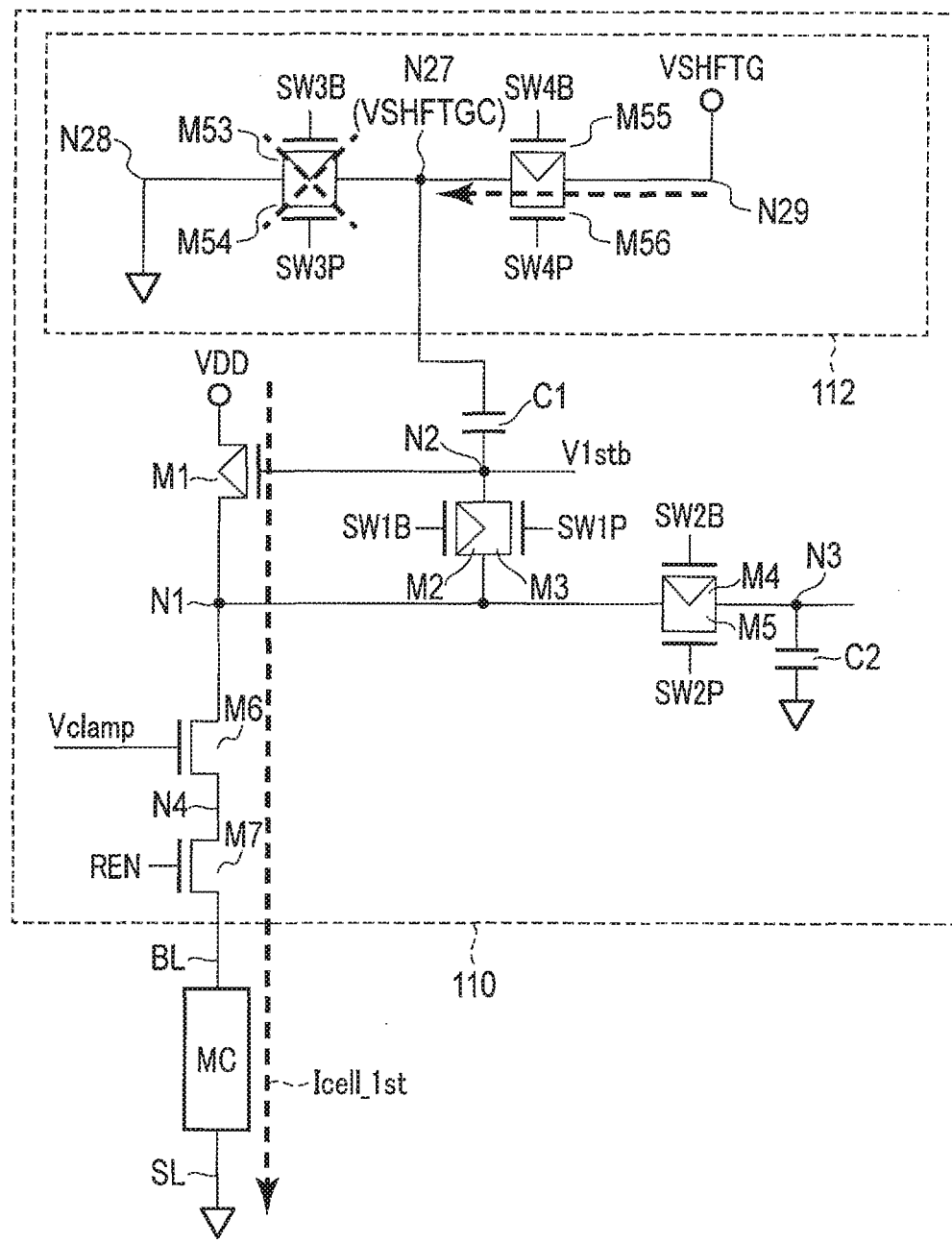
FIG. 48 is a circuit diagram showing the operation of the preamplifier of the memory device according to the fifth embodiment in a first read operation.

Accordingly, as shown in FIG. 48, transistors M2, M3, M4, M5, M6, M7, M55, and M56 are turned on. The transistors M53 and M54 are turned off. The potential of a node N2 thus lowers, and a transistor M1 is turned on.

In the ON state, the transistor M1 supplies a cell current (Icell_1st) to a memory cell MC.

In addition, the node N27 is charged to a voltage VSHFTGC via the node N29 and the transistors M55 and M56. In this way, the preamplifier 110 performs the charge operation of the shift circuit 112 in parallel to the first read operation.

The potential of the node N2 is the voltage information (signal voltage) V1stb based on the cell current (Icell_1st) and the voltage VSHFTGC.

[Time T17] to [Time T18]

Referring back to FIG. 39, the subsequent operation waveform will be described. In the "0" write operation (step S3002), the controller 17 lowers the signal REN and the signal SW1P to "L" level, and raises a signal WRITE0 and the signal SW1B to "H" level.

Accordingly, "0" data is written to the memory cell by a write driver (not show).

As shown in FIG. 49, the transistors M2, M3, and M7 of the preamplifier 110 are turned off. The node N2 thus stores the voltage information (signal voltage) V1st.

[Time T18] to [Time T19]

Referring back to FIG. 39, the subsequent operation waveform will be described. In the second read operation. (step S3003), the controller 17 raises the signal REN to "H" level, and lowers the signal WRITE0 to "L" level.

Accordingly, as shown in FIG. 50, the transistors M4, M5, M6, and M7 are turned on. In addition, the transistor M1 is turned on based in V1st.

The potential of the node N3 is the voltage information (signal voltage) V2nd based on a cell current (Icell_0).

[Time T19] to [Time T20]

Referring back to FIG. 39, the subsequent operation waveform will be described. In the shift operation (step S3004), the controller 17 raises the signals SW2B, SW3P, and SW4B to "H" level, and lowers the signals REN, SW2P, SW3B, and SW4P to "L" level.

Accordingly, as shown in FIG. 51, the transistors M53 and M54 are turned on, and the transistors M4, M5, M7, M55, and M56 are turned off. For this reason, the voltage stored in the node N27 is released.

Figure 52:
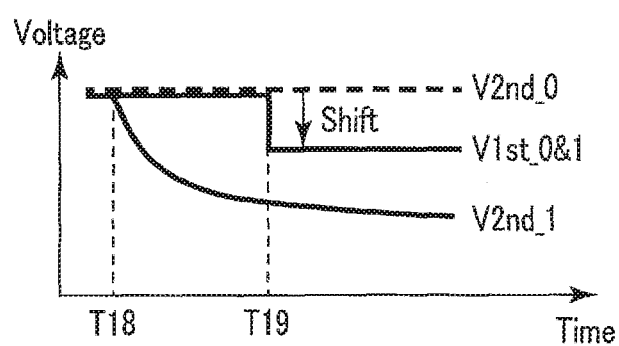
FIG. 52 is a graph showing the relationship of voltages after the voltage information V1st generation operation.

For this reason, as shown in FIG. 52, charge share is performed for the voltage information (signal voltage) V1stb, the voltage information (signal voltage) V1stb is shifted (stepped down) in the negative direction, and the voltage information (signal voltage) V1st (V1st_0, V1st_1) is generated. The node N2 thus stores the voltage information (signal voltage) V1st.

The voltage information (signal voltage) V1st (V1st_0, V1st_1) is generated based on VSHFTG. Hence, VSHFTG is set such that the voltage information (signal voltage) V1st is set between the pieces of voltage information (signal voltages) V2nd_0 and V2nd_1.

From [Time T20]

In the determination operation (step S3005), the memory device 10 performs the same operation as the operation from the time T20 in the fourth embodiment.

Note that that in this embodiment, the operation of writing "0" to the memory cell as the target of the first read operation by the memory device 10 in step S3002 of FIG. 47 has been described. However, the memory device 10 may write "1" to the memory cell as the target of the first read operation in step S3002. That is, "1" may be the standard state. When writing "1" in step S3002 of FIG. 47, the controller 17 sets a signal WRITE1 to "H" level (see FIG. 45).

<5-3> Effects

As described above, if the preamplifier is a circuit that generates V1st by charge share, the same effects as described in the fourth embodiment can be obtained.

<6> Sixth Embodiment

The sixth embodiment will be described. In the sixth embodiment, shift control is done not by a sense amplifier 120 but by a preamplifier 110, as in the fourth embodiment. In the sixth embodiment, a case in which a current mirror is employed in a preamplifier will be described. Note that the basic arrangement and the basic operation of a memory system according to the sixth embodiment are the same as those of the memory systems according to the above-described first, second, and fourth embodiments. Hence, a description of matters explained in the above-described first, second, and fourth embodiments and matters easily supposable from the above-described first, second, and fourth embodiments will be omitted.

<6-1> Arrangement of Preamplifier

Figure 53:
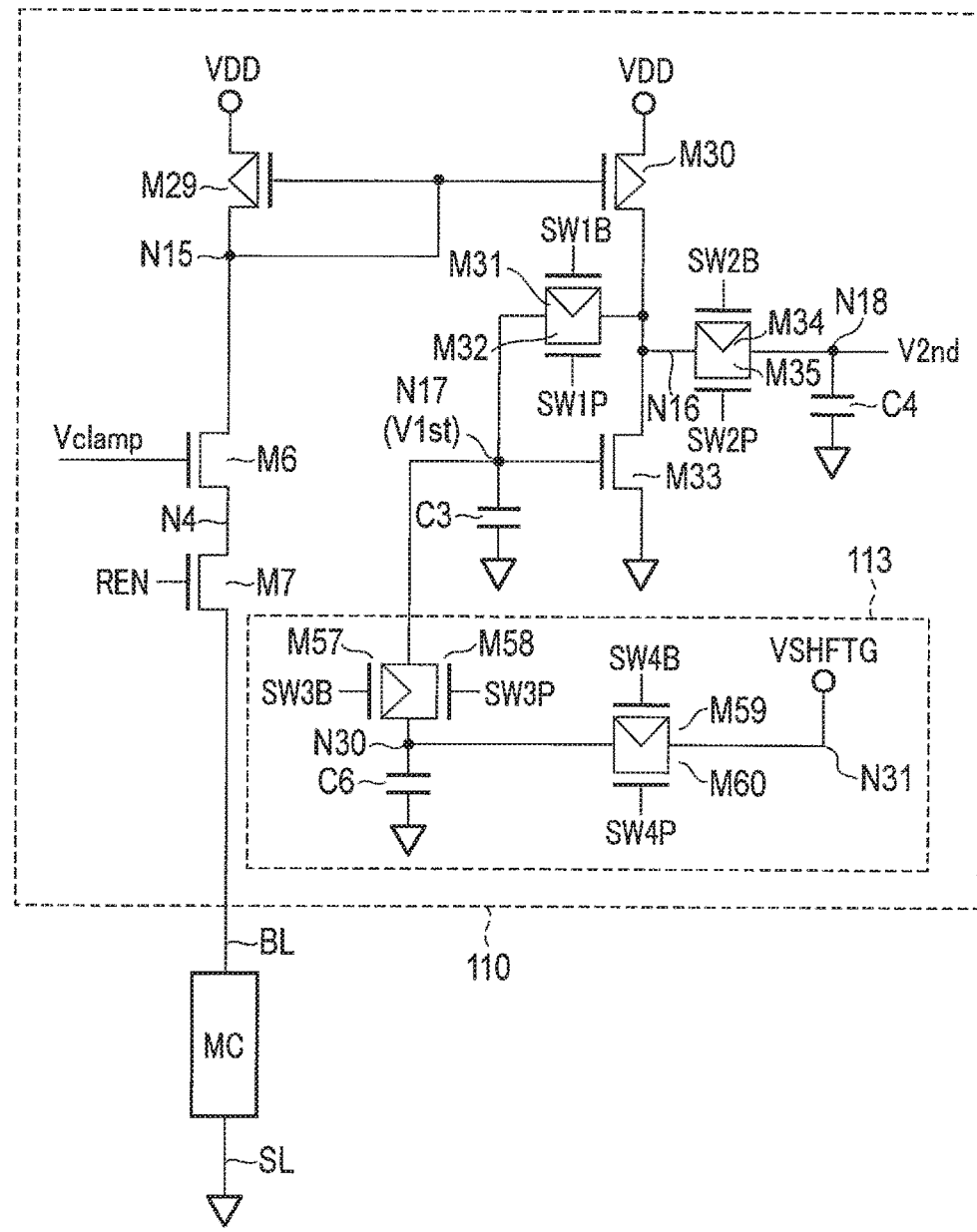
FIG. 53 is a circuit diagram showing the preamplifier of a memory device according to the sixth embodiment.

The arrangement of the preamplifier 110 of a memory device according to the sixth embodiment will be described next with reference to FIG. 53.

The preamplifier 110 includes a shift circuit 113. More specifically, as shown in FIG. 53, the shift circuit 113 includes PMOS transistors M57 and M59, NMOS transistors M58 and M60, and a capacitor C6.

One terminal of the transistor M57 is connected to a node N17, the other terminal is connected to a node N30, and a signal SW3B is supplied to the gate electrode.

One terminal of the transistor M58 is connected to the node N17, the other terminal is connected to the node N30, and a signal SW3P is supplied to the gate electrode.

The transistor M57 and the transistor M58 function as one switch.

One terminal of the transistor M59 is connected to the node N30, the other terminal is connected to a node N31, and a signal SW4B is supplied to the gate electrode.

One terminal of the transistor M60 is connected to the node N30, the other terminal is connected to the node N31, and a signal SW4P is supplied to the gate electrode.

The transistor M59 and the transistor M60 function as one switch.

A voltage VSHFTG is applied to the node N31.

One terminal of the capacitor C6 is connected to the node N30, and a ground voltage VSS is applied to the other terminal.

<6-2> Details of Read Operation

Details of the read operation of the memory system according to the sixth embodiment will be described with reference to the timing chart of FIG. 39. Note that the read operation of the memory system according to the sixth embodiment is performed based on the operation described with reference to FIG. 47.

[Time T16] to [Time T17]

In the first read operation (step S3001), a controller 17 sets a signal REN, a signal SW1P, a signal SW2P, the signal SW3B, the signal SW4P, and a signal Vclamp to "H" level, and sets a signal SW1B, a signal SW2B, the signal SW3P, and the signal SW4B to "L" level.

Accordingly, as shown in FIG. 54, transistors M6, M7, M31, M32, M34, M35, M59, and M60 are turned on. The transistors M57 and M58 are turned off. The potential of a node N15 thus lowers, and transistors M29 and M30 are turned on.

In the ON state, the transistor M29 supplies a cell current (Icell_1st) to a memory cell MC.

The transistor M30 is driven based on the potential of the node N15. For this reason, the transistor M30 supplies a copy current (Icopy_1st) of the cell current (Icell_1st) to a node N16.

As described above, the transistors M29 and M30 constitute a current mirror.

In addition, the node N30 is charged to a voltage VSHFTGC via the node N31 and the transistors M59 and M60. In this way, the preamplifier 110 performs the charge operation of the shift circuit 113 in parallel to the first read operation.

The potential of the node N17 is voltage information (signal voltage) V1stb based on the copy current (Icopy_1st) and the voltage VSHFTGC.

[Time T17] to [Time T18]

Referring back to FIG. 39, the subsequent operation waveform will be described. In the "0" write operation (step S3002), the controller 17 lowers the signal REN and the signal SW1P to "L" level, and raises a signal WRITE0 and the signal SW1B to "H" level.

Accordingly, "0" data is written to the memory cell by a write driver (not shown).

Figure 55:
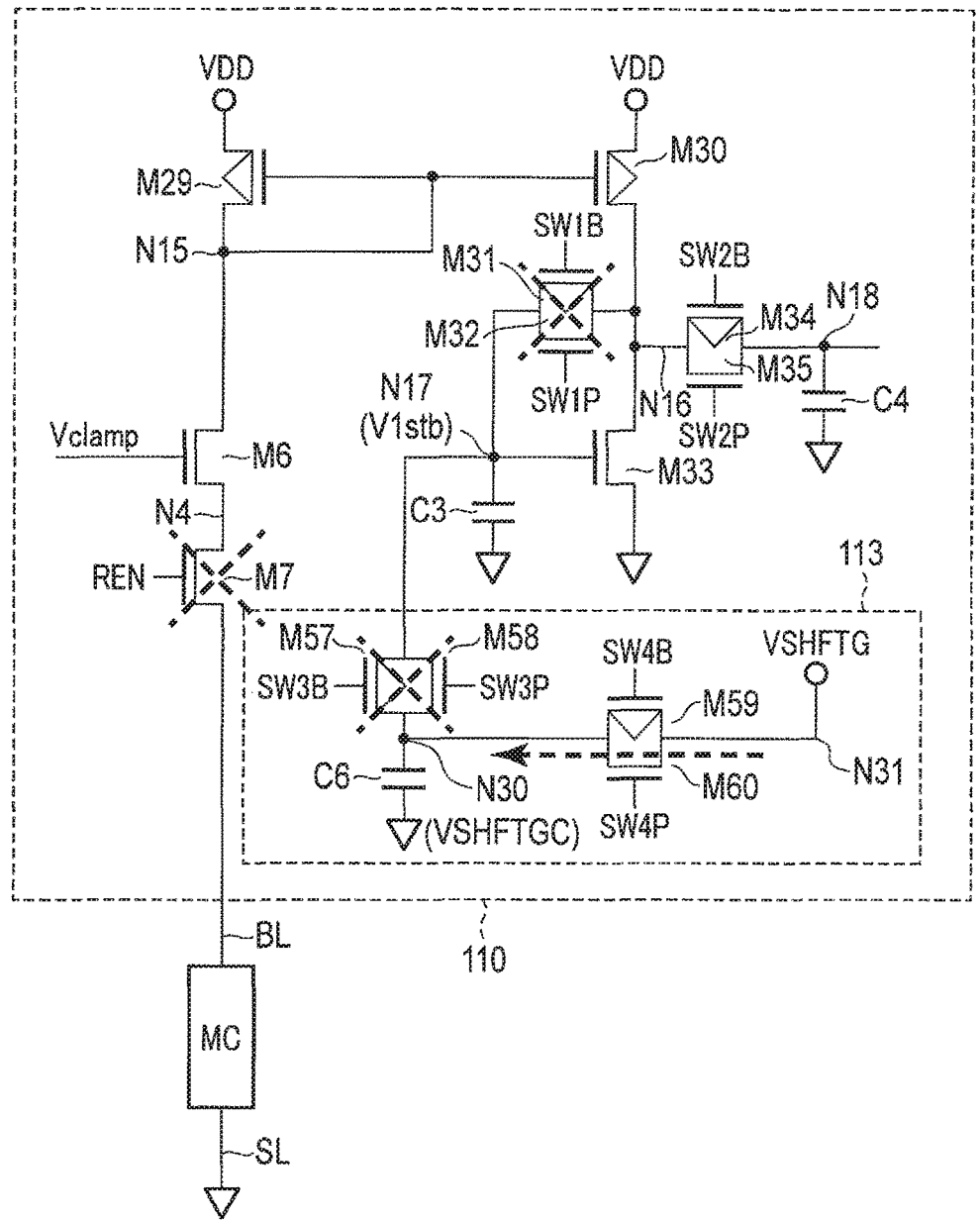
FIG. 55 is a circuit diagram showing the operation of the preamplifier of the memory device according to the sixth embodiment in a 0 write operation.

As shown in FIG. 55, the transistors M7, M31, and M32 of the preamplifier 110 are turned off. The node N17 thus stores voltage information (signal voltage) V1stb.

[Time T18] to [Time T19]

Referring back to FIG. 39, the subsequent operation waveform will be described. In the second read operation (step S3003), the controller 17 raises the signal REN to "H" level, and lowers the signal WRITE0 to "L" level.

Figure 56:
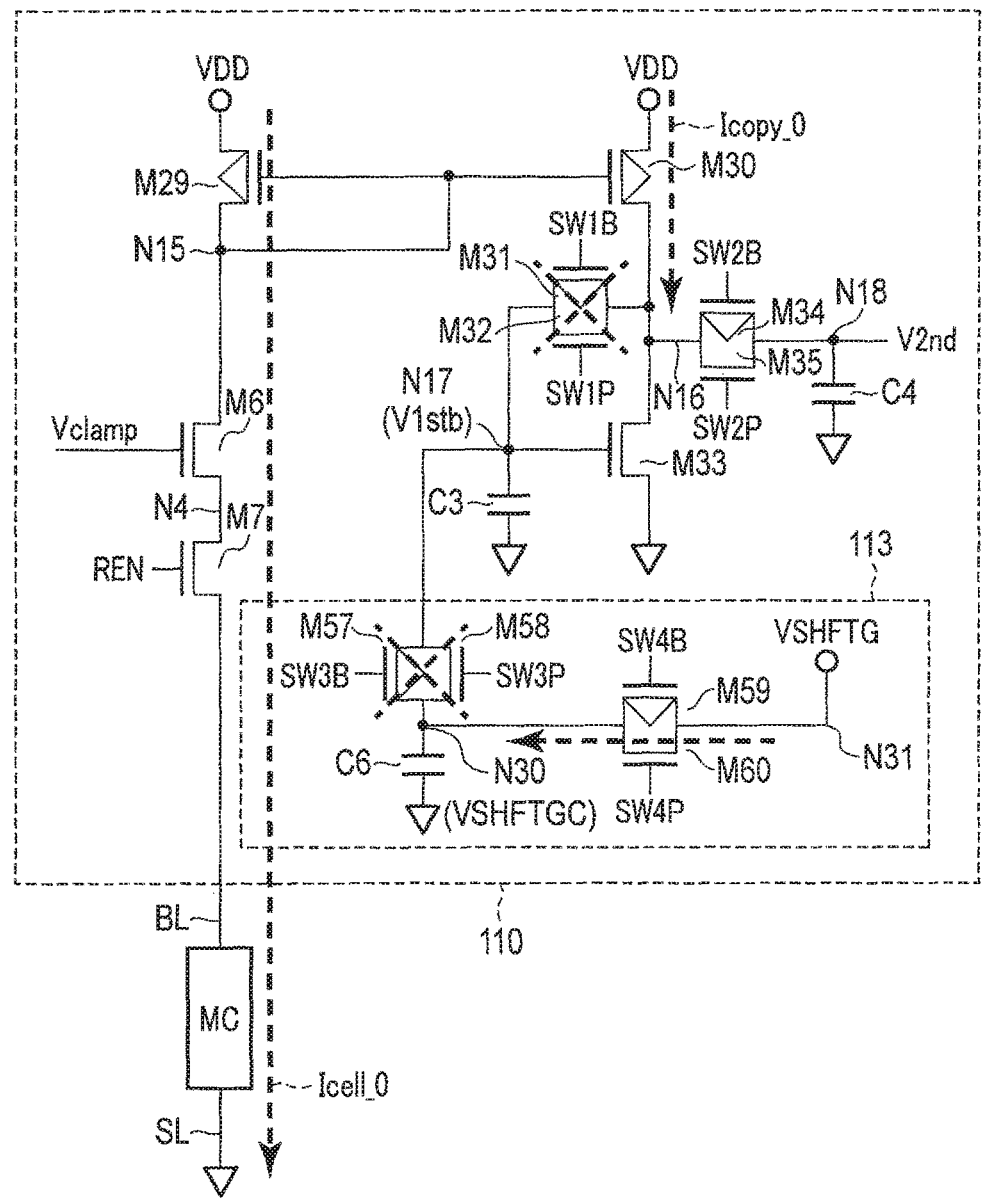
FIG. 56 is a circuit diagram showing the operation of the preamplifier of the memory device according to the sixth embodiment in a second read operation.

Accordingly, as shown in FIG. 56, the transistors M6, M7, M30, M34, and M35 are turned on. The potential of the node N15 thus lowers, and the transistors M29 and M30 are turned on. A transistor M33 is turned on based on V1stb.

The transistor M29 supplies a cell current (Icell_0) to the memory cell MC that stores "0" data.

The transistor M30 is driven based on the potential of the node N15. For this reason, the transistor M30 supplies a copy current (Icopy_0) of the cell current (Icell_0) to the node N16.

The potential of a node N18 is voltage information (signal voltage) V2nd based on the copy current (Icopy_0).

[Time T19] to [Time T20]

Referring back to FIG. 39, the subsequent operation waveform will be described. In the shift operation (step S3004), the controller 17 raises the signals SW2B, SW3P, and SW4B to "H" level, and lowers the signals REN, SW2P, SW3E, and SW4P to "L" level.

Figure 57:
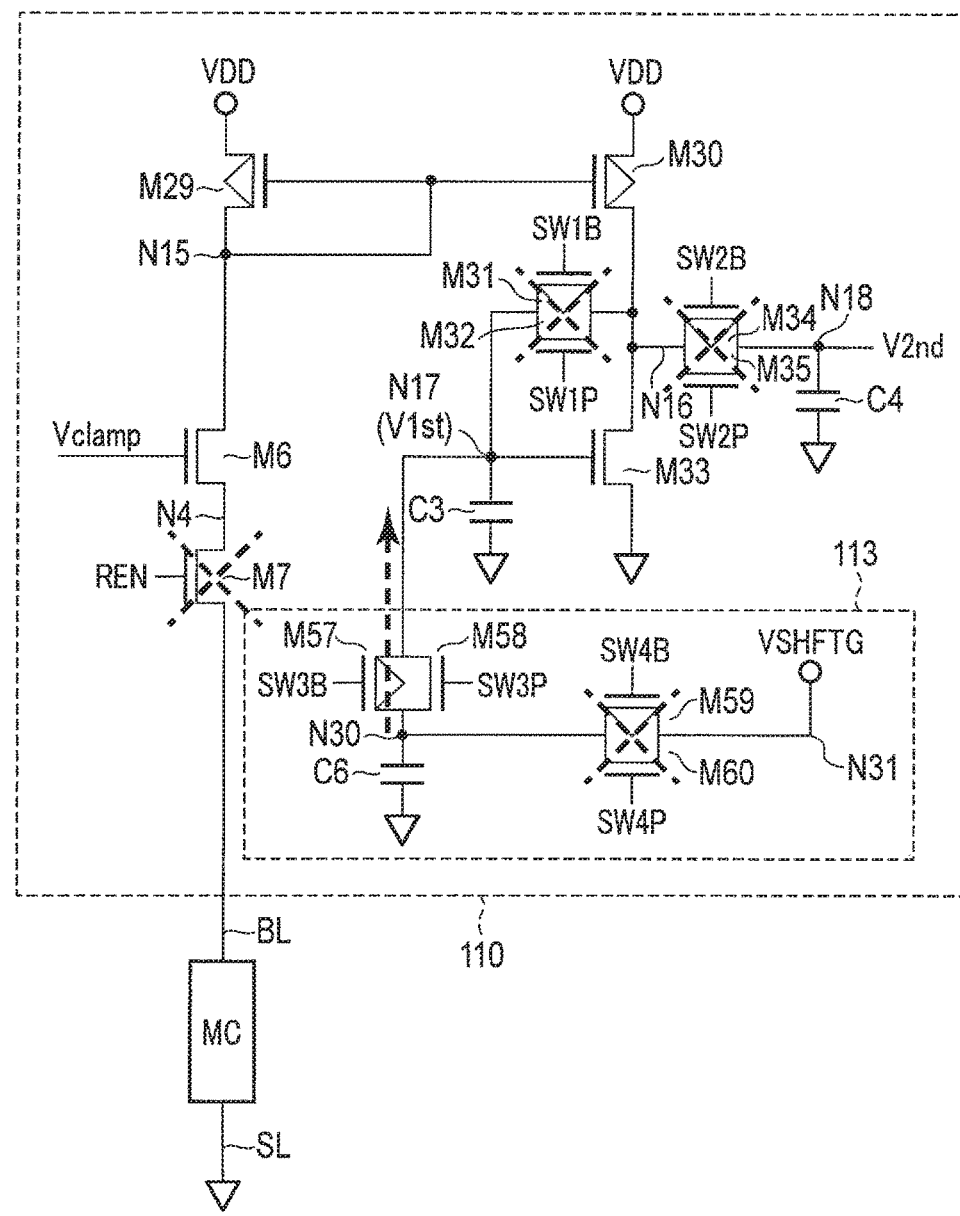
FIG. 57 is a circuit diagram showing the operation of the preamplifier of the memory device according to the sixth embodiment in a voltage information V1st generation operation.

Accordingly, as shown in FIG. 57, the transistors M57 and M58 are turned on, and the transistors M7, M34, M35, M59, and M60 are turned off. For this reason, the voltage VSHFTGC stored in the node N30 is shared by the node N17.

For this reason, as shown in FIG. 58, charge share is performed for the voltage information (signal voltage) V1stb, the voltage information (signal voltage) V1stb is shifted (boosted) in the positive direction, and the voltage information (signal voltage) V1st (V1st_0, V1st_1) is generated. The node N17 thus stores the voltage information (signal voltage) V1st.

The voltage information (signal voltage) V1st (V1st_0, V1st_1) is generated based on VSHFTG. Hence, VSHFTG is set such that the voltage information (signal voltage) V1st is set between the pieces of voltage information voltages) V2nd_0 and V2nd_1.

From [Time T20]

In the determination operation (step S3005), the memory device 10 performs the same operation as the operation from the time T20 in the fourth embodiment.

Note that in this embodiment, the operation of writing "0" to the memory cell as the target of the first read operation by the memory device 10 in step S3002 of FIG. 47 has been described. However, the memory device 10 may write "1" to the memory cell as the target of the first read operation in step S3002. That is, "1" may be the standard state. When writing "1" in step S3002 of FIG. 47, the controller 17 sets a signal WRITE1 to "H" level (see FIG. 45).

<6-3> Effects

As described above, if the preamplifier is a circuit that generates V1st by charge share, the same effects as described in the fourth embodiment can be obtained.

<7> Seventh Embodiment

The seventh embodiment will be described. In the seventh embodiment, shift control is done not by a sense amplifier 120 but preamplifier 110, as in the fourth embodiment. In the seventh embodiment, another example of the preamplifier will be described. Note that the basic arrangement and the basic operation of a memory system according to the seventh embodiment are the same as those of the memory systems according to the above-described first, second, fourth, and sixth embodiments. Hence, a description of matters explained in the above-described first, second, fourth, and sixth embodiments and matters easily supposable from the above-described first, second, fourth, and sixth embodiments will be omitted.

<7-1> Arrangement of Preamplifier

The arrangement of the preamplifier 110 of a memory device according to the seventh embodiment will be described with reference to FIG. 59.

The preamplifier 110 includes a shift circuit 114. More specifically, as shown in FIG. 59, the shift circuit 114 includes PMOS transistors M61 and M63, and NMOS transistors M62 and M64.

One terminal of the transistor M61 is connected to a node N32, the other terminal is connected to a node N33, and a signal SW3B is supplied to the gate electrode.

One terminal of the transistor M62 is connected to the node N32, the other terminal is connected to the node N33, and a signal SW3P is supplied to the gate electrode.

The transistor M61 and the transistor M62 function as one switch.

The node N32 is connected to the other terminal of a capacitor C4, and the node N33 is grounded.

One terminal of the transistor M63 is connected to the node N32, the other terminal is connected to a node N34, and a signal SW4B is supplied to the gate electrode.

One terminal of the transistor M64 is connected to the node N32, the other terminal is connected to the node N34, and a signal SW4P is supplied to the gate electrode.

The transistor M63 and the transistor M64 function as one switch.

A voltage VSHFTG is applied to the node N34.

<7-2> Details of Read Operation

Details of the read operation of the memory system according to the seventh embodiment will be described with reference to the timing chart of FIG. 39. Note that the read operation of the memory system according to the seventh embodiment is performed based on the operation described with reference to FIG. 38.

[Time T16] to [Time T17]

In the first read operation (step S2001), a controller 17 sets a signal REN, a signal SW1P, a signal SW2P, the signal SW3B, the signal SW4P, and a signal Vclamp to level, and sets a signal SW1B, a signal SW2B, the signal SW3P, and the signal SW4B to "L" level.

Figure 60:
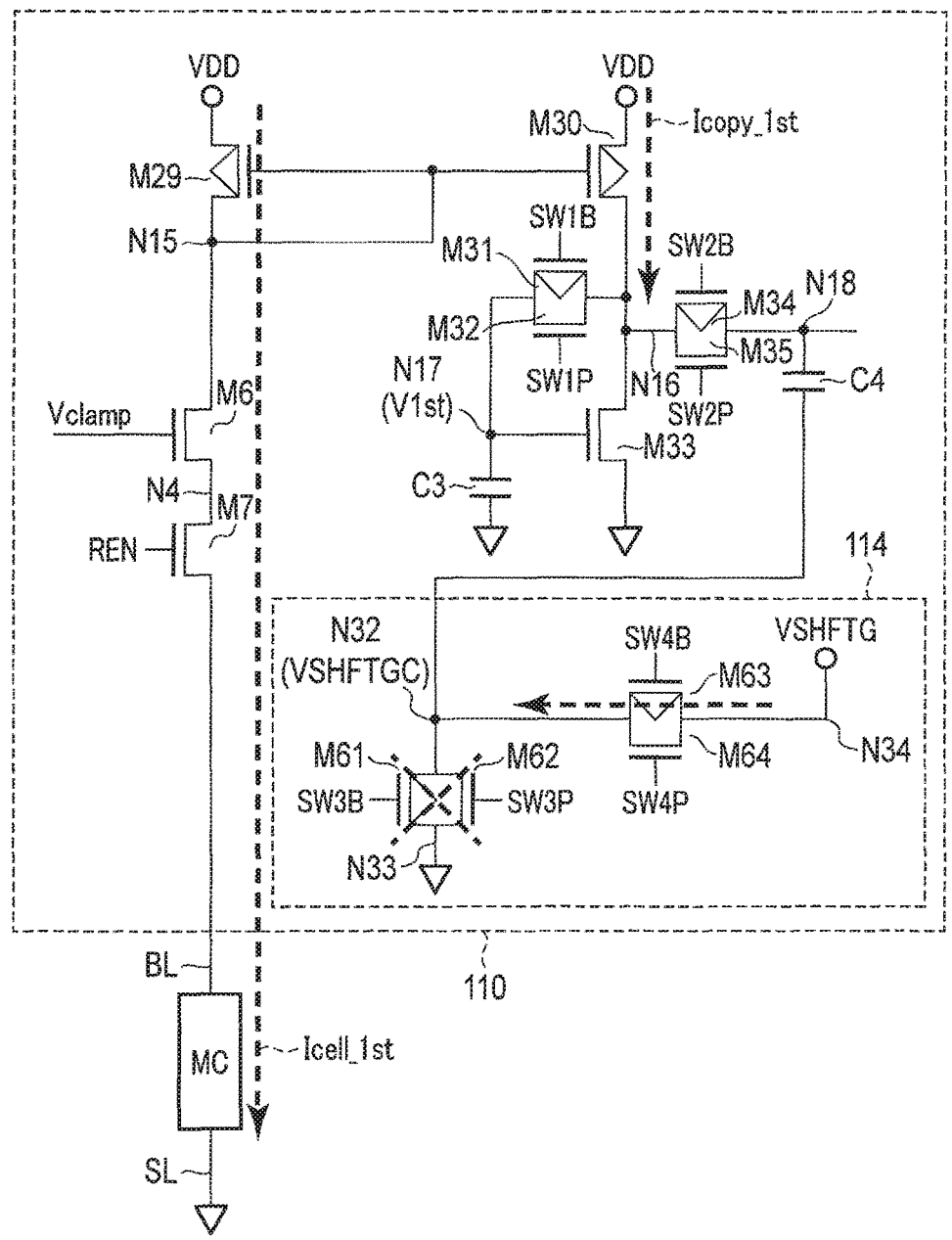
FIG. 60 is a circuit diagram showing the operation of the preamplifier of the memory device according to the seventh embodiment in a first read operation.

Accordingly, as shown in FIG. 60, transistors M6, M7, M31, M32, M34, M35, M59, and M60 are turned on. The transistors M61 and M62 are turned off. The potential of a node N15 thus lowers, and transistors M29 and M30 are turned on.

In the ON state, the transistor M29 supplies a cell current (Icell_1st) to a memory cell MC.

The transistor M30 is driven based on the potential of the node N15. For this reason, the transistor M30 supplies a copy current (Icopy_1st) of the cell current (Icell_1st) to a node N16.

The potential of a node N17 is voltage information (signal voltage) V1st based on the copy current (Icopy_1st).

In addition, the node N32 is charged to a voltage VSHFTGC via the node N34 and the transistors M63 and M64. In this way, the preamplifier 110 performs the charge operation of the shift circuit 114 in parallel to the first read operation.

[Time T17] to [Time T18]

Referring back to FIG. 39, the subsequent operation waveform will be described. In the "0" write operation (step S2002), the controller 17 lowers the signal REN and the signal SW1P to "L" level, and raises a signal WRITE0 and the signal SW1B to "H" level.

Accordingly, "0" data is written to the memory cell by a write driver (not shown).

As shown in FIG. 61, the transistors M7, M31, and M32 of the preamplifier 110 are turned off. The node N17 thus stores the voltage information (signal voltage) V1st.

In addition, the node N32 is charged to the voltage VSHFTGC via the node N34 and the transistors M63 and M64. In this way, the preamplifier 110 performs the charge operation of the shift circuit 114 in parallel to the "0" write operation.

[Time T18] to [Time T19]

Referring back to FIG. 39, the subsequent operation waveform will be described. In the second read operation (step S2003), the controller 17 raises the signal REN to "H" level, and lowers the signal WRITE0 to "L" level.

Accordingly, as shown in FIG. 62, the transistors M6, M7, M30, M34, and M35 are turned on. The potential of the node N15 thus lowers, and the transistors M29 and M30 are turned on. A transistor M33 is turned on based on V1st.

The transistor M29 supplies a cell current (Icell_0) to the memory cell MC that stores "0" data.

The transistor M30 is driven based on the potential of the node N15. For this reason, the transistor M30 supplies a copy current (Icopy_0) of the cell current (Icell_0) to the node N16.

The potential of a node N18 is voltage information (signal voltage) V2nd based on the copy current (Icopy_0).

In addition, the node N32 is charged to the voltage VSHFTGC via the node N34 and the transistors M63 and M64. In this way, the preamplifier 110 performs the charge operation of the shift circuit 114 in parallel to the second read operation.

[Time T19] to [Time T20]

Referring back to FIG. 39, the subsequent operation waveform will be described. In the shift operation (step S2004), the controller 17 raises the signals SW2B, SW3P, and SW4B to "H" level, and lowers the signals REN, SW2P, SW3B, and SW4P to "L" level.

Figure 63:
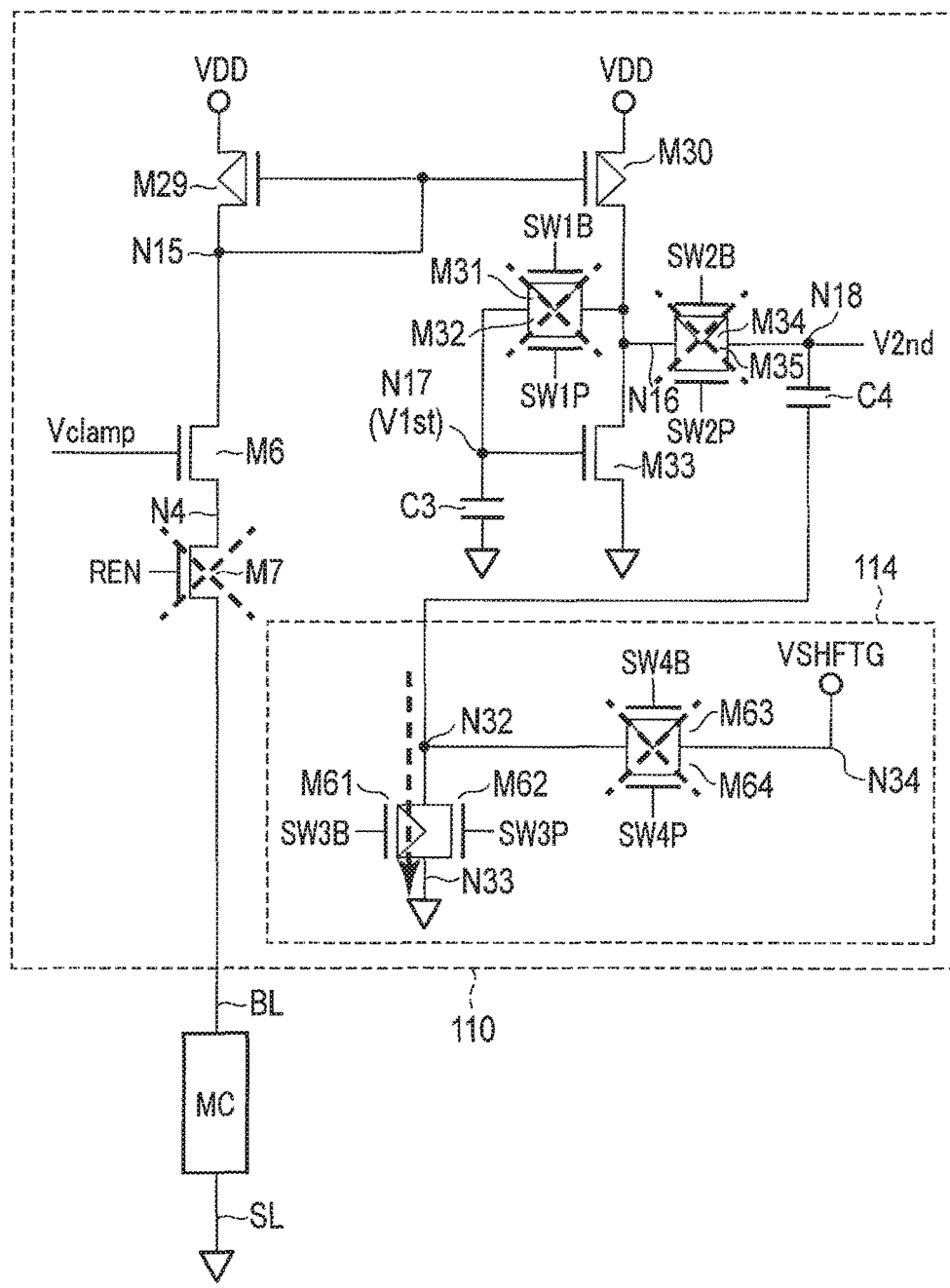
FIG. 63 is a circuit diagram showing the operation of the preamplifier of the memory device according to the seventh embodiment in a voltage information V2nd generation operation.

Accordingly, as shown in FIG. 63, the transistors M61 and M62 are turned on, and the transistors M7, M34, M35, M63, and M64 are turned off. For this reason, the voltage stored in the node N32 is released.

For this reason, as shown in FIG. 64, charge share is performed for the voltage information (signal voltage) V2ndb, the voltage information (signal voltage) V2ndb is shifted in the negative direction, and the voltage information (signal voltage) V2nd (V2nd_0, V2nd_1) is generated. The node N18 thus stores the voltage information (signal voltage) V2nd.

The voltage information (signal voltage) V2nd (V2nd_0, V2nd_1) is generated based on VSHFTG. Hence, VSHFTG is set such that the voltage information (signal voltage) V1st is set between the pieces of voltage information (signal voltages) V2nd_0 and V2nd_1.

From [Time T20]

In the determination operation (step S2005), a memory device 10 performs the same operation as the operation from the time T20 in the fourth embodiment.

Note that in this embodiment, the operation of writing "0" to the memory cell as the target of the first read operation by the memory device 10 in step S2002 of FIG. 38 has been described. However, the memory device 10 may write "1" to the memory cell as the target of the first read operation in step S2002. That is, "1" may be the standard state. When writing "1" in step S2002 of FIG. 38, the controller 17 sets a signal WRITE1 to "H" level (see FIG. 45).

<7-3> Effects

As described above, if the preamplifier is a circuit that generates V2nd by charge share, the same effects as described in the fourth embodiment can be obtained.

<8> Others

Note that the term "connect" in the above embodiments also includes a state in which elements are indirectly connected via another element, for example, a transistor or a resistor.

An MRAM that stores data using a magnetoresistive element (Magnetic Tunnel junction (MTJ) element) as a resistance change element has been described here as an example.

However, the present invention is not limited to this.

For example, the present invention is also applicable to a resistance change memory like the MRAM, for example, a semiconductor storage device such as an ReRAM or PCRAM including an element that stores data using a resistance change.

The present invention is also applicable to a semiconductor storage device, whether it is a volatile memory or a nonvolatile memory, including an element that stores data based on a resistance change caused by application of a current or a voltage or reads stored data by converting a resistance difference generated by a resistance change into a current difference or a voltage difference.

In the above-described embodiments, the bit line pair has been referred to as the bit line BL and the source line SL for the descriptive convenience. However, the present invention is not limited to this. For example, the bit line pair may be referred to as a first bit line and a second bit line.

In the above-described embodiments, in the memory system 1, one memory device 10 is connected to the memory controller 20. However, the present invention is not limited to this. For example, the memory system 1 may have an arrangement in which a plurality of memory devices 10 are connected to the memory controller 20.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
    a memory cell; and
    a first circuit configured to perform first read for the memory cell and generate a first voltage,
    write first data to the memory cell that has undergone the first read,
    perform second read for the memory cell to which the first data is written and generate a second voltage,
    generate a first current based on the first voltage,
    generate a second current based on the second voltage, and
    add a third current to one of the first current and the second current, thereby determining data stored in the memory cell at the time of the first read.

2. The device of claim 1, wherein the first circuit comprises:
    a preamplifier configured to generate the first voltage and the second voltage; and
    a sense amplifier configured to generate the first current, the second current, and the third current and determine the data stored in the memory cell at the time of the first read.

3. The device of claim 2, wherein
    when performing the first read for the memory cell,
    the preamplifier supplies a fourth current to the memory cell via a first path, and
    supplies a fifth current that is a copy current of the fourth current to a first voltage generation unit via a second path electrically separated from the first path, and
    when performing the second read for the memory cell,
    the preamplifier supplies a sixth current to the memory cell via the first path, and
    supplies a seventh current that is a copy current of the sixth current to a second voltage generation unit via the second path.

4. The device of claim 3, wherein
    when performing the first read for the memory cell,
    the preamplifier supplies the fourth current to the memory cell via the first path using a first diode-connected transistor, and
    when performing the second read for the memory cell,
    the preamplifier supplies the sixth current to the memory cell via the first path using the first diode-connected transistor.

5. A method of controlling a memory device, comprising:
    performing first read for a memory cell and generating a first voltage;
    writing first data to the memory cell that has undergone the first read;
    performing second read for the memory cell to which the first data is written and generating a second voltage;
    generating a first current based on the first voltage;
    generating a second current based on the second voltage; and
    adding a third current to one of the first current and the second current, thereby determining data stored in the memory cell at the time of the first read.

6. A memory device comprising:
    a memory cell; and
    a first circuit configured to perform first read for the memory cell and generate a first voltage,
    write first data to the memory cell that has undergone the first read,
    perform second read for the memory cell to which the first data is written and generate a second voltage,
    generate one of a third voltage based on the first voltage and a fourth voltage based on the second voltage using a shift circuit after generation of the second voltage,
    generate a first current based on one of the first voltage and the third voltage,
    generate a second current based on one of the second voltage and the fourth voltage, and
    compare a magnitude of one of the first current and the second current, thereby determining data stored in the memory cell at the time of the first read.

7. The device of claim 6, wherein the first circuit comprises:
    a preamplifier configured to generate the first voltage, the second voltage, the third voltage, and the fourth voltage; and a sense amplifier configured to generate the first current and the second current and determine the data stored in the memory cell at the time of the first read.

8. The device of claim 7, wherein
when performing the first read for the memory cell,
the preamplifier charges the shift circuit to a fifth voltage, and after the generation of the second voltage, shares the fifth voltage as the second voltage from the shift circuit, thereby generating the fourth voltage.

9. The device of claim 8, wherein the preamplifier comprises the shift circuit, and
the shift circuit comprises:
a first storage area configured to store the fifth voltage;
a first switch configured to store the fifth voltage in the first storage area; and
a second switch configured to share the fifth voltage as the second voltage.

10. The device of claim 8, wherein the preamplifier comprises the shift circuit, and
the shift circuit comprises:
a second storage area configured to store the fifth voltage;
a third switch configured to store the fifth voltage in the second storage area; and
a fourth switch configured to discharge the second storage area.

11. The device of claim 7, wherein
when performing the first read for the memory cell,
the preamplifier charges the shift circuit to a fifth voltage, generates the first voltage based on a result of the first read and the fifth voltage, and
after the generation of the second voltage, discharges the shift circuit, thereby generating the third voltage based on the first voltage.

12. The device of claim 7, wherein
when performing the first read for the memory cell,
the preamplifier supplies a third current to the memory cell via a first path, and
supplies a fourth current that is a copy current of the third current to a first voltage generation unit via a second path electrically separated from the first path, and
when performing the second read for the memory cell,
the preamplifier supplies a fifth current to the memory cell via the first path, and
supplies a sixth current that is a copy current of the fifth current to a second voltage generation unit via the second path.

13. The device of claim 12, wherein
when performing the first read for the memory cell,
the preamplifier supplies the third current to the memory cell via the first path using a first diode-connected transistor, and
when performing the second read for the memory cell,
the preamplifier supplies the fifth current to the memory cell via the first path using the first diode-connected transistor.

14. The device of claim 12, wherein
when performing the first read for the memory cell,
the preamplifier charges the shift circuit to a fifth voltage, and after the generation of the second voltage, shares the fifth voltage as the first voltage from the shift circuit, thereby generating the third voltage.

15. The device of claim 14, wherein the preamplifier comprises the shift circuit, and
the shift circuit comprises:
a third storage area configured to store the fifth voltage;
a fifth switch configured to store the fifth voltage in the third storage area; and
a sixth switch configured to share the fifth voltage as the first voltage.

16. The device of claim 12, wherein
when performing the first read for the memory cell,
the preamplifier charges the shift circuit to a fifth voltage, generates the second voltage based on a result of the second read and the fifth voltage, and
after the generation of the second voltage, discharges the shift circuit, thereby generating the fourth voltage based on the second voltage.

17. The device of claim 16, wherein the preamplifier comprises the shift circuit, and
the shift circuit comprises:
a fourth storage area configured to store the fifth voltage;
a seventh switch configured to store the fifth voltage in the fourth storage area; and
an eighth switch configured to discharge the fourth storage area.

* * * * *